United States Patent
Hatakeyama et al.

(10) Patent No.: US 10,811,613 B2
(45) Date of Patent: Oct. 20, 2020

(54) POLYCYCLIC AROMATIC COMPOUND

(71) Applicants: Kwansei Gakuin Educational Foundation, Nishinomiya-shi, Hyogo (JP); JNC Corporation, Chiyoda-ku, Tokyo (JP)

(72) Inventors: Takuji Hatakeyama, Hyogo (JP); Guofang Wang, Chiba (JP); Yohei Ono, Chiba (JP); Yuko Yamaga, Chiba (JP); Kazushi Shiren, Chiba (JP)

(73) Assignees: Kwansei Gakuin Educational Foundation, Hyogo (JP); JNC Corporation, Tokyo (JP)

( * ) Notice: Subject to any disclaimer, the term of this patent is extended or adjusted under 35 U.S.C. 154(b) by 268 days.

(21) Appl. No.: 16/070,910

(22) PCT Filed: Jan. 13, 2017

(86) PCT No.: PCT/JP2017/001089
§ 371 (c)(1),
(2) Date: Jul. 18, 2018

(87) PCT Pub. No.: WO2017/126443
PCT Pub. Date: Jul. 27, 2017

(65) Prior Publication Data
US 2019/0027694 A1    Jan. 24, 2019

(30) Foreign Application Priority Data
Jan. 21, 2016   (JP) .................... 2016-009488

(51) Int. Cl.
*H01L 51/50* (2006.01)
*H01L 51/00* (2006.01)
(Continued)

(52) U.S. Cl.
CPC ............ *H01L 51/0059* (2013.01); *C07F 5/02* (2013.01); *C07F 5/027* (2013.01); *C09K 11/06* (2013.01);
(Continued)

(58) Field of Classification Search
None
See application file for complete search history.

(56) References Cited

U.S. PATENT DOCUMENTS

| | | |
|---|---|---|
| 2007/0106103 A1 | 5/2007 | Ikeda et al. |
| 2014/0058099 A1 | 2/2014 | Wakamiya et al. |
| 2015/0236274 A1 | 8/2015 | Hatakeyama et al. |

FOREIGN PATENT DOCUMENTS

| | | |
|---|---|---|
| JP | 2001-172232 A | 6/2001 |
| JP | 2005-170911 A | 6/2005 |

(Continued)

OTHER PUBLICATIONS

Office Action dated Dec. 18, 2019, in CN 201780003717.3, with English translation.
(Continued)

*Primary Examiner* — Gregory D Clark
(74) *Attorney, Agent, or Firm* — Foley & Lardner LLP

(57) ABSTRACT

An object is to provide a novel polycyclic aromatic compound and an organic electroluminescent element using the same. By providing a novel polycyclic aromatic compound having a diarylamino group and having a plurality of aromatic rings linked to each other via a boron atom, an oxygen atom, or the like, options of a material for an organic EL element are increased. In addition, by using the novel polycyclic aromatic compound as a material for an organic electroluminescent element, an excellent organic EL element is provided.

21 Claims, 1 Drawing Sheet

(51) Int. Cl.
 *C09K 11/06* (2006.01)
 *C07F 5/02* (2006.01)
(52) U.S. Cl.
 CPC ........ *H01L 51/008* (2013.01); *H01L 51/0061* (2013.01); *H01L 51/5092* (2013.01); *H01L 51/5012* (2013.01); *H01L 51/5056* (2013.01); *H01L 51/5072* (2013.01); *Y02E 10/549* (2013.01)

(56) References Cited

FOREIGN PATENT DOCUMENTS

| WO | WO 2004/061047 A2 | 7/2004 | | |
|----|---|---|---|---|
| WO | WO 2011/107186 A2 | 9/2011 | | |
| WO | WO 2012/118164 A1 | 9/2012 | | |
| WO | WO 2015/102118 A1 * | 7/2015 | ............ | C09K 11/06 |
| WO | WO 2016/143624 A1 | 9/2016 | | |
| WO | WO 2016/152418 A1 | 9/2016 | | |
| WO | WO 2016/152544 A1 | 9/2016 | | |

OTHER PUBLICATIONS

Office Action dated Apr. 27, 2020, in CN 201780003717.3, with English machine translation.
Decision to Grant a Patent dated Oct. 23, 2019, in JP 2017-562549, with English machine translation.

* cited by examiner

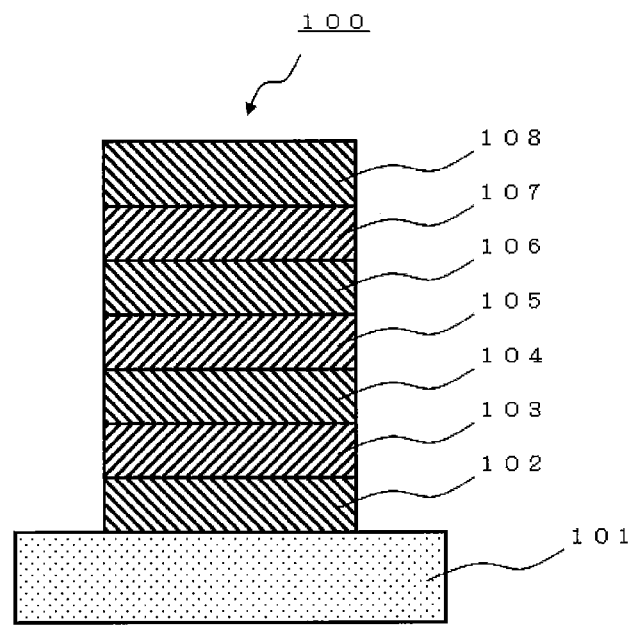

POLYCYCLIC AROMATIC COMPOUND

CROSS-REFERENCE TO RELATED APPLICATIONS

This application is a National Stage application of PCT/JP2017/001089, filed Jan. 13, 2017, which claims priority from Japanese application JP 2016-009488, filed Jan. 21, 2016.

TECHNICAL FIELD

The present invention relates to a polycyclic aromatic compound, and an organic electroluminescent element, an organic field effect transistor, and an organic thin film solar cell using the polycyclic aromatic compound, as well as a display apparatus and a lighting apparatus.

BACKGROUND ART

Conventionally, a display apparatus using a luminescent element that is electroluminescent can be subjected to reduction of power consumption and thickness reduction, and therefore various studies have been performed thereon. Furthermore, an organic electroluminescent element formed of an organic material has been studied actively because weight reduction or size expansion is easily achieved. Particularly, active studies have been hitherto performed on development of an organic material having luminescence characteristics for blue light which is one of the three primary colors of light or the like, and development of an organic material having charge transport capability for holes, electrons, and the like (having a potential for serving as a semiconductor or a superconductor), irrespective of whether the organic material is a high molecular weight compound or a low molecular weight compound.

An organic EL element has a structure having a pair of electrodes composed of a positive electrode and a negative electrode, and a single layer or a plurality of layers disposed between the pair of electrodes and containing an organic compound. The layer containing an organic compound includes a light emitting layer and a charge transport/injection layer for transporting or injecting charges such as holes or electrons. Various organic materials suitable for these layers have been developed.

As a material for a light emitting layer, for example, a benzofluorene-based compound has been developed (WO 2004/061047 A). As a hole transport material, for example, a triphenylamine-based compound has been developed (JP 2001-172232 A). As an electron transport material, for example, an anthracene-based compound has been developed (JP 2005-170911 A).

Furthermore, in recent years, a material obtained by improving a triphenylamine derivative has also been reported as a material used in an organic EL element or an organic thin film solar cell (WO 2012/118164 A). This material is characterized in that flatness thereof has been increased by linking aromatic rings constituting triphenylamine to each other with reference to N,N'-diphenyl-N, N'-bis(3-methylphenyl)-1,1'-biphenyl-4,4'-diamine (TPD) which has been already put to practical use. In this literature, for example, evaluation of charge transporting characteristics of a NO-linked compound (compound 1 of page 63) has been made. However, there is no description on a method for manufacturing a material other than the NO-linked compound. If elements to be linked are different, overall electron states of compounds are different. Therefore, characteristics obtained from a material other than the NO-linked compound are not known. Examples of such a compound are also found elsewhere (WO 2011/107186 A and WO 2015/102118 A). For example, since a compound having a conjugated structure involving higher energy of triplet exciton (T1) can emit phosphorescent light having a shorter wavelength, the compound is useful as a material for a blue light emitting layer. There is also a demand for a novel compound having a conjugated structure with high T1 as an electron transport material or a hole transport material including a light emitting layer.

A host material for an organic EL element is generally formed of a molecule in which a plurality of existing aromatic rings of benzene, carbazole, and the like is linked to each other via a single bond, a phosphorus atom, or a silicon atom. This is because a large HOMO-LUMO gap required for a host material (band gap Eg in a thin film) is secured by linking many aromatic rings each having a relatively small conjugated system. Furthermore, a host material for an organic EL element using a phosphorescent material or a thermally activated delayed fluorescence material also needs high triplet excitation energy ($E_T$). However, the triplet excitation energy ($E_T$) can be increased by localizing SOMO1 and SOMO2 in a triplet excited state (T1) by linking a donor-like or acceptor-like aromatic ring or substituent to a molecule, and thereby reducing an exchange interaction between the two orbitals. However, an aromatic ring having a small conjugated system does not have sufficient redox stability, and an element using a molecule obtained by linking existing aromatic rings to each other as a host material does not have a sufficient lifetime. Meanwhile, a polycyclic aromatic compound having an extended π-conjugated system generally has excellent redox stability. However, since a HOMO-LUMO gap (band gap Eg in a thin film) or triplet excitation energy ($E_T$) is low, the polycyclic aromatic compound has been considered to be unsuitable as a host material.

CITATION LIST

Patent Literature

Patent Literature 1: WO 2004/061047 A
Patent Literature 2: JP 2001-172232 A
Patent Literature 3: JP 2005-170911 A
Patent Literature 4: WO 2012/118164 A
Patent Literature 5: WO 2011/107186 A
Patent Literature 6: WO 2015/102118 A

SUMMARY OF INVENTION

Technical Problem

As described above, various materials used for an organic EL element have been developed. However, in order to increase options of the material for an organic EL element, development of a material formed of a different compound from conventional compounds has been desired. Particularly, organic EL characteristics obtained from a material other than the NO-linked compounds reported in Patent Literatures 1 to 4 and methods for manufacturing the same are not known.

Solution to Problem

The present inventors made intensive studies in order to solve the problems described above. As a result, the present inventors have found a novel polycyclic aromatic compound having a plurality of aromatic rings linked to each other via a boron atom, an oxygen atom, or the like and have succeeded in manufacturing the same. In addition, the present inventors have found that an excellent organic EL element is obtained by disposing a layer containing this polycyclic aromatic compound between a pair of electrodes to constitute an organic EL element and have completed the present invention. That is, the present invention provides such a polycyclic aromatic compound as described below and further provides a material for an organic EL element containing such a polycyclic aromatic compound as described below.

[1]

A polycyclic aromatic compound represented by the following general formula (1A) or (1B).

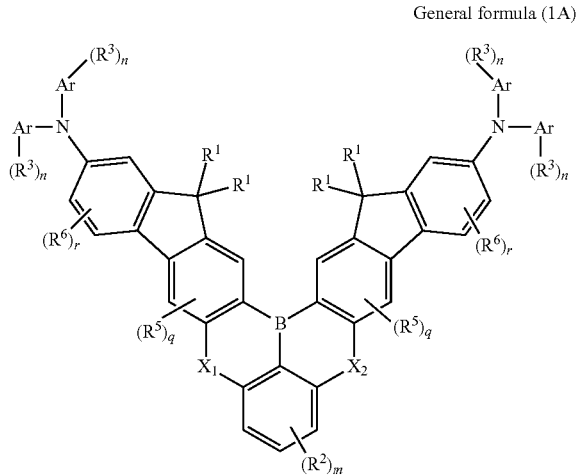

General formula (1A)

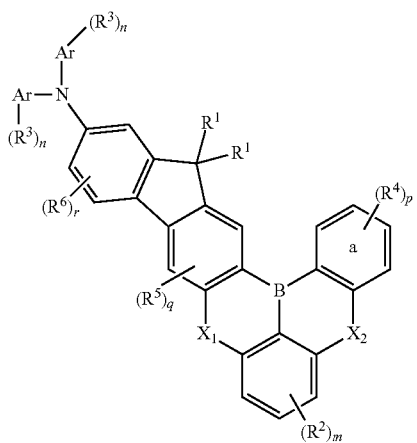

General formula (1B)

(In the above formula (1A) or (1B),

Ar's each independently represent an aryl or a heteroaryl, $R^1$ to $R^6$ each independently represent a hydrogen atom, an aryl, a heteroaryl, a diarylamino, a diheteroarylamino, an arylheteroarylamino, an alkyl, an alkoxy, a trialkylsilyl, or an aryloxy, at least one hydrogen atom in these substituents may be substituted by an aryl, a heteroaryl, a diarylamino, or an alkyl, In a case where a plurality of $R^4$'s is present, adjacent $R^4$'s may be bonded to each other to form an aryl ring or a heteroaryl ring together with ring a, at least one hydrogen atom in the formed ring may be substituted by an aryl, a heteroaryl, a diarylamino, a diheteroarylamino, an arylheteroarylamino, an alkyl, an alkoxy, a trialkylsilyl, or an aryloxy, at least one hydrogen atom in these substituents may be substituted by an aryl, a heteroaryl, a diarylamino, or an alkyl, in a case where $R^3$ and $R^6$ are adjacent to each other, $R^3$ and $R^6$ may be bonded to each other via —O—, —S—, —C(—R)$_2$—, or a single bond, R in the C (—R)$_2$— represents a hydrogen atom or an alkyl having 1 to 6 carbon atoms, m represents an integer of 0 to 3, n's each independently represent an integer of 0 to a maximum number that makes substitution in Ar possible, p represents an integer of 0 to 4, q's each independently represent an integer of 0 to 2, r's each independently represent an integer of 0 to 3, $X^1$ and $X^2$ each independently represent O or N—R, R in the N—R represents an aryl having 6 to 12 carbon atoms, a heteroaryl having 2 to 15 carbon atoms, or an alkyl having 1 to 6 carbon atoms, in a case where $X^2$ represents the N—R, R may be bonded to the ring a via —O—, —S—, —C(—R)$_2$—, or a single bond, R in the —C(—R)$_2$— represents a hydrogen atom or an alkyl having 1 to 6 carbon atoms, and at least one hydrogen atom in the compound represented by formula (1A) or (1B) may be substituted by a halogen atom or a deuterium atom.)

[2]

The polycyclic aromatic compound according to [1], in which

Ar's each independently represent an aryl, $R^1$ to $R^4$ each independently represent a hydrogen atom, an aryl, a heteroaryl, an alkyl, an alkoxy, a trialkylsilyl, or an aryloxy, at least one hydrogen atom in these substituents may be substituted by an aryl, a heteroaryl, or an alkyl, in a case where a plurality of $R^4$'s is present, adjacent $R^4$'s may be bonded to each other to form an aryl ring or a heteroaryl ring together with ring a, at least one hydrogen atom in the formed ring may be substituted by an aryl, a heteroaryl, an alkyl, an alkoxy, a trialkylsilyl, or an aryloxy, at least one hydrogen atom in these substituents may be substituted by an aryl, a heteroaryl, or an alkyl, m represents an integer of 0 to 3, n's each independently represent an integer of 0 to a maximum number that makes substitution in Ar possible, p represents an integer of 0 to 4, q represents 0, r represents 0, $X^1$ and $X^2$ each independently represent O or N—R, and R in the N—R represents an aryl having 6 to 12 carbon atoms, a heteroaryl having 2 to 15 carbon atoms, or an alkyl having 1 to 6 carbon atoms.

[3]

The polycyclic aromatic compound according to [1], represented by the following general formula (1A') or (1B').

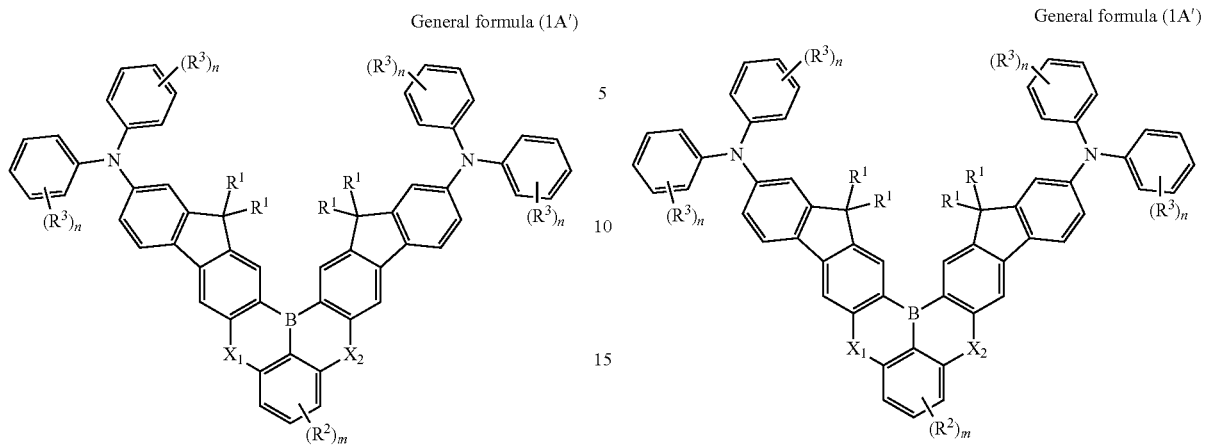

General formula (1A')

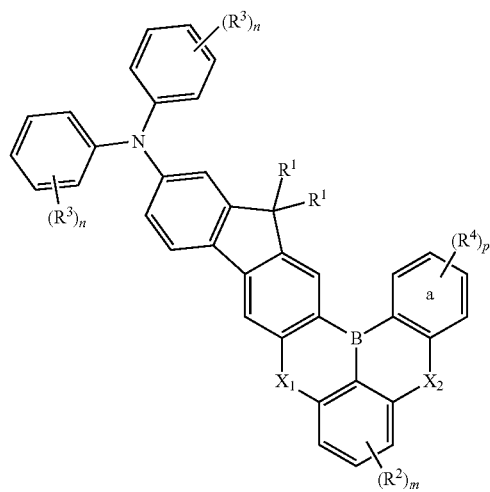

General formula (1B')

(In the above formula (1A') or (1B'),

R¹ to R⁴ each independently represent a hydrogen atom, an aryl, a heteroaryl, an alkyl, an alkoxy, a trialkylsilyl, or an aryloxy, at least one hydrogen atom in these substituents may be substituted by an aryl, a heteroaryl, or an alkyl, in a case where a plurality of R⁴'s is present, adjacent R⁴'s may be bonded to each other to form an aryl ring or a heteroaryl ring together with ring a, at least one hydrogen atom in the formed ring may be substituted by an aryl, a heteroaryl, an alkyl, an alkoxy, a trialkylsilyl, or an aryloxy, at least one hydrogen atom in these substituents may be substituted by an aryl, a heteroaryl, or an alkyl, m represents an integer of 0 to 3, n's each independently represent an integer of 0 to a maximum number that makes substitution in Ar possible, p represents an integer of 0 to 4, X¹ and X² each independently represent O or N—R, and R in the N—R represents an aryl having 6 to 12 carbon atoms, a heteroaryl having 2 to 15 carbon atoms, or an alkyl having 1 to 6 carbon atoms.)

[4]

The polycyclic aromatic compound according to [1], represented by the following general formula (1A').

(In the above formula (1A'),

R¹'s each independently represent a hydrogen atom, an aryl having 6 to 30 carbon atoms, or an alkyl having 1 to 24 carbon atoms, R² and R³ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl containing an alkyl having 1 to 4 carbon atoms, or an aryloxy having 6 to 30 carbon atoms, at least one hydrogen atom in these substituents may be substituted by an aryl having 6 to 16 carbon atoms, a heteroaryl having 2 to 25 carbon atoms, or an alkyl having 1 to 18 carbon atoms, m represents an integer of 0 to 3, n's each independently represent an integer of 0 to 6, X¹ and X² each independently represent O or N—R, and R in the N—R represents an aryl having 6 to 10 carbon atoms, a heteroaryl having 2 to 10 carbon atoms, or an alkyl having 1 to 4 carbon atoms.)

[5]

The polycyclic aromatic compound according to [4], in which

R¹'s each independently represent a hydrogen atom, an aryl having 6 to 12 carbon atoms, or an alkyl having 1 to 12 carbon atoms, R² and R³ each independently represent a hydrogen atom, an aryl having 6 to 30 carbon atoms, a heteroaryl having 2 to 30 carbon atoms, an alkyl having 1 to 24 carbon atoms, or a trialkylsilyl containing an alkyl having 1 to 4 carbon atoms, m represents 0 or 1, n's each independently represent 0 or 1, X¹ and X² each independently represent O or N—R, and R in the N—R represents an aryl having 6 to 10 carbon atoms, a heteroaryl having 2 to 10 carbon atoms, or an alkyl having 1 to 4 carbon atoms.)

[6]

The polycyclic aromatic compound according to [4], represented by the following formula (1A-1), (1A-3), or (1A-25).

(1A-1)
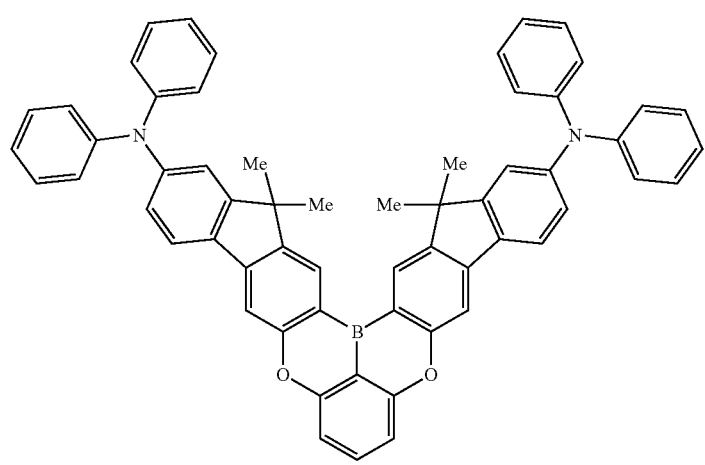
(1A-3)
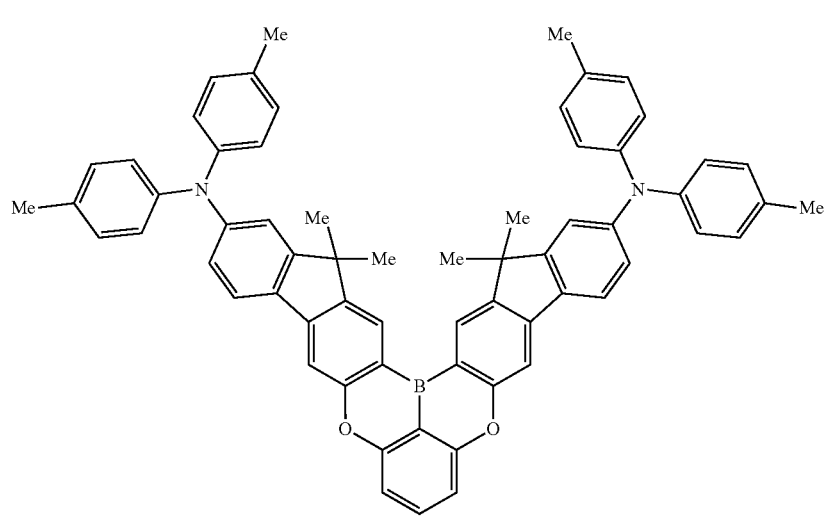
(1A-25)
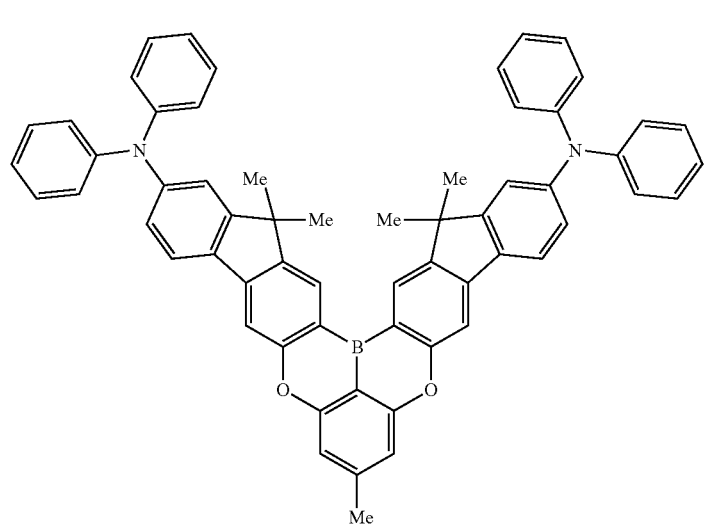

[7]
The polycyclic aromatic compound according to [1], represented by the following general formula (1B').

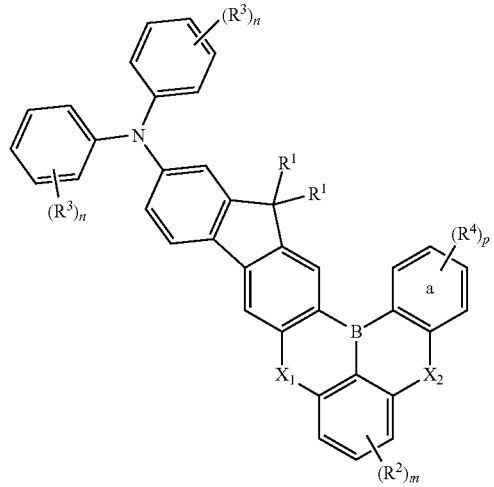

General formula (1B')

(In the above formula (1B'), $R^1$'s each independently represent a hydrogen atom, an aryl having 6 to 30 carbon atoms, or an alkyl having 1 to 24 carbon atoms, $R^2$ to $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl containing an alkyl having 1 to 4 carbon atoms, or an aryloxy having 6 to 30 carbon atoms, at least one hydrogen atom in these substituents may be substituted by an aryl having 6 to 16 carbon atoms, a heteroaryl having 2 to 25 carbon atoms, or an alkyl having 1 to 18 carbon atoms, m represents an integer of 0 to 3, n's each independently represent an integer of 0 to 6, p represents an integer of 0 to 2, $X^1$ and $X^2$ each independently represent O or N—R, and R in the N—R represents an aryl having 6 to 10 carbon atoms, a heteroaryl having 2 to 10 carbon atoms, or an alkyl having 1 to 4 carbon atoms.)

[8]
The polycyclic aromatic compound according to [7], in which $R^1$'s each independently represent a hydrogen atom, an aryl having 6 to 12 carbon atoms, or an alkyl having 1 to 12 carbon atoms, $R^2$ to $R^4$ each independently represent a hydrogen atom, an aryl having 6 to 30 carbon atoms, a heteroaryl having 2 to 30 carbon atoms, an alkyl having 1 to 24 carbon atoms, or a trialkylsilyl containing an alkyl having 1 to 4 carbon atoms, m represents 0 or 1, n's each independently represent 0 or 1, p represents 0 or 1, $X^1$ and $X^2$ each independently represent O or N—R, and R in the N—R represents an aryl having 6 to 10 carbon atoms, a heteroaryl having 2 to 10 carbon atoms, or an alkyl having 1 to 4 carbon atoms.)

[9]
The polycyclic aromatic compound according to [7], represented by the following formula (1B-1) or (1B-10).

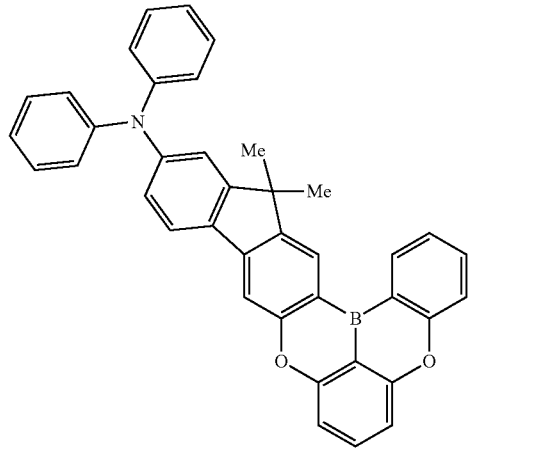

(1B-1)

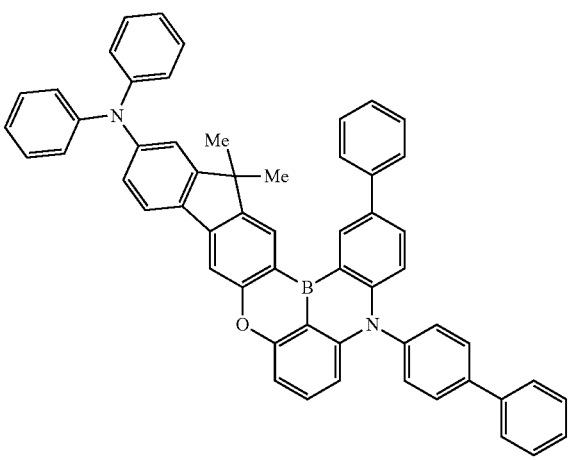

(1B-10)

[10]
A material for an organic device, containing the polycyclic aromatic compound according to any one of [1] to [9].

[11]
The material for an organic device according to [10], in which the material for an organic device is a material for an organic electroluminescent element, a material for an organic field effect transistor, or a material for an organic thin film solar cell.

[12]
The material for an organic electroluminescent element according to [11], in which the material for an organic electroluminescent element is a material for a light emitting layer.

[13]
The material for an organic electroluminescent element according to [11], in which the material for an organic electroluminescent element is a material for an electron injection layer or a material for an electron transport layer.

[14]
The material for an organic electroluminescent element according to [11], in which the material for an organic electroluminescent element is a material for a hole injection layer or a material for a hole transport layer.

[15]
An organic electroluminescent element, including: a pair of electrodes composed of a positive electrode and a negative electrode; and a light emitting layer disposed between the pair of electrodes and containing the material for a light emitting layer according to [12].

[16]

An organic electroluminescent element, including: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer according to [13].

[17]

An organic electroluminescent element, including: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer according to [14].

[18]

The organic electroluminescent element according to any one of [15] to [17], further including an electron transport layer and/or an electron injection layer disposed between the negative electrode and the light emitting layer, in which at least one of the electron transport layer and the electron injection layer contains at least one selected from the group consisting of a quinolinol-based metal complex, a pyridine derivative, a phenanthroline derivative, a borane derivative, and a benzimidazole derivative.

[19]

The organic electroluminescent element according to [18], in which the electron transport layer and/or the electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

[20]

A display apparatus including the organic electroluminescent element according to any one of [15] to [19]

[21]

A lighting apparatus including the organic electroluminescent element according to any one of [15] to [19].

Advantageous Effects of Invention

According to a preferable form of the present invention, a novel polycyclic aromatic compound that can be used as, for example, a material for an organic EL element can be provided, and an excellent organic EL element can be provided by using this polycyclic aromatic compound.

Specifically, the present inventors have found that a polycyclic aromatic compound in which aromatic rings are linked to each other via a hetero element such as boron, oxygen, or nitrogen, has a large HOMO-LUMO gap (band gap Eg in a thin film) and high triplet excitation energy ($E_T$). It is considered that this is because a decrease in the HOMO-LUMO gap that comes along with extension of a conjugated system is suppressed due to low aromaticity of a 6-membered ring containing a hetero element, and SOMO1 and SOMO2 in a triplet excited state (T1) are localized by electronic perturbation of the hetero element. Furthermore, the polycyclic aromatic compound containing a hetero element according to the present invention reduces an exchange interaction between the two orbitals due to the localization of SOMO1 and SOMO2 in the triplet excited state (T1), and therefore an energy difference between the triplet excited state (T1) and a singlet excited state (S1) is small. In addition, the polycyclic aromatic compound exhibits thermally activated delayed fluorescence, and therefore is also useful as a fluorescent material for an organic EL element. Furthermore, a material having high triplet excitation energy ($E_T$) is also useful as an electron transport layer or a hole transport layer of a phosphorescence organic EL element or an organic EL element using thermally activated delayed fluorescence. In addition, these polycyclic aromatic compounds can arbitrarily shift energy of HOMO and LUMO by introducing a substituent, and therefore ionization potential or electron affinity can be optimized in accordance with a peripheral material.

BRIEF DESCRIPTION OF DRAWINGS

FIG. 1 is a schematic cross-sectional view illustrating an organic EL element according to the present embodiment.

DESCRIPTION OF EMBODIMENTS

1. Polycyclic Aromatic Compound

The present invention is a polycyclic aromatic compound represented by the following general formula (1A) or (1B). In addition, the present invention is preferably a polycyclic aromatic compound represented by the following general formula (1A') or (1B').

General formula (1A') or (1B') is obtained by limiting Ar in general formula (1A) or (1B) to a phenyl group and appropriately limiting substituents $R^1$ to $R^6$ and the numbers thereof m, n, p, q, and r.

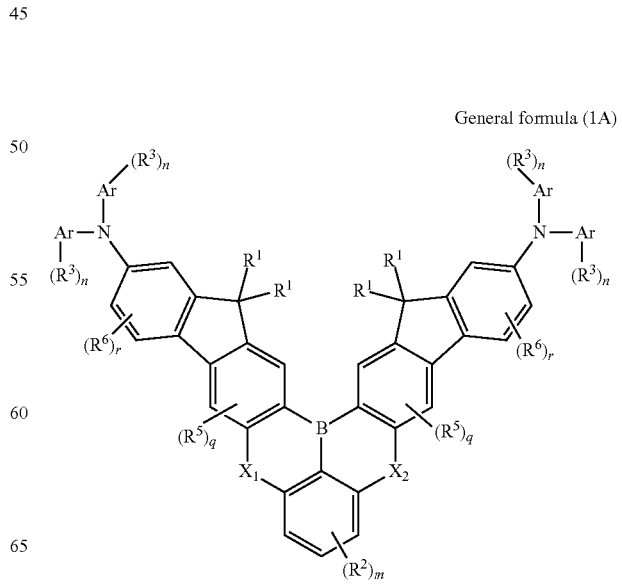

General formula (1A)

General formula (1B)

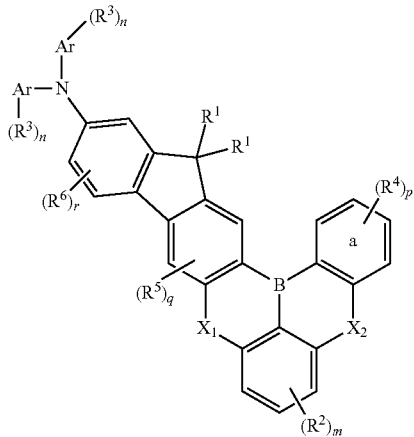

General formula (1A′)

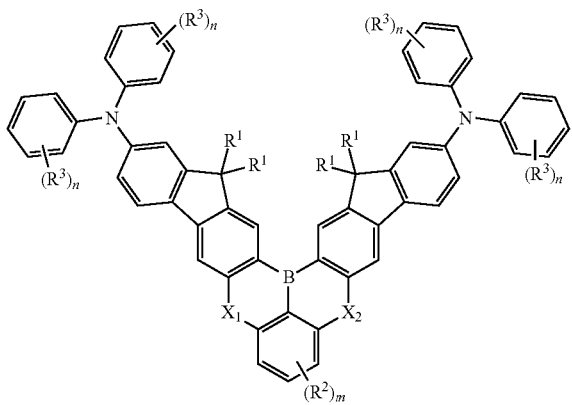

General formula (1B′)

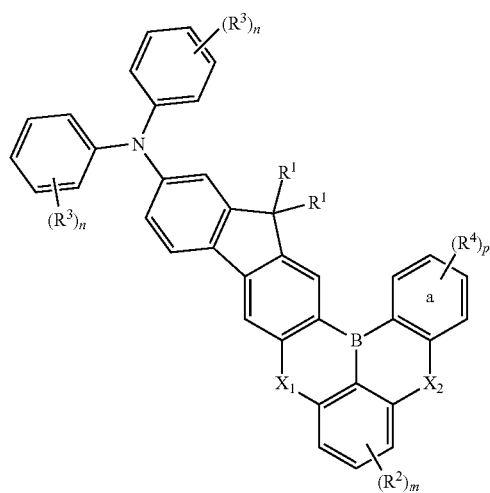

Ar's each independently represent an aryl or a heteroaryl.

Examples of the aryl include an aryl having 6 to 30 carbon atoms. The aryl is preferably an aryl having 6 to 16 carbon atoms, more preferably an aryl having 6 to 12 carbon atoms, and particularly preferably an aryl having 6 to 10 carbon atoms.

Specific examples of the aryl include a phenyl which is a monocyclic system, a biphenylyl which is a bicyclic system, a naphthyl which is a condensed bicyclic system, a terphenylyl (m-terphenylyl, o-terphenylyl, or p-terphenylyl) which is a tricyclic system, an acenaphthylenyl, a fluorenyl, a phenalenyl, and a phenanthrenyl which are condensed tricyclic systems, triphenyleny, a pyrenyly, and a naphthacenyl which are condensed tetracyclic systems, and a perylenyl and a pentacenyl which are condensed pentacyclic systems.

Examples of the heteroaryl include a heteroaryl having 2 to 30 carbon atoms. The heteroaryl is preferably a heteroaryl having 2 to 25 carbon atoms, more preferably a heteroaryl having 2 to 20 carbon atoms, still more preferably a heteroaryl having 2 to 15 carbon atoms, and particularly preferably a heteroaryl having 2 to 10 carbon atoms. In addition, examples of the heteroaryl include a heterocyclic ring containing 1 to 5 heteroatoms selected from an oxygen atom, a sulfur atom, and a nitrogen atom in addition to a carbon atom as a ring-constituting atom.

Specific examples of the heteroaryl include a pyrrolyl, an oxazolyl, an isoxazolyl, a thiazolyl, an isothiazolyl, an imidazolyl, an oxadiazolyl, a thiadiazolyl, a triazolyl, a tetrazolyl, a pyrazolyl, a pyridyl, a pyrimidinyl, a pyridazinyl, a pyrazinyl, a triazinyl, an indolyl, an isoindolyl, a 1H-indazolyl, a benzoimidazolyl, a benzoxazolyl, a benzothiazolyl, a 1H-benzotriazolyl, a quinolyl, an isoquinolyl, a cinnolyl, a quinazolyl, a quinoxalinyl, a phthalazinyl, a naphthyridinyl, a purinyl, a pteridinyl, a carbazolyl, an acridinyl, a phenoxathiinyl, a phenoxazinyl, a phenothiazinyl, a phenazinyl, an indolizinyl, a furyl, a benzofuranyl, an isobenzofuranyl, a dibenzofuranyl, a thienyl, a benzo[b]thienyl, a dibenzothienyl, a furazanyl, an oxadiazolyl, a thianthrenyl, a naphthobenzofuranyl, and a naphthobenzothienyl.

$R^1$ to $R^6$ each independently represent a hydrogen atom, an aryl, a heteroaryl, a diarylamino, a diheteroarylamino, an arylheteroarylamino, an alkyl, an alkoxy, a trialkylsilyl, or an aryloxy, and at least one hydrogen atom in these substituents may be substituted by an aryl, a heteroaryl, a diarylamino, or an alkyl.

For the aryl and the heteroaryl as $R^1$ to $R^6$, the above description of Ar can be cited.

The diarylamino, the diheteroarylamino, and the arylheteroarylamino as $R^1$ to $R^6$ are groups in which an amino group is substituted by two aryl groups, two heteroaryl groups, and one aryl group and one heteroaryl group, respectively. For the aryl and the heteroaryl herein, the above description of Ar can also be cited.

The alkyl as $R^1$ to $R^6$ may be either linear or branched, and examples thereof include a linear alkyl having 1 to 24 carbon atoms and a branched alkyl having 3 to 24 carbon atoms. The alkyl as $R^1$ to $R^6$ is preferably an alkyl having 1 to 18 carbon atoms (branched alkyl having 3 to 18 carbon atoms), more preferably an alkyl having 1 to 12 carbon atoms (branched alkyl having 3 to 12 carbon atoms), still more preferably an alkyl having 1 to 6 carbon atoms (branched alkyl having 3 to 6 carbon atoms), and particularly preferably an alkyl having 1 to 4 carbon atoms (branched alkyl having 3 or 4 carbon atoms).

Specific examples of the alkyl include a methyl, an ethyl, an n-propyl, an isopropyl, an n-butyl, an isobutyl, an s-butyl, a t-butyl, an n-pentyl, an isopentyl, a neopentyl, a t-pentyl, an n-hexyl, a 1-methylpentyl, a 4-methyl-2-pentyl, a 3,3-dimethylbutyl, a 2-ethylbutyl, an n-heptyl, a 1-methylhexyl, an n-octyl, a t-octyl, a 1-methylheptyl, a 2-ethylhexyl, a 2-propylpentyl, an n-nonyl, a 2,2-dimethylheptyl, a 2,6-dimethyl-4-heptyl, a 3,5,5-trimethylhexyl, an n-decyl, an n-undecyl, a 1-methyldecyl, an n-dodecyl, an n-tridecyl, a 1-hexylheptyl, an n-tetradecyl, an n-pentadecyl, an n-hexadecyl, an n-heptadecyl, an n-octadecyl, and an n-eicosyl.

Examples of the alkoxy as $R^1$ to $R^6$ include a linear alkoxy having 1 to 24 carbon atoms and a branched alkoxy having 3 to 24 carbon atoms. The alkoxy as $R^1$ to $R^6$ is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 or 4 carbon atoms).

Specific examples of the alkoxy include a methoxy, an ethoxy, a propoxy, an isopropoxy, a butoxy, an isobutoxy, an s-butoxy, a t-butoxy, a pentyloxy, a hexyloxy, a heptyloxy, and an octyloxy.

Examples of the trialkylsilyl as $R^1$ to $R^6$ include a group in which three hydrogen atoms in a silyl group are each independently substituted by an alkyl. Examples of the alkyl include those described in the above section of the alkyl as $R^1$ to $R^6$. A preferable alkyl for substitution is an alkyl having 1 to 4 carbon atoms, and specific examples thereof include a methyl, an ethyl, a propyl, an i-propyl, a butyl, a sec-butyl, a t-butyl, and a cyclobutyl.

Specific examples of the trialkylsilyl include a trimethylsilyl, a triethylsilyl, a tripropylsilyl, a tri-i-propylsilyl, a tributylsilyl, a tri-sec-butylsilyl, a tri-t-butylsilyl, an ethyl dimethylsilyl, a propyldimethylsilyl, an i-propyldimethylsilyl, a butyldimethylsilyl, a sec-butyldimethylsilyl, a t-butyldimethylsilyl, a methyldiethylsilyl, a propyldiethylsilyl, an i-propyldiethylsilyl, a butyldiethylsilyl, a sec-butyl diethylsilyl, a t-butyldiethylsilyl, a methyldipropylsilyl, an ethyldipropylsilyl, a butyldipropylsilyl, a sec-butyldipropylsilyl, a t-butyldipropylsilyl, a methyl di-i-propylsilyl, an ethyl di-i-propylsilyl, a butyl di-i-propylsilyl, a sec-butyl di-i-propylsilyl, and a t-butyl di-i-propylsilyl.

The aryloxy as $R^1$ to $R^6$ is a group in which a hydrogen atom of a hydroxyl group is substituted by an aryl. For the aryl herein, the above description of Ar can be cited.

At least one hydrogen atom in $R^1$ to $R^6$ may be substituted by an aryl, a heteroaryl, a diarylamino, or an alkyl. For these substituents, the above description can also be cited.

In a case where a plurality of $R^4$'s is present in general formula (1B) or (1B'), adjacent $R^4$'s may be bonded to each other to form an aryl ring or a heteroaryl ring together with ring a, at least one hydrogen atom in the formed ring may be substituted by an aryl, a heteroaryl, a diarylamino, a diheteroarylamino, an arylheteroarylamino, an alkyl, an alkoxy, a trialkylsilyl, or an aryloxy, and at least one hydrogen atom in these substituents may be substituted by an aryl, a heteroaryl, a diarylamino, or an alkyl.

Here, for a substituent (an aryl, a heteroaryl, a diarylamino, a diheteroarylamino, an arylheteroarylamino, an alkyl, an alkoxy, a trialkylsilyl, or an aryloxy) in the formed ring and a further substituent (an aryl, a heteroaryl, a diarylamino, or an alkyl) in the substituent, the above description can be cited.

The case where the substituents $R^4$'s are adjacent to each other means a case where the two substituents $R^4$'s are substituted on carbon atoms adjacent to each other on ring a (benzene ring). In a polycyclic aromatic compound represented by general formula (1B) or (1B'), a ring structure constituting the compound changes according to a mutual bonding form of substituents in ring a as represented by the following general formulas (1B-a') and (1B'-a') (ring a changes to ring a').

General formula (1B-a')

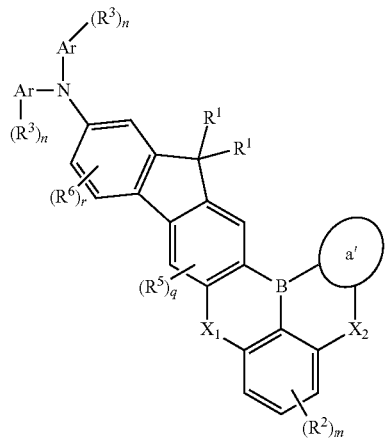

General formula (1B'-a')

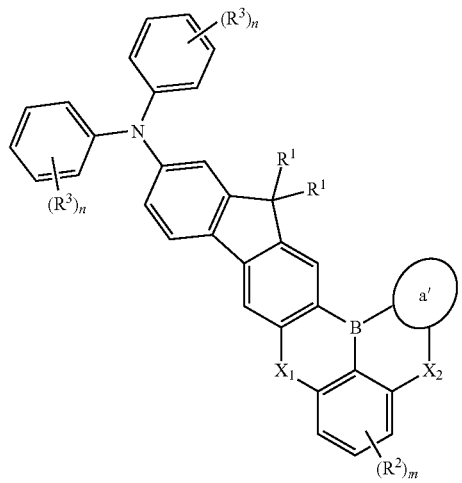

A compound represented by the above general formula (1B-a') or (1B'-a') corresponds to, for example, a compound represented by formula (1B-2), (1B-4), (1B-12), (1B-18), (1B-20), or (1B-24). That is, the compound represented by the above general formula (1B-a') or (1B'-a') is a compound having ring a' formed by condensation of a benzene ring to a benzene ring which is ring a, and the condensed ring a' formed is a naphthalene ring. Examples thereof further include a carbazole ring (including a carbazole ring in which a hydrogen atom on N is substituted by the alkyl or aryl described above), an indole ring (including an indole ring in which a hydrogen atom on N is substituted by the alkyl or aryl described above), a dibenzofuran ring, and a dibenzothiophene ring, formed by condensation of an indole ring, a pyrrole ring, a benzofuran ring, and a benzothiophene ring to a benzene ring which is ring a, respectively.

In a case where $R^3$ and $R^6$ in general formulas (1A) and (1B) are adjacent to each other, $R^3$ and $R^6$ may be bonded to each other via —O—, —S—, —C(—R)$_2$—, or a single bond, and R in the —C(—R)$_2$— is a hydrogen atom or an alkyl having 1 to 6 carbon atoms (particularly an alkyl having 1 to 4 carbon atoms (for example, a methyl or an ethyl)).

The case where $R^3$ and $R^6$ are adjacent to each other means, for example, a case where the substituent $R^3$ is substituted next to the bonding position with N (nitrogen) in Ar (phenyl), and the substituent $R^3$ is substituted next to the bonding position with N (nitrogen) in the fluorene structure as described below. These two substituents may be bonded to each other as described above.

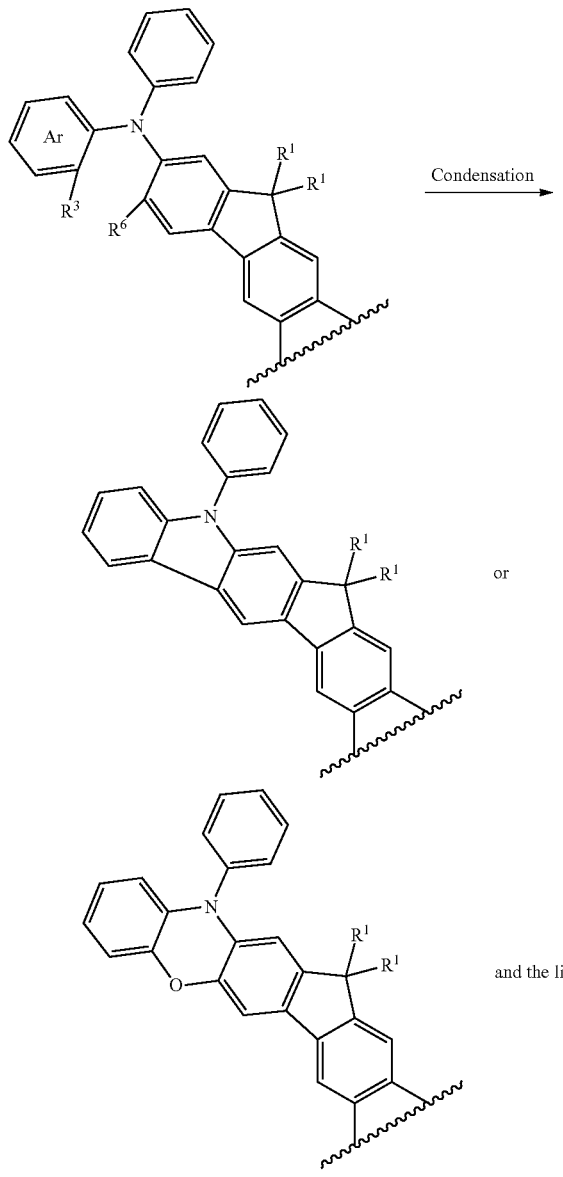

m represents an integer of 0 to 3, n's each independently represent an integer of 0 to a maximum number that makes substitution in Ar possible, p represents an integer of 0 to 4, q's each independently represent an integer of 0 to 2, and r's each independently represent an integer of 0 to 3.

m represents preferably an integer of 0 to 2, more preferably 0 or 1, and particularly preferably 0. n's each independently represent preferably an integer of 0 to 5, more preferably an integer of 0 to 3, particularly preferably an integer of 0 to 2, still more preferably 0 or 1, and most preferably 0. p represents an integer of 0 to 2, preferably 0 or 1, and particularly preferably 0. q's each independently represent preferably 0 or 1, and particularly preferably 0. r's each independently represent preferably 0 or 1, and particularly preferably 0.

$X^1$ and $X^2$ each independently represent O or N—R, and R in the N—R represents an aryl having 6 to 12 carbon atoms, a heteroaryl having 2 to 15 carbon atoms, or an alkyl having 1 to 6 carbon atoms.

For the aryl, the heteroaryl, and the alkyl as R of the N—R, the above description of Ar and $R^1$ to $R^6$ can be cited.

In a case where $X^2$ in general formulas (1B) and (1B') represents the N—R, R may be bonded to the ring a via —O—, —S—, —C(—R)$_2$—, or a single bond, and R in the —C(—R)$_2$— represents a hydrogen atom or an alkyl having 1 to 6 carbon atoms (particularly an alkyl having 1 to 4 carbon atoms (for example, a methyl or an ethyl)).

For the alkyl as R in the —C(—R)$_2$—, the above description of $R^1$ to $R^6$ can be cited. The definition that "R in N—R is bonded to the ring a via —O—, —S—, —C(—R)$_2$—, or a single bond" can be expressed by a compound having a ring structure in which $X^2$ is incorporated into a condensed ring a" represented by the following general formula (1B-a") or (1B'-a"). That is, for example, the compound is a compound having ring a" formed by condensation of another ring to a benzene ring which is the ring a in general formula (1B) or (1B') so as to incorporate $X^2$. The condensed ring a" formed in this way is, for example, a phenoxazine ring, a phenothiazine ring, or an acridine ring.

General formula (1B-a")

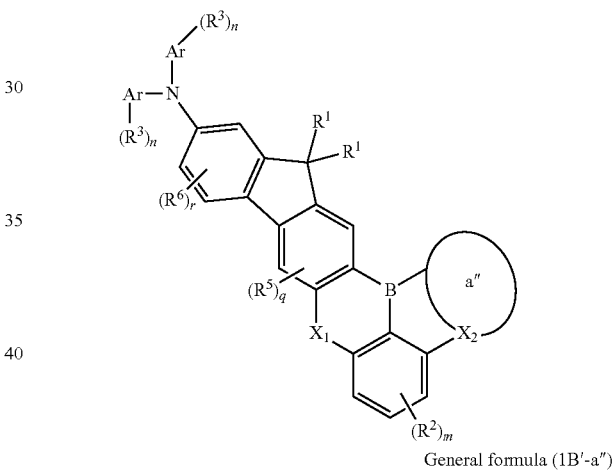

General formula (1B'-a")

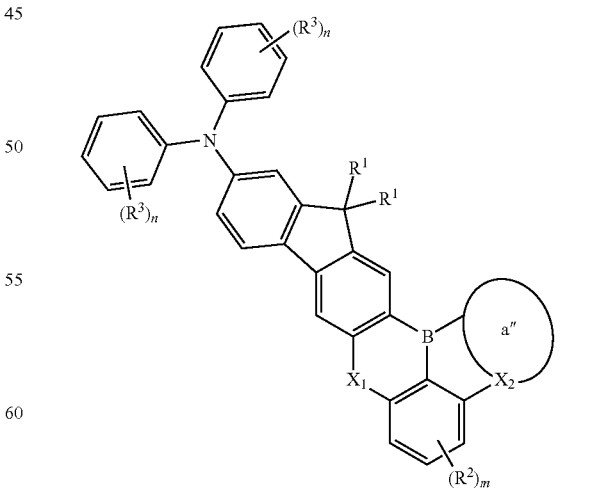

At least one hydrogen atom in a compound represented by general formula (1A) or (1B) may be substituted by a halogen atom or a deuterium atom.

The halogen is fluorine, chlorine, bromine, or iodine, preferably fluorine, chlorine, or bromine, and more preferably chlorine.

Furthermore, the polycyclic aromatic compound according to the present invention can be used as a material for an organic device. Examples of the organic device include an organic electroluminescent element, an organic field effect transistor, and an organic thin film solar cell. Particularly, in the organic electroluminescent element, a dopant material of a light emitting layer is preferably a compound in which $X^1$ and $X^2$ each represent N—R, a compound in which $X^1$ and $X^2$ each represent O, a compound in which $X^1$ represents O and $X^2$ represents N—R, or a compound in which $X^1$ represents N—R and $X^2$ represents O, a host material of the light emitting layer is preferably a compound in which $X^1$ represents O and $X^2$ represents N—R, a compound in which $X^1$ represents N—R and $X^2$ represents O, or a compound in which $X^1$ and $X^2$ each represent O, and an electron transport material is preferably a compound in which $X^1$ and $X^2$ each represent O.

More specific examples of the polycyclic aromatic compound of the present invention include compounds represented by the following formulas (1A-1) to (1A-28), compounds represented by the following formulas (1B-1) to (1B-26), and compounds represented by the following formulas (1B-27) to (1B-42).

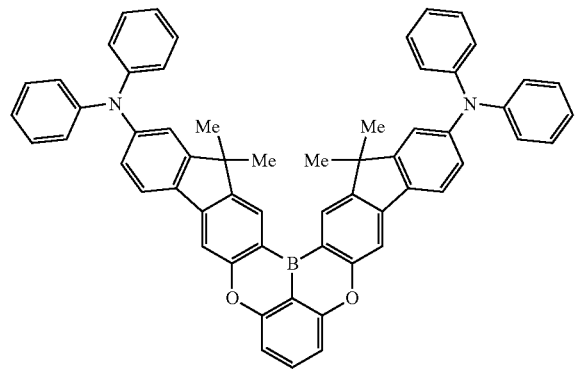

(1A-1)

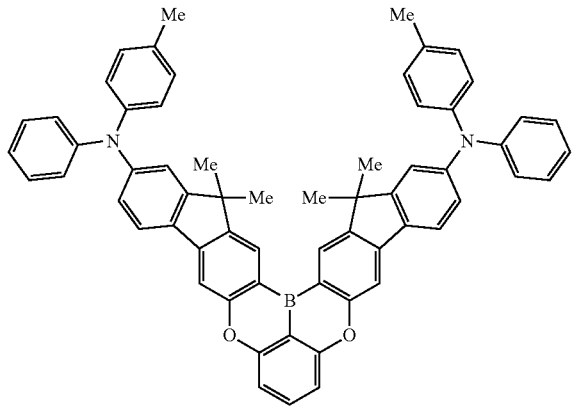

(1A-2)

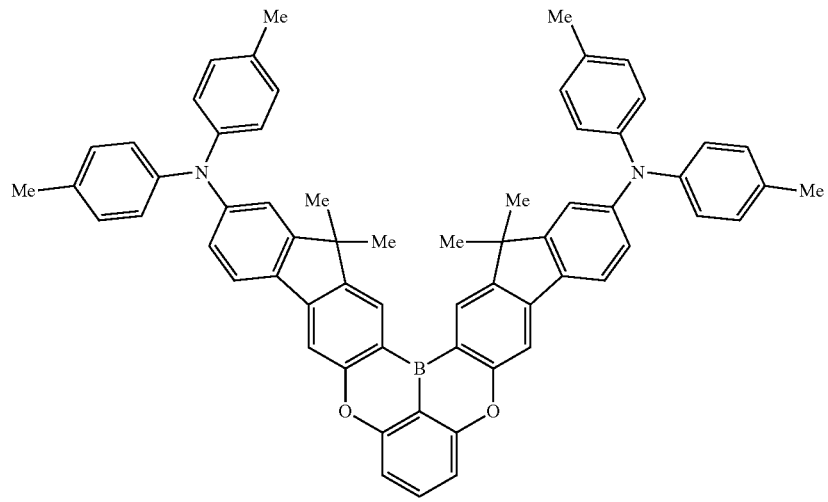

(1A-3)

(1A-4)
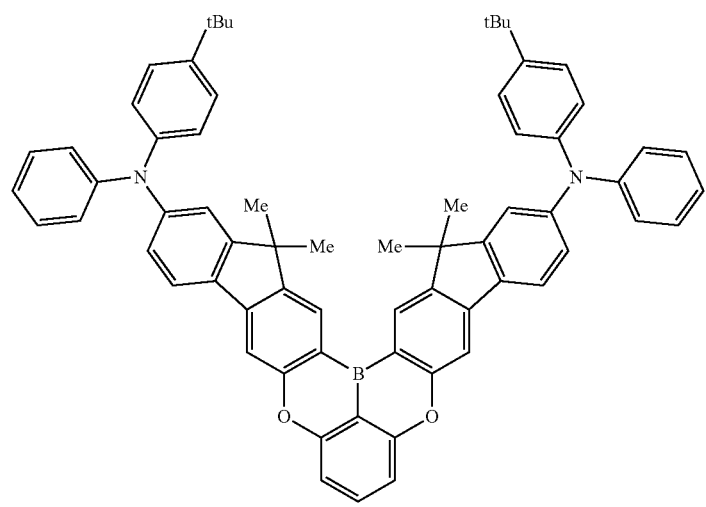
(1A-5)
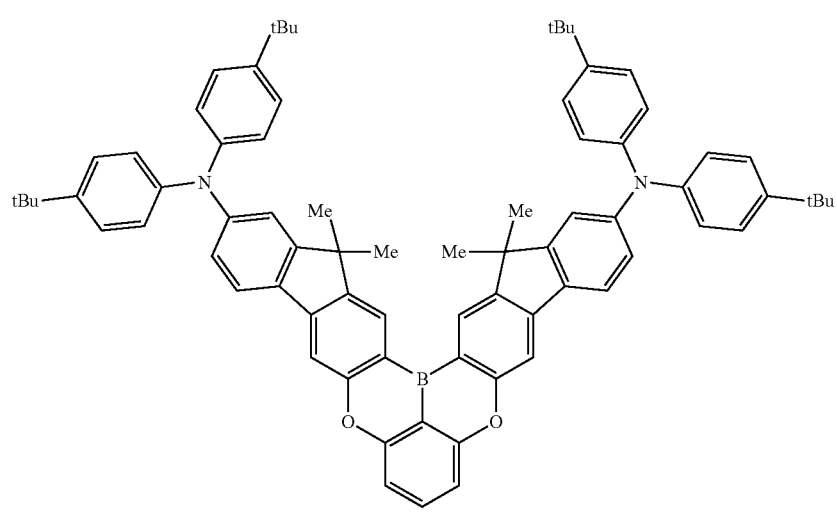
(1A-6)
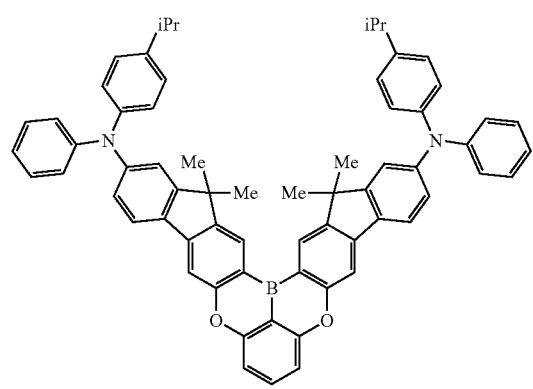
(1A-7)
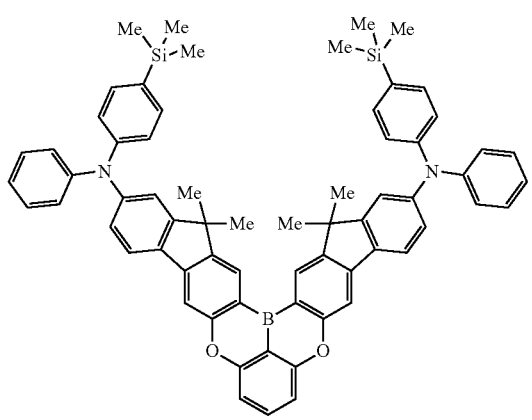

-continued
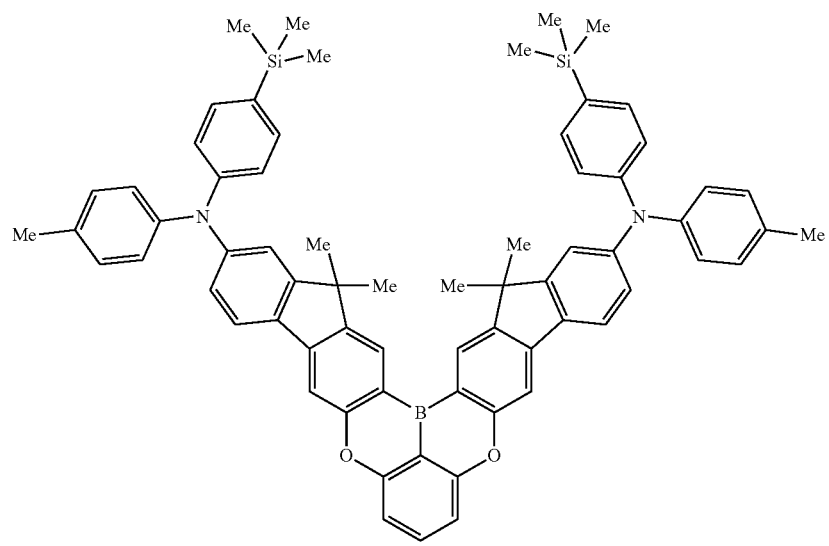
(1A-8)
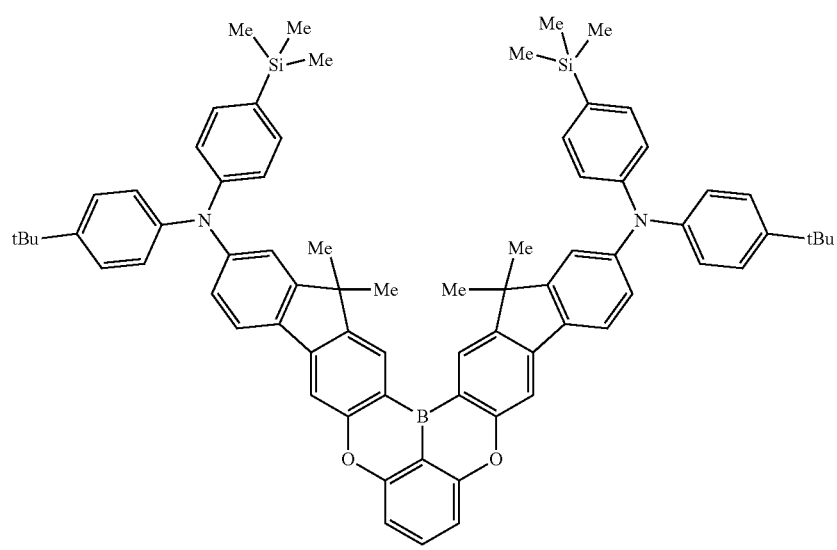
(1A-9)
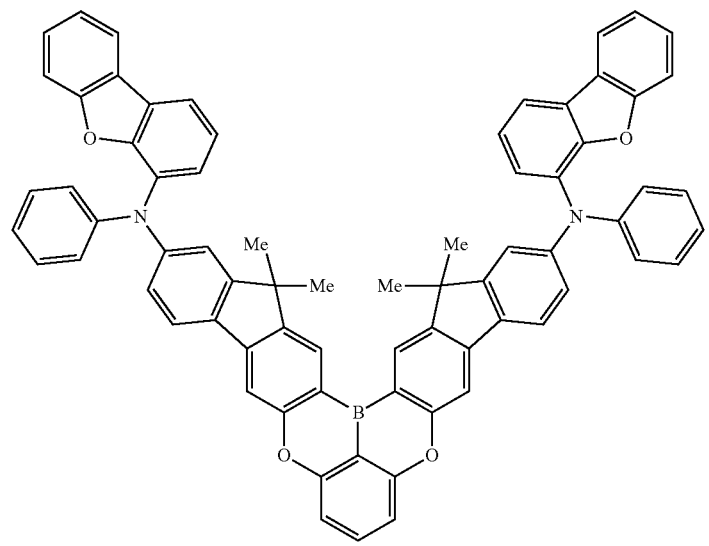
(1A-10)

-continued
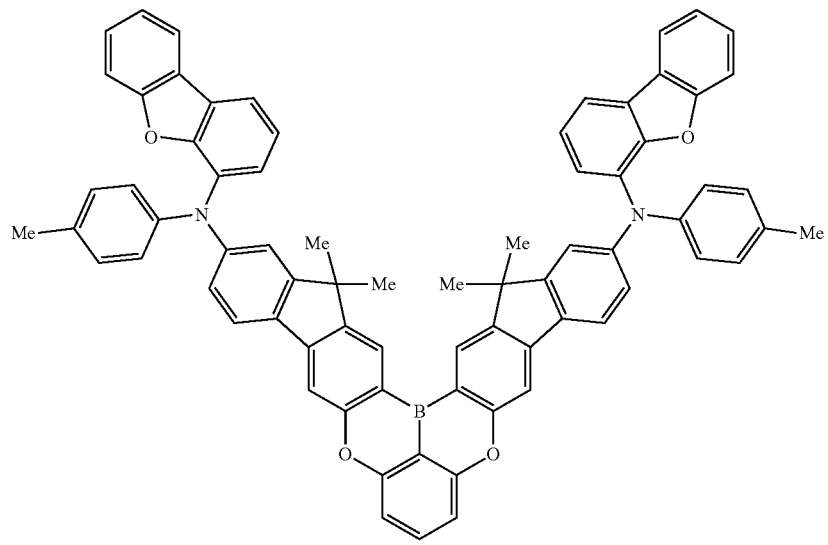
(1A-11)
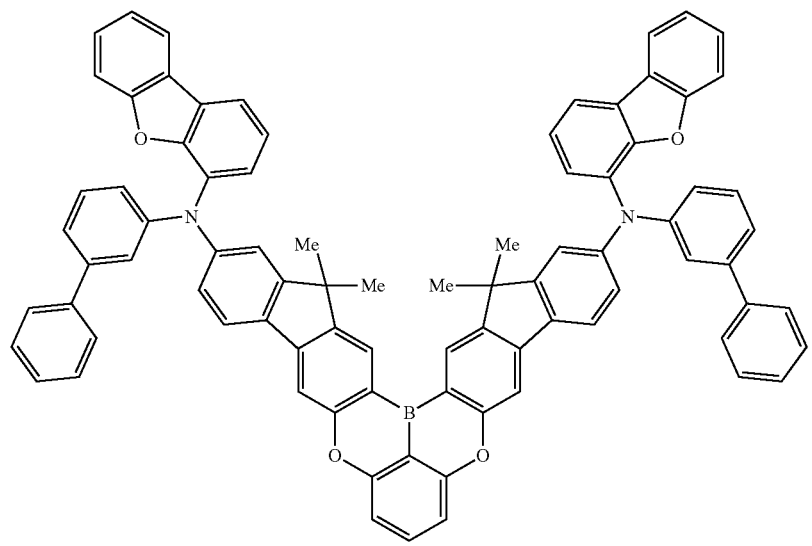
(1A-12)
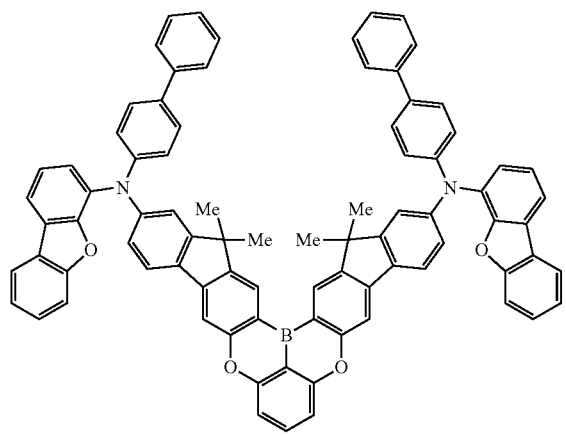
(1A-13)
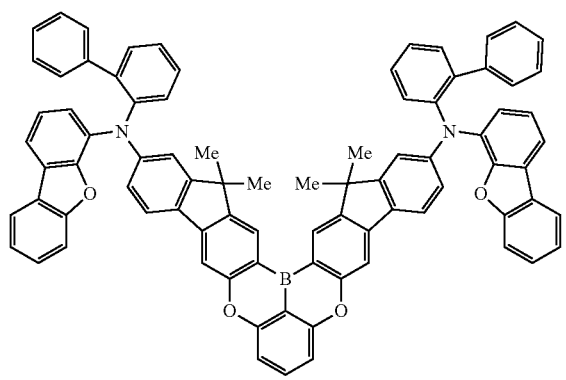
(1A-14)

-continued
(1A-15)
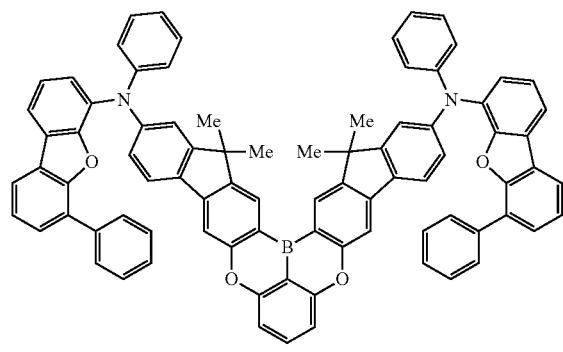
(1A-16)
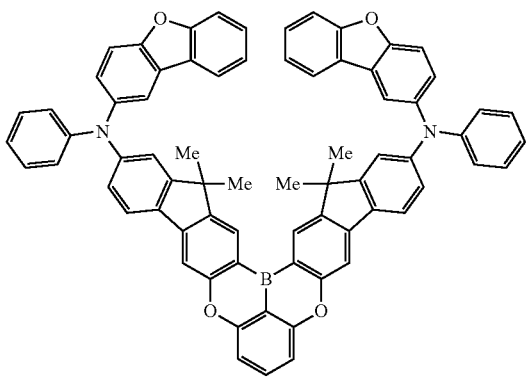
(1A-17)
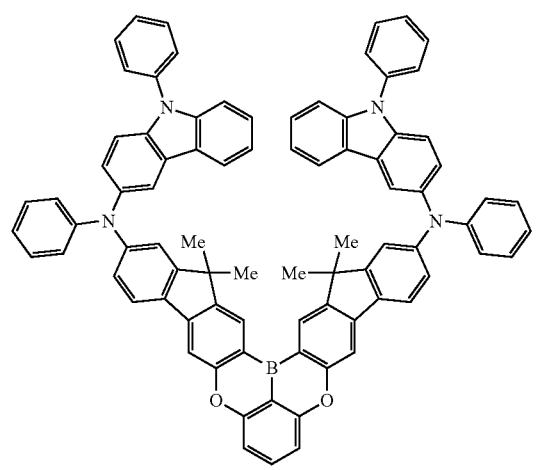
(1A-18)
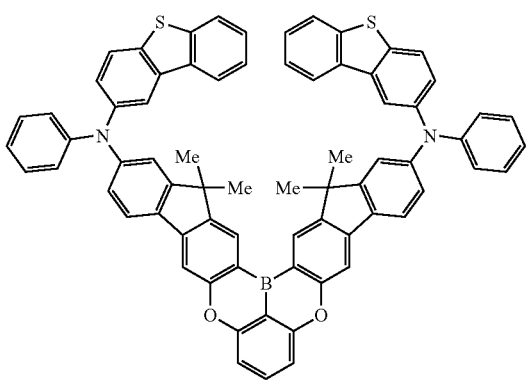
(1A-19)
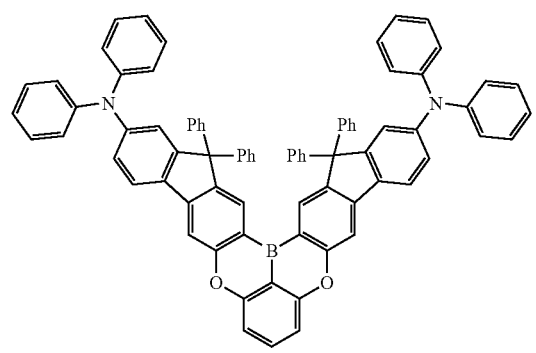
(1A-20)
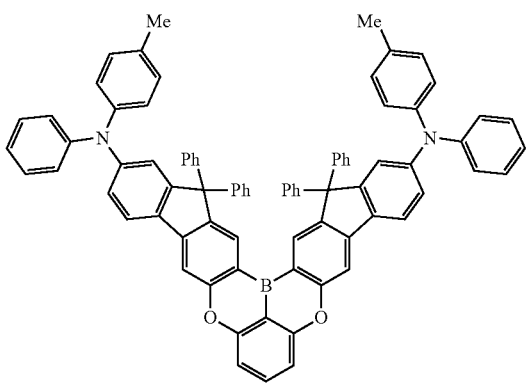

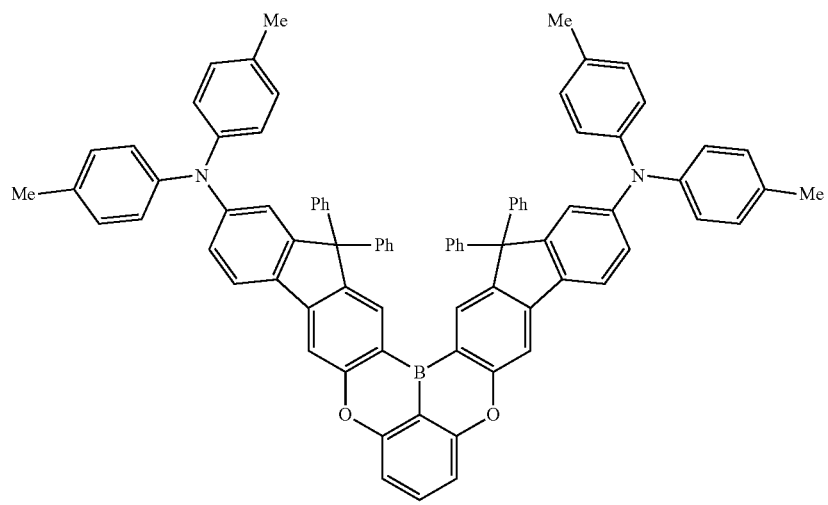
(1A-21)
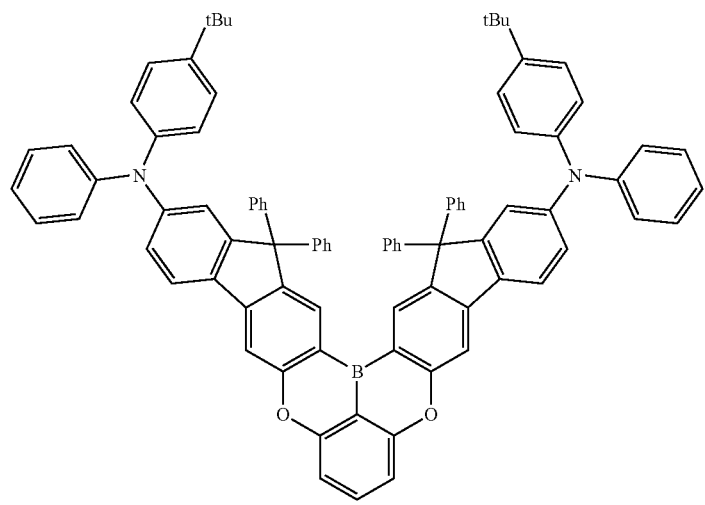
(1A-22)
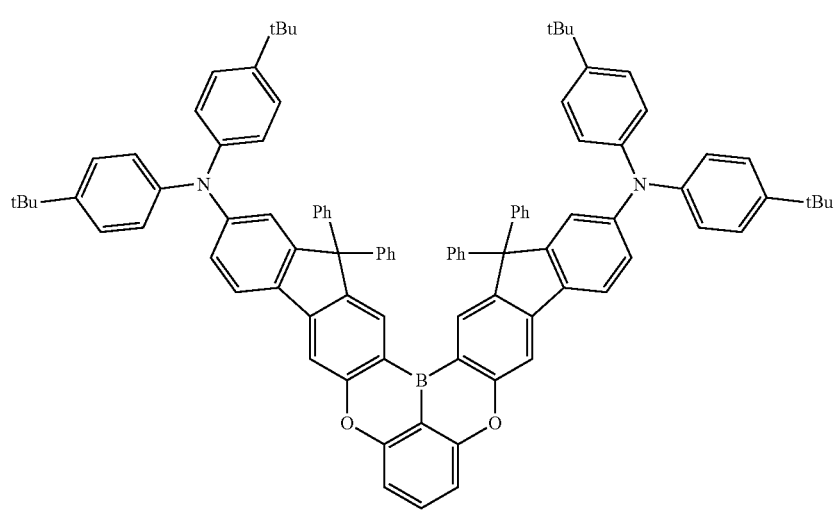
(1A-23)

-continued
(1A-24)
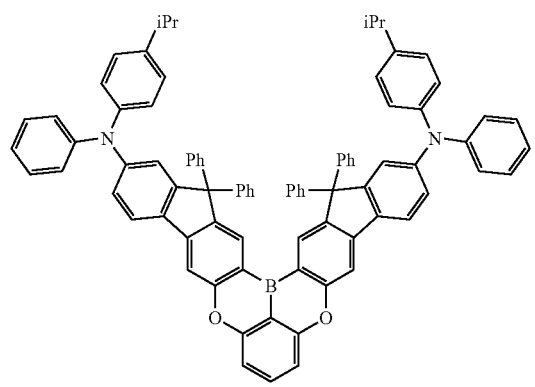
(1A-25)
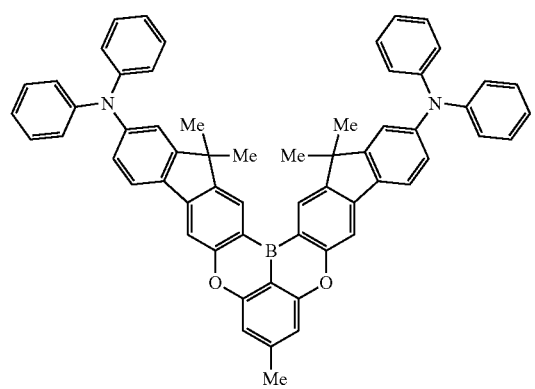
(1A-26)
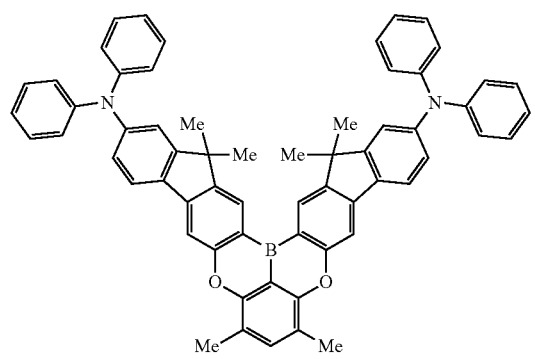
(1A-27)
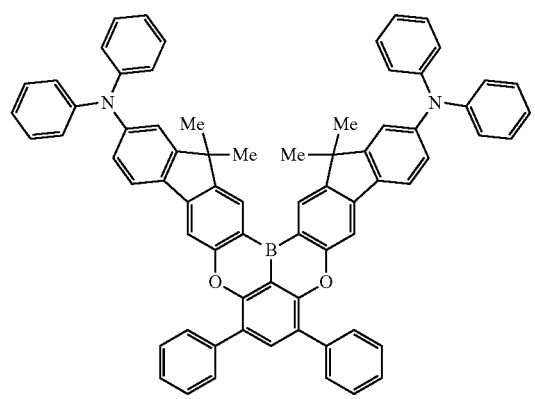
(1A-28)
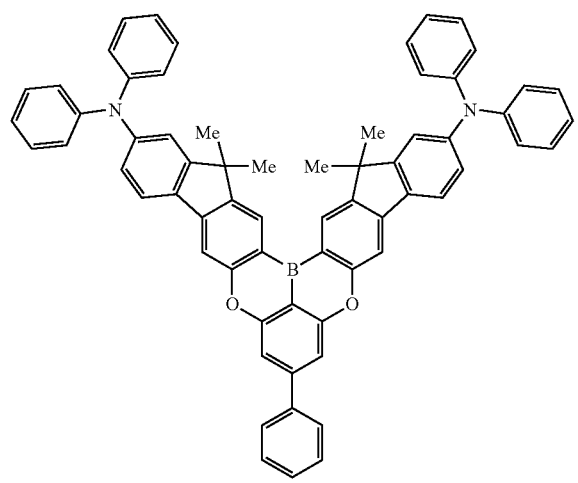
(1B-1)
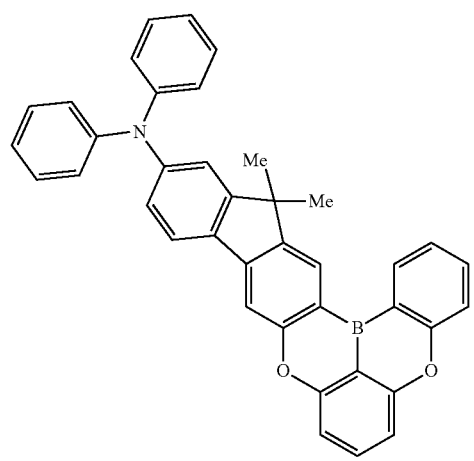

(1B-2)
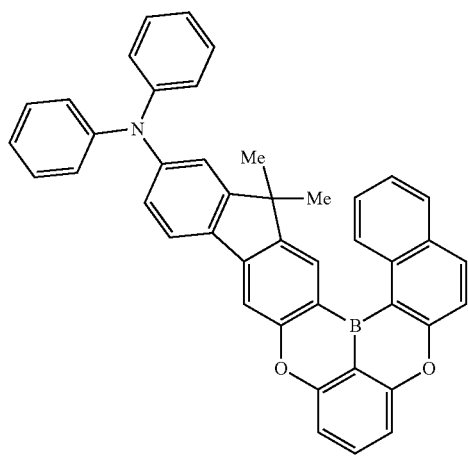
(1B-3)
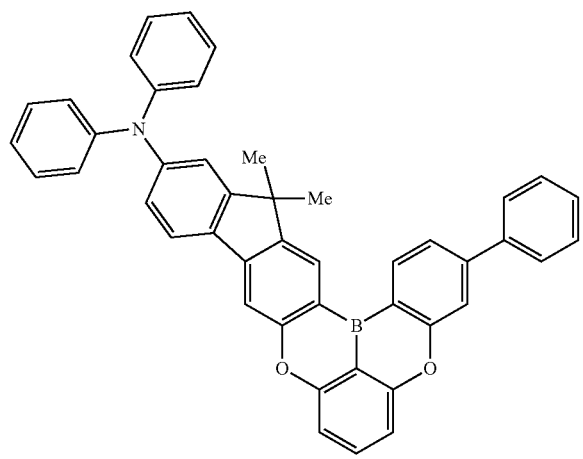
(1B-4)
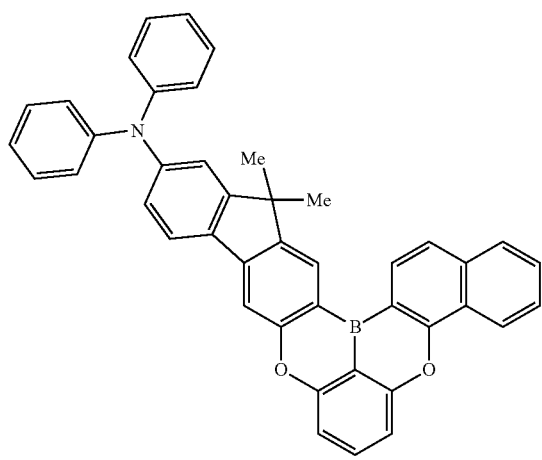
(1B-5)
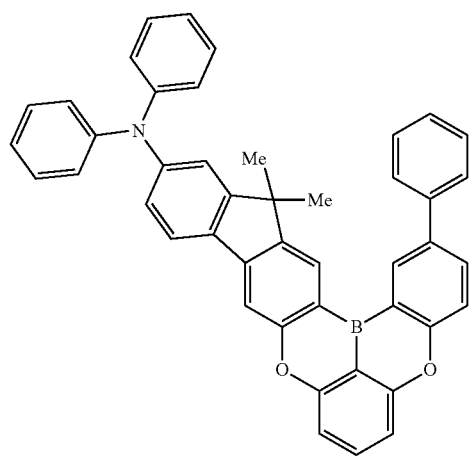
(1B-6)
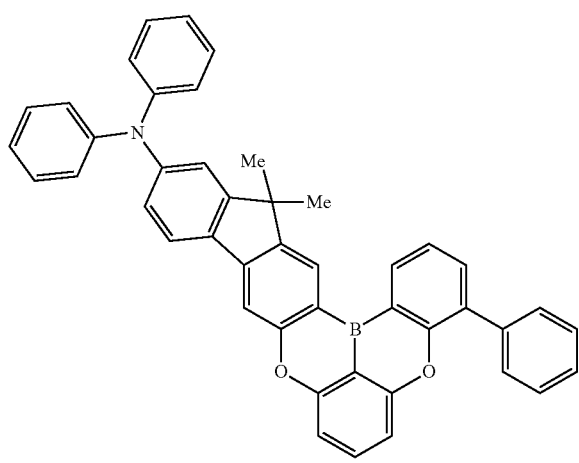
(1B-7)
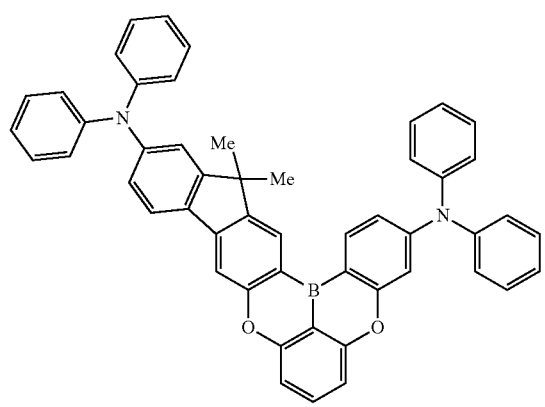

-continued
(1B-8)
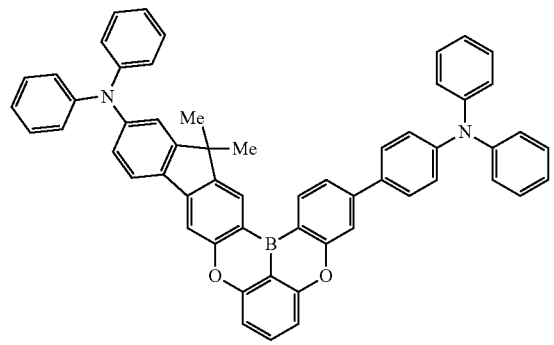
(1B-9)
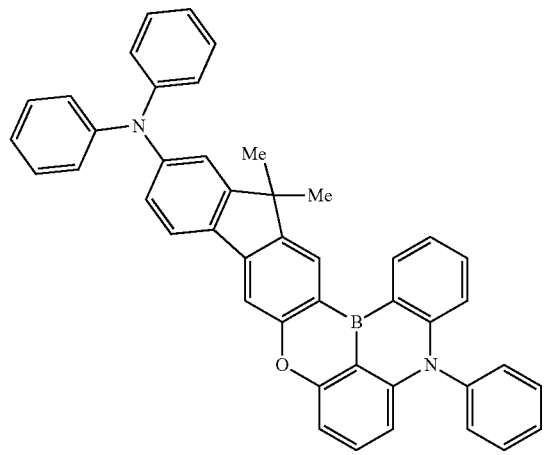
(1B-10)
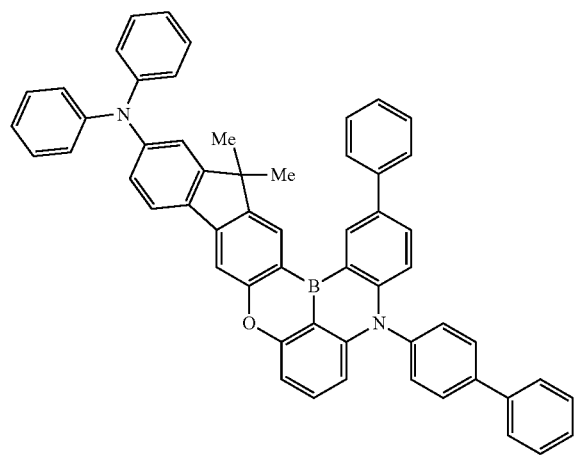
(1B-11)
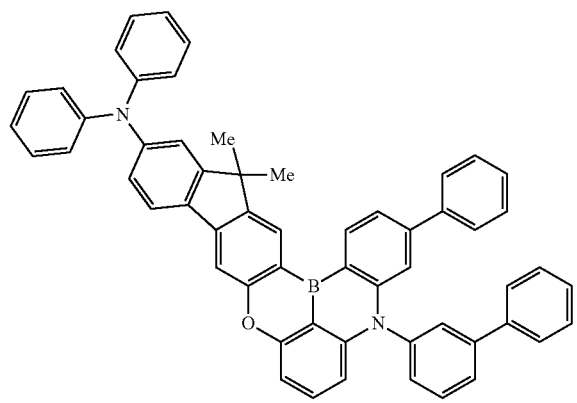
(1B-12)
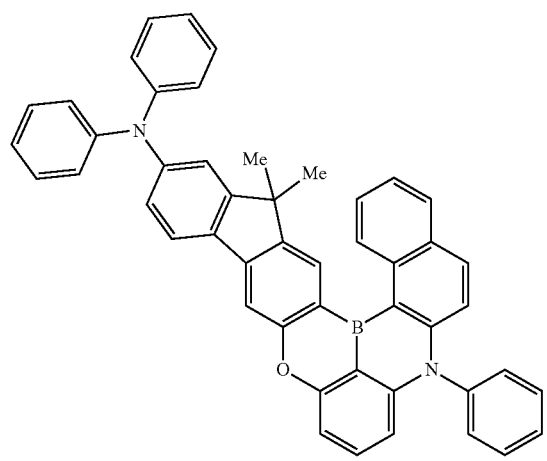
(1B-13)
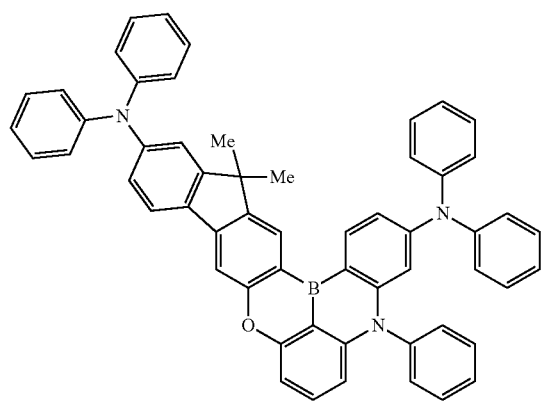

-continued
(1B-14)
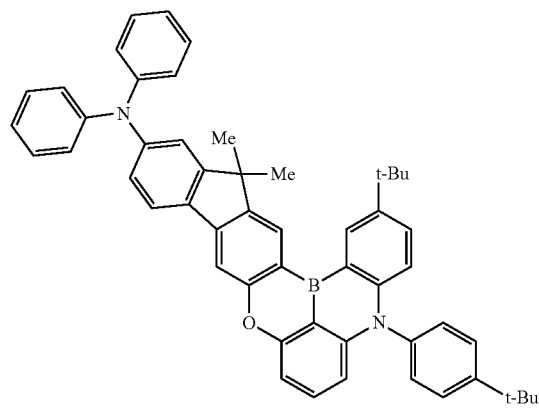
(1B-15)
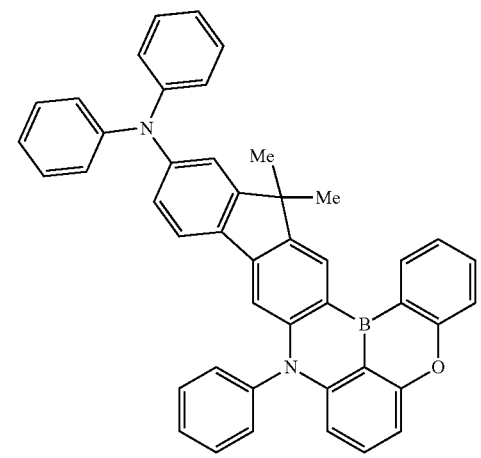
(1B-16)
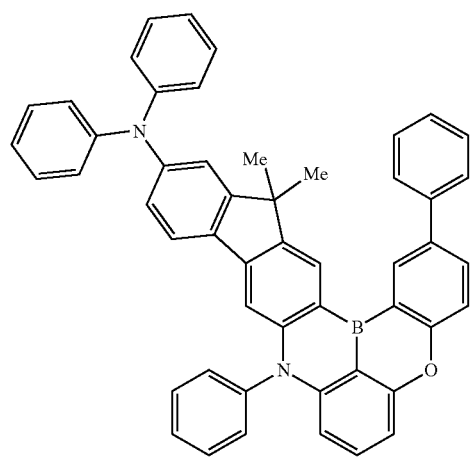
(1B-17)
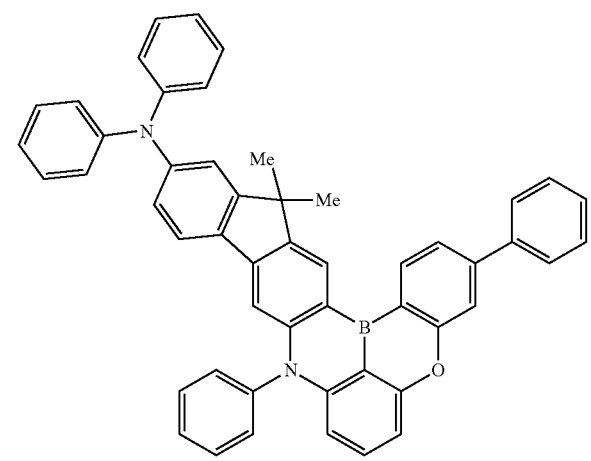
(1B-18)
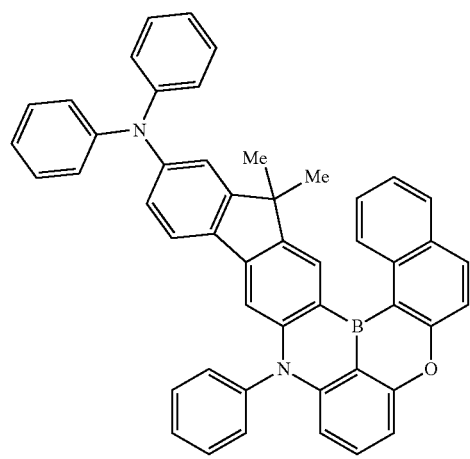
(1B-19)
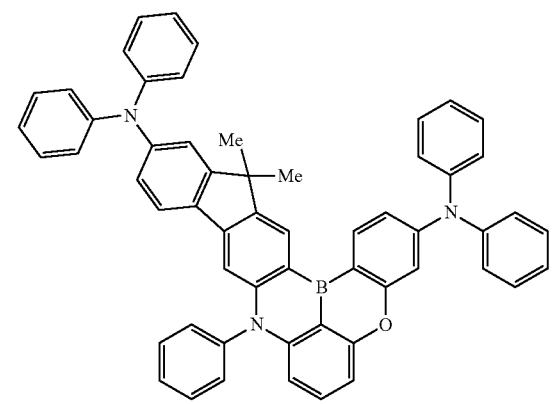

-continued
(1B-20)
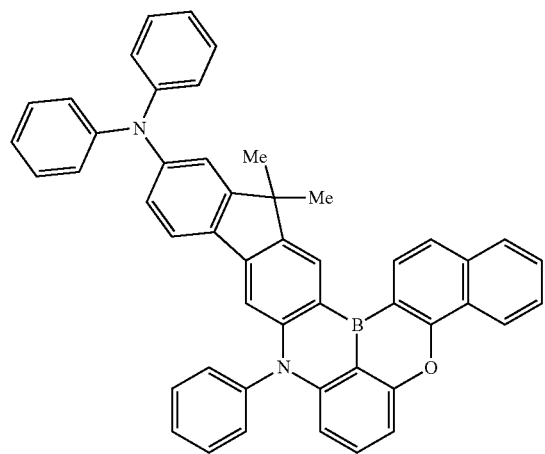
(1B-21)
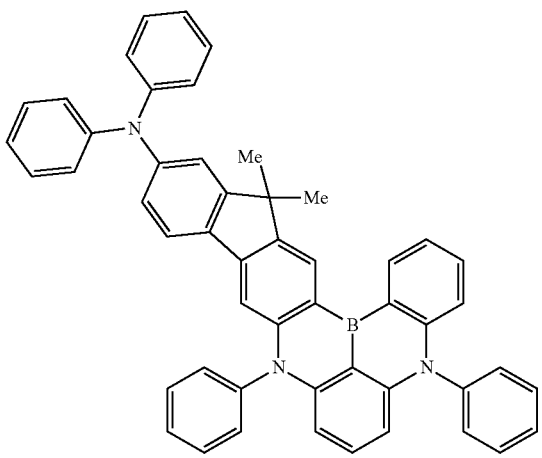
(1B-22)
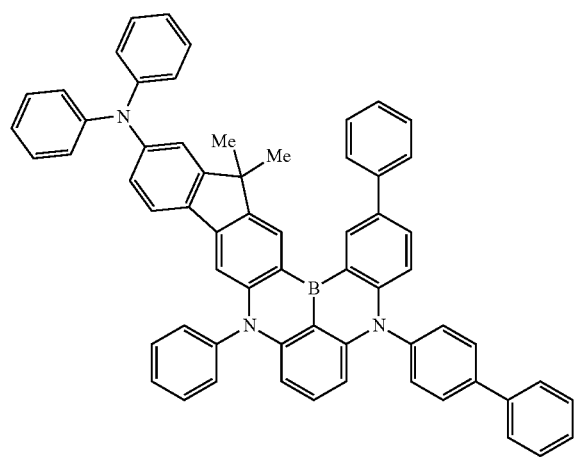
(1B-23)
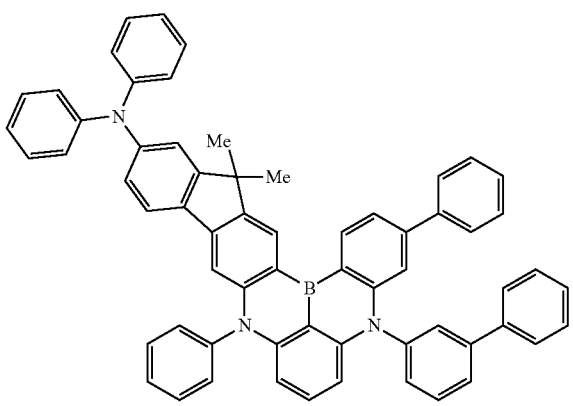
(1B-24)
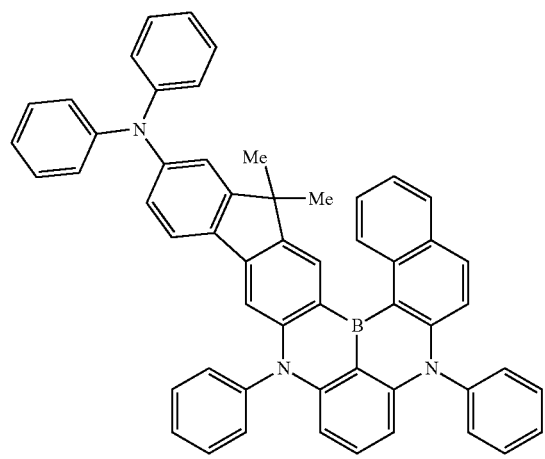
(1B-25)
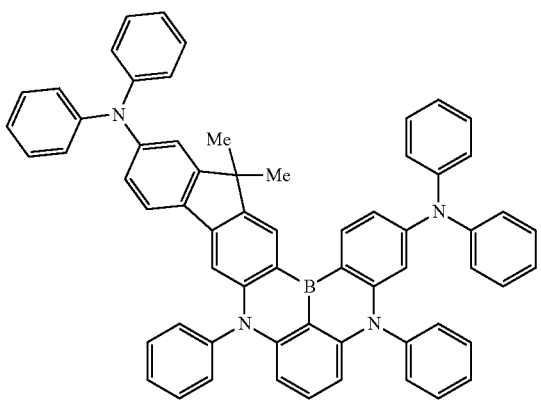

-continued
(1B-26)
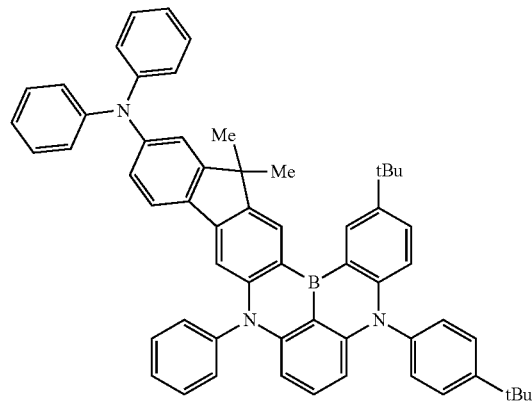
(1B-27)
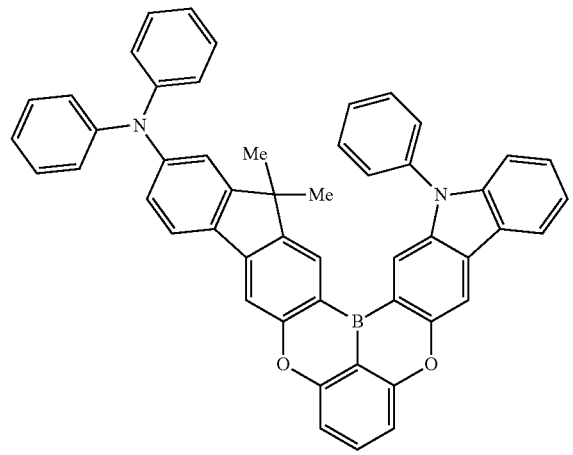
(1B-28)
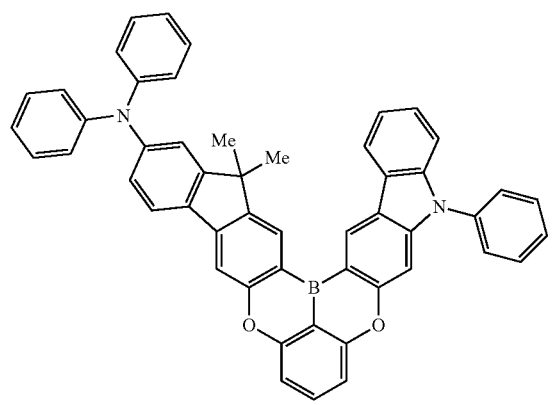
(1B-29)
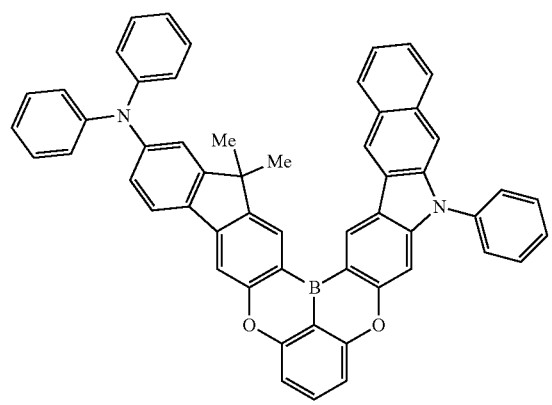
(1B-30)
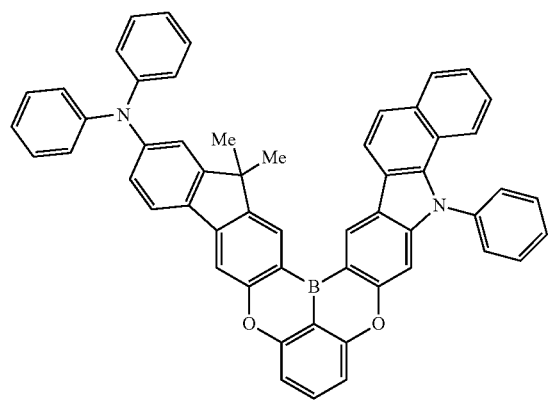
(1B-31)
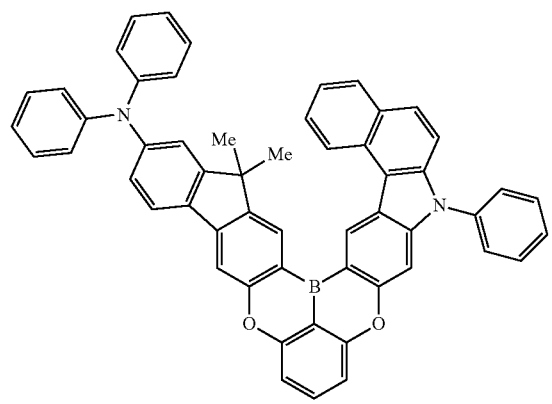

-continued
(1B-32)
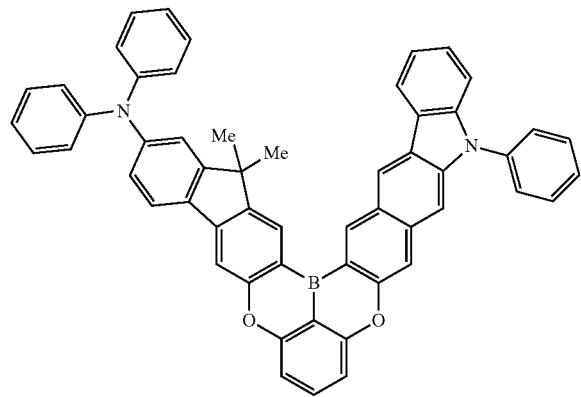
(1B-33)
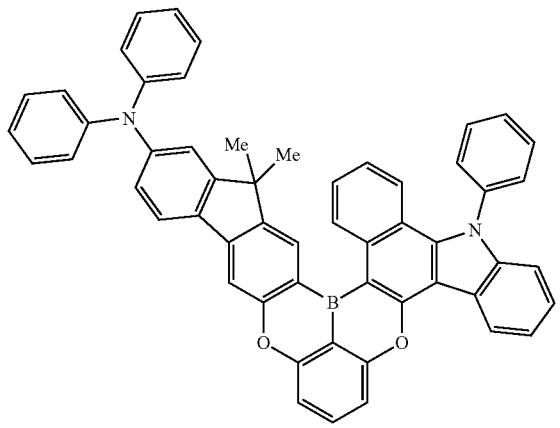
(1B-34)
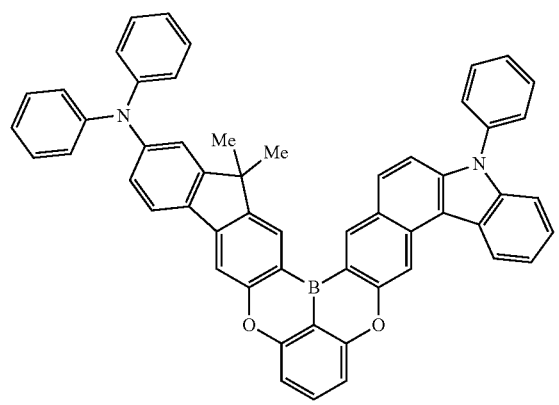
(1B-35)
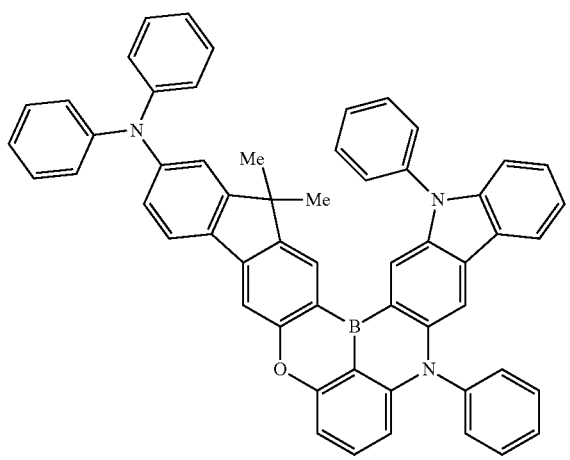
(1B-36)
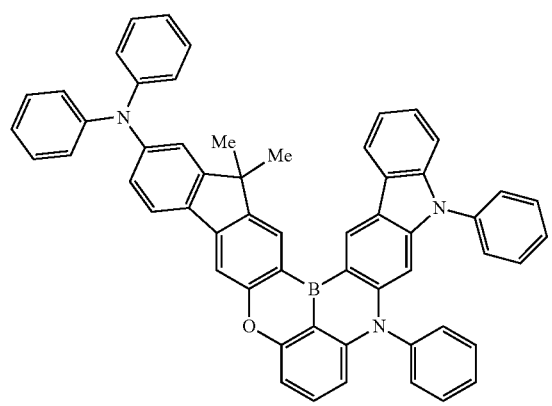
(1B-37)
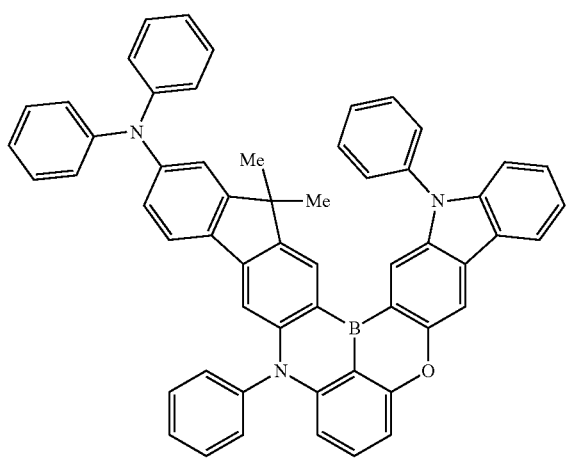

(1B-38)
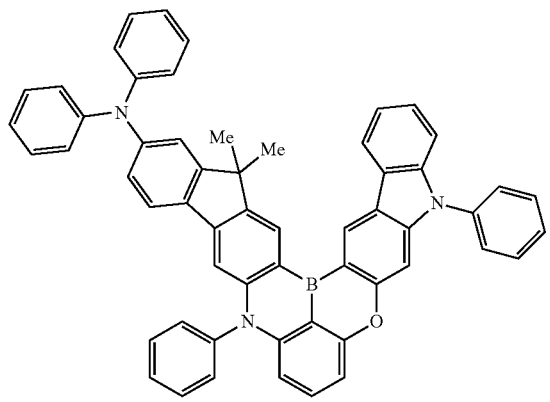

(1B-39)
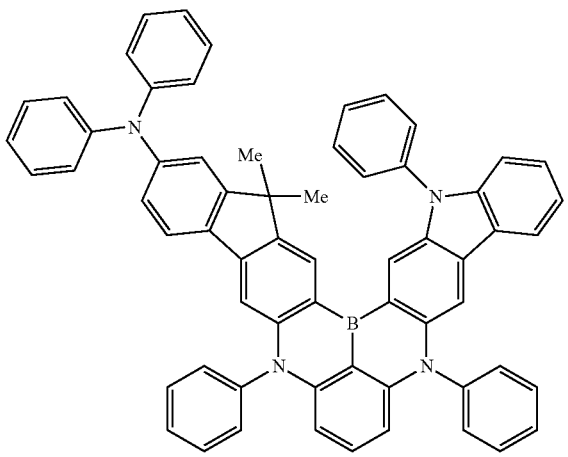

(1B-40)
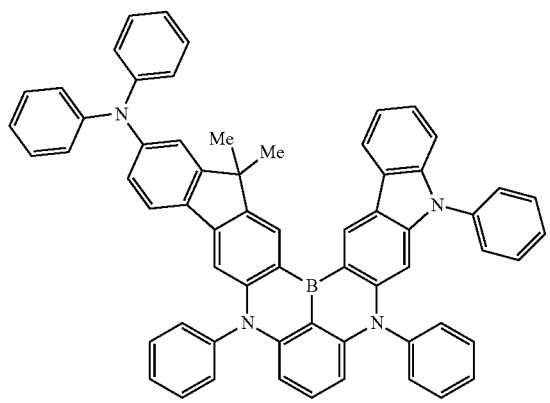

(1B-41)
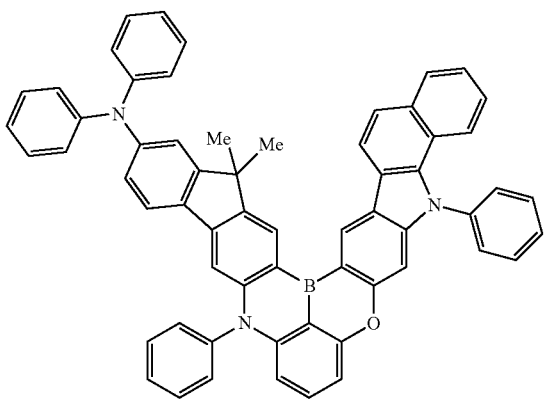

(1B-42)
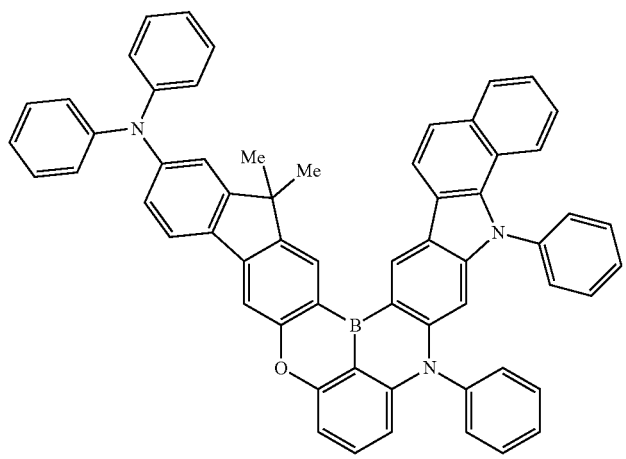

In the polycyclic aromatic compound of the present invention, represented by general formula (1B) or (1B'), an increase in T1 energy (an increase by approximately 0.01 to 0.1 eV) can be expected by introducing a phenyloxy group, a carbazolyl group, or a diphenylamino group into the para-position with respect to B (boron) in ring A. Particularly, by introducing a phenyloxy group into the para-position with respect to B (boron), the HOMO on the benzene ring which is ring a is more localized to the meta-position with respect to the boron, and the LUMO is localized to the ortho- and para-positions with respect to the boron. Therefore, an increase in T1 energy can be particularly expected.

Furthermore, specific examples of the polycyclic aromatic compound of the present invention include a compound in which at least one hydrogen atom in one or more phenyl groups or one phenylene group in the compound is substituted by one or more alkyls each having 1 to 4 carbon atoms, preferably one or more alkyls each having 1 to 3 carbon atoms (preferably one or more methyl groups). More preferable examples thereof include a compound in which the hydrogen atoms at the ortho-positions of one phenyl group (both of the two sites, preferably any one site) or the hydrogen atoms at the ortho-positions of one phenylene group (all of the four sites at maximum, preferably any one site) are substituted by methyl groups.

By substitution of at least one hydrogen atom at the ortho-position of a phenyl group or a p-phenylene group at a terminal in the compound by a methyl group or the like, adjacent aromatic rings are likely to intersect each other perpendicularly, and conjugation is weakened. As a result, triplet excitation energy ($E_T$) can be increased.

2. Method for Manufacturing Polycyclic Aromatic Compound

With regard to the polycyclic aromatic compound represented by general formula (1A) or (1B), basically, first, two fluorene-based compounds are bonded to each other via a bonding group (group containing $X^1$ or $X^2$) in a case of general formula (1A), and one fluorene-based compound is bonded to ring a via a bonding group (group containing $X^1$ or $X^2$) in a case of general formula (1B) to manufacture an intermediate (first reaction). Thereafter, two fluorene-based compounds are bonded to each other via a bonding group (B: group containing a boron atom) in the case of general formula (1A) and one fluorene-based compound is bonded to the ring a via a bonding group (B: group containing a boron atom) in the case of general formula (1B) to manufacture a final product (second reaction). In the first reaction, for example, in an etherification reaction, a general reaction such as a nucleophilic substitution reaction or an Ullmann reaction can be utilized, and in an amination reaction, a general reaction such as a Buchwald-Hartwig reaction can be utilized. In the second reaction, a Tandem Hetero-Friedel-Crafts reaction (continuous aromatic electrophilic substitution reaction, the same hereinafter) can be utilized.

The second reaction is a reaction for introducing B (boron atom) that bonds two fluorene-based compounds to each other or bonds one fluorene-based compound to ring a as illustrated in the following schemes (1) and (2). For example, a case where $X^1$ and $X^2$ are oxygen atoms is illustrated below. First, a hydrogen atom between $X^1$ and $X^2$ is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. In the second reaction, a Lewis acid such as aluminum trichloride may be added in order to accelerate the reaction.

Scheme (1)

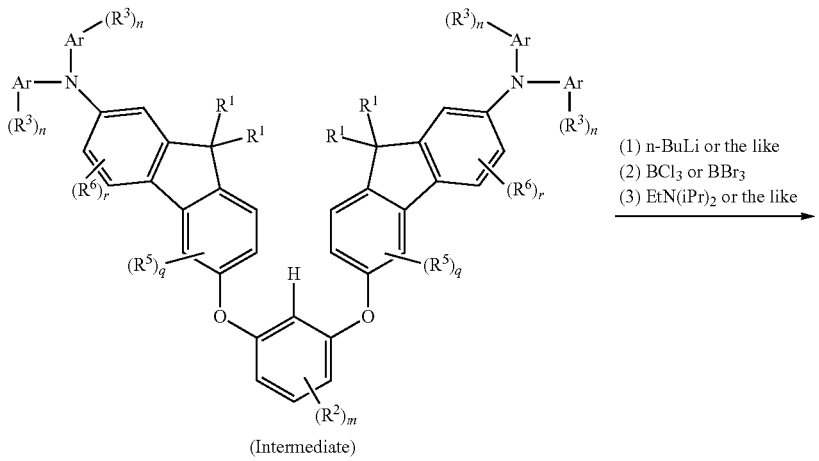

(1) n-BuLi or the like
(2) BCl₃ or BBr₃
(3) EtN(iPr)₂ or the like (Intermediate)

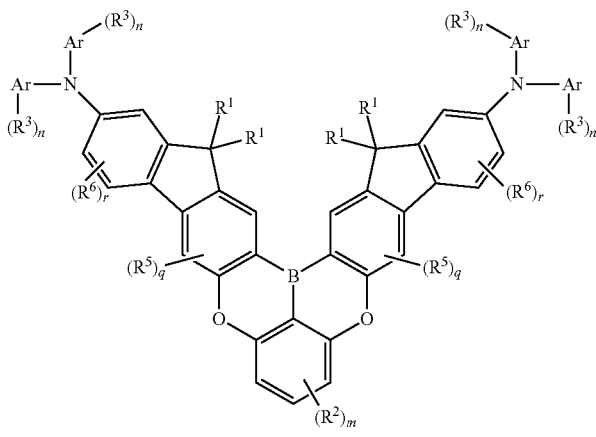

General formula (1A)-based compound

Scheme (2)

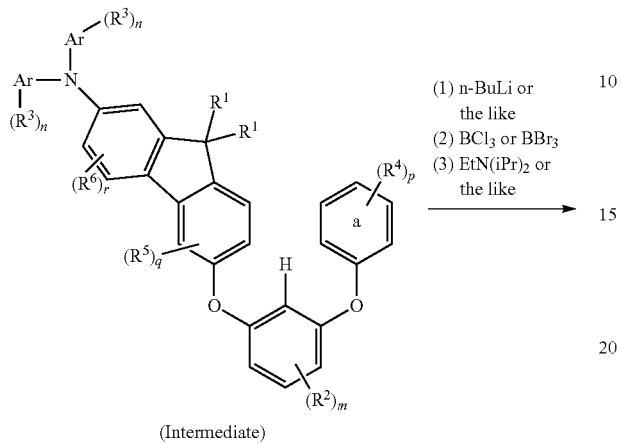

(Intermediate)

(1) n-BuLi or the like
(2) $BCl_3$ or $BBr_3$
(3) $EtN(iPr)_2$ or the like

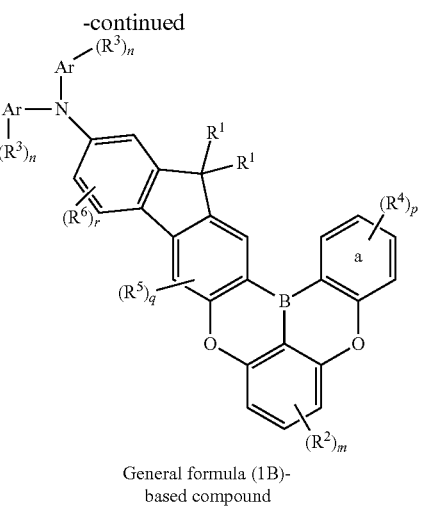

General formula (1B)-based compound

In the above schemes, lithium is introduced into a desired position by ortho-metalation. However, lithium can also be introduced into a desired position by introducing a bromine atom or the like into a position into which lithium is desirably introduced and performing halogen-metal exchange as in the following schemes (3) and (4).

Scheme (3)

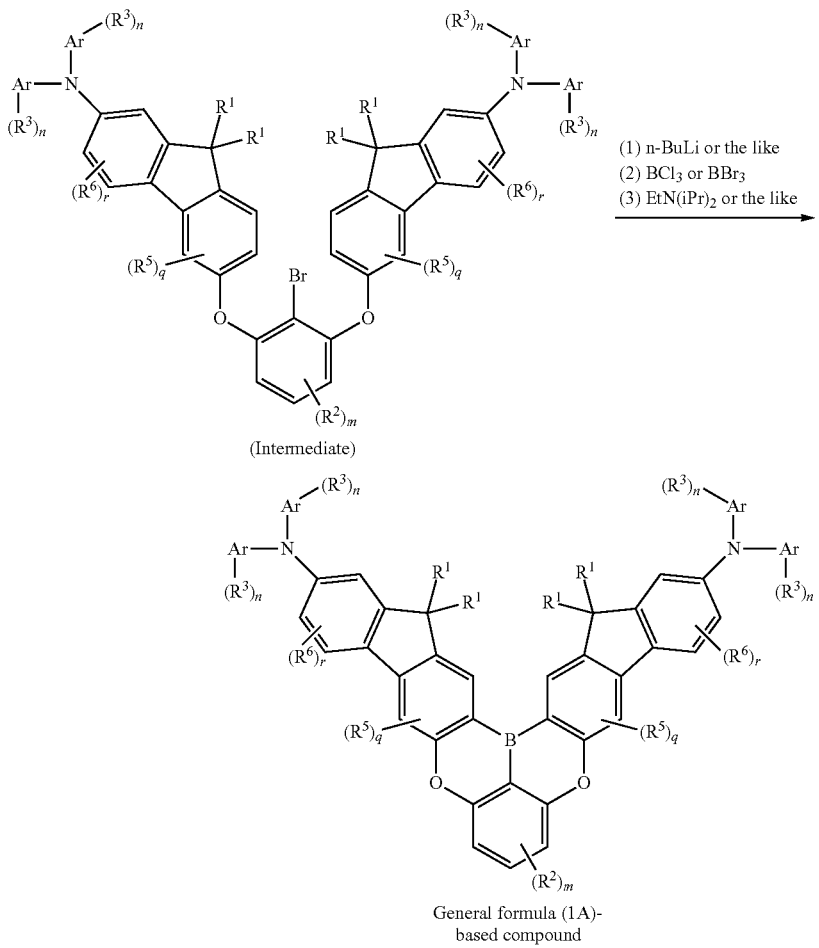

(Intermediate)

(1) n-BuLi or the like
(2) $BCl_3$ or $BBr_3$
(3) $EtN(iPr)_2$ or the like

General formula (1A)-based compound

Scheme (4)

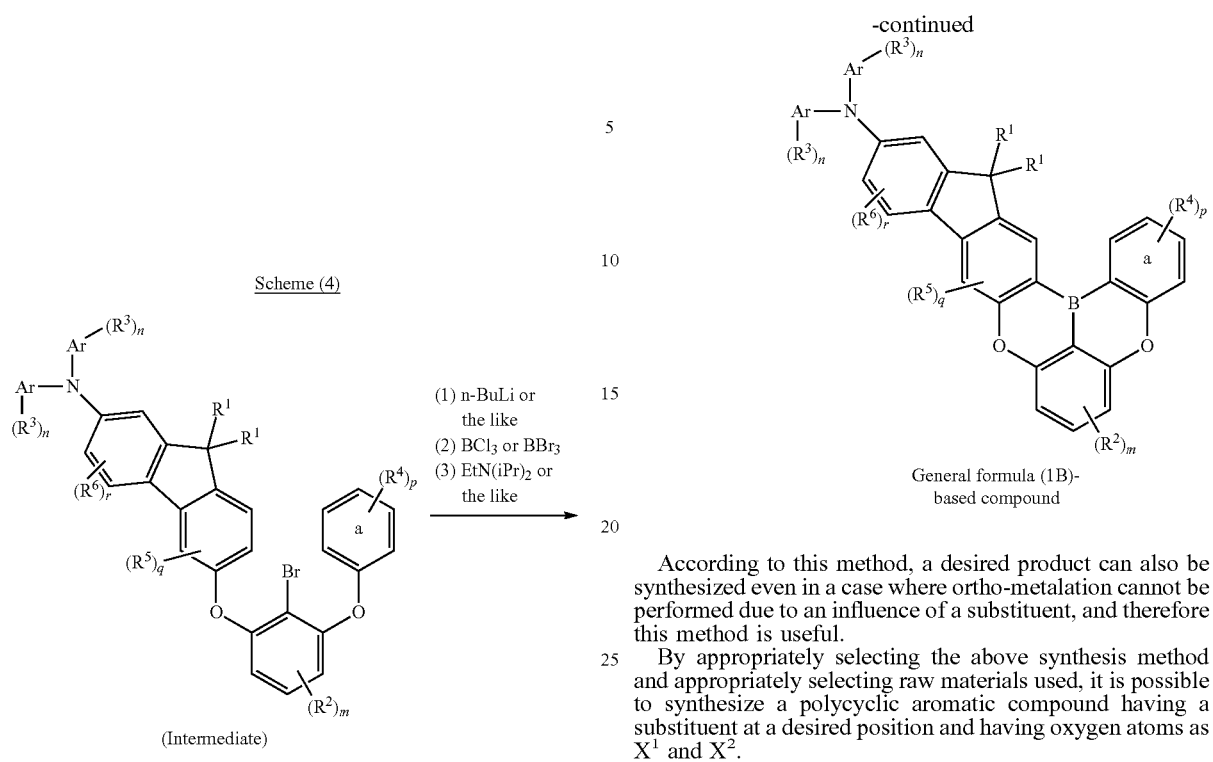

General formula (1B)-
based compound

According to this method, a desired product can also be synthesized even in a case where ortho-metalation cannot be performed due to an influence of a substituent, and therefore this method is useful.

By appropriately selecting the above synthesis method and appropriately selecting raw materials used, it is possible to synthesize a polycyclic aromatic compound having a substituent at a desired position and having oxygen atoms as $X^1$ and $X^2$.

Next, for example, a case where $X^1$ and $X^2$ are nitrogen atoms is illustrated in the following schemes (5) and (6). As in the case where $X^1$ and $X^2$ are oxygen atoms, first, a hydrogen atom between $X^1$ and $X^2$ is ortho-metalated with n-butyllithium or the like. Subsequently, boron tribromide or the like is added thereto to induce lithium-boron metal exchange, and then a Brønsted base such as N,N-diisopropylethylamine is added thereto to induce a Tandem Bora-Friedel-Crafts reaction. Thus, a desired product can be obtained. Here, a Lewis acid such as aluminum trichloride may be added in order to accelerate the reaction.

Scheme (5)

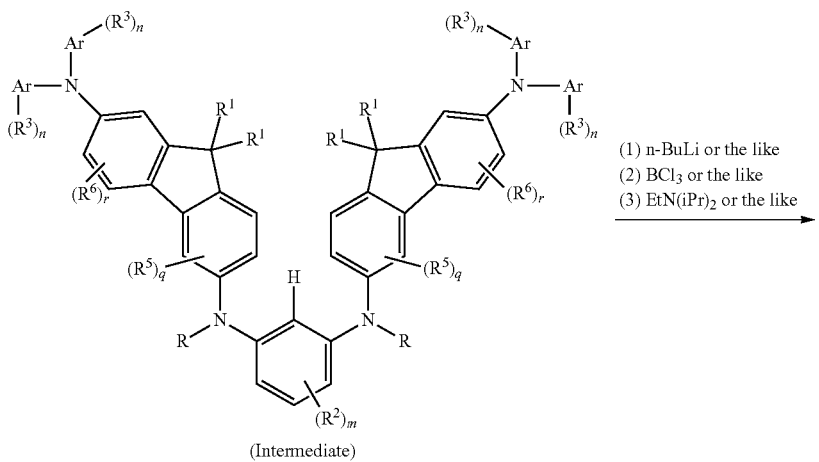

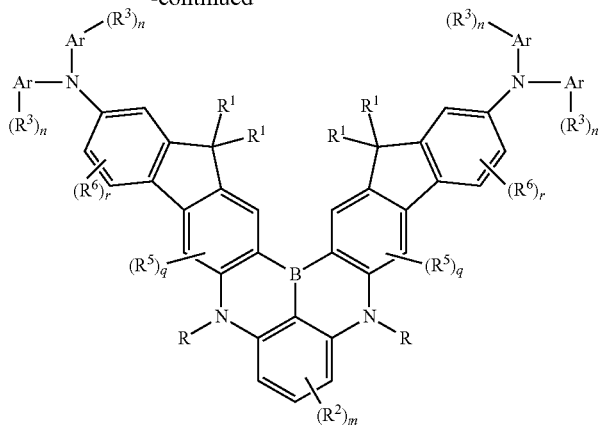

General formula (1A)-based compound

Scheme (6)

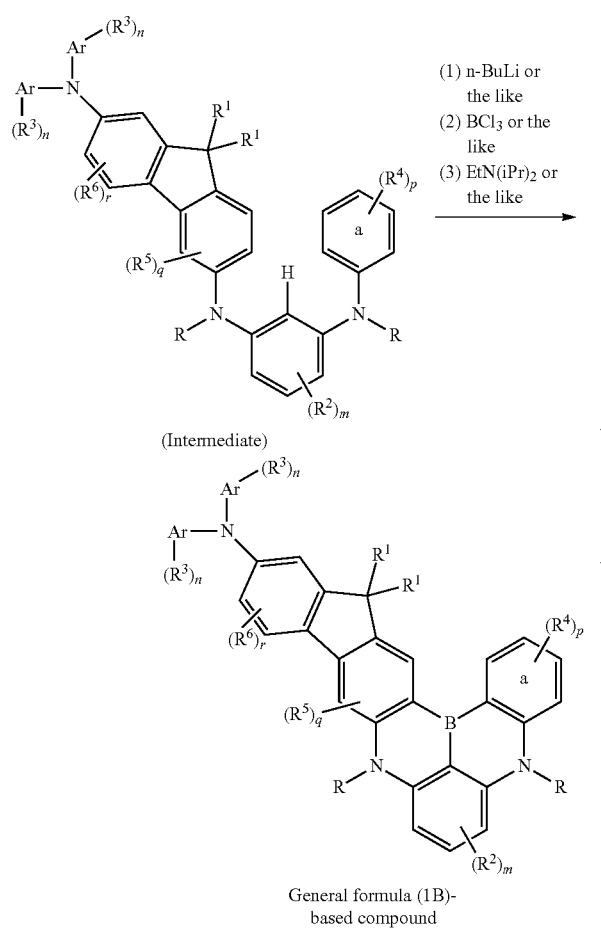

(1) n-BuLi or the like
(2) BCl₃ or the like
(3) EtN(iPr)₂ or the like (Intermediate)

General formula (1B)-based compound

Specific examples of a solvent used in the above reactions include toluene, t-butylbenzene, and xylene.

In a case where a plurality of $R^4$'s is present in general formula (1B) or (1B'), adjacent $R^4$'s may be bonded to each other to form an aryl ring or a heteroaryl ring together with ring a. Therefore, in a polycyclic aromatic compound represented by general formula (1B) or (1B'), a ring structure constituting the compound changes according to a mutual bonding form of substituents in ring a as represented by general formulas (1B-a') and (1B'-a') of the following schemes (7) and (8). These compounds can be synthesized by applying the synthesis methods illustrated in the above schemes (1) to (6) to intermediates illustrated in the following schemes (7) and (8).

Scheme (7)

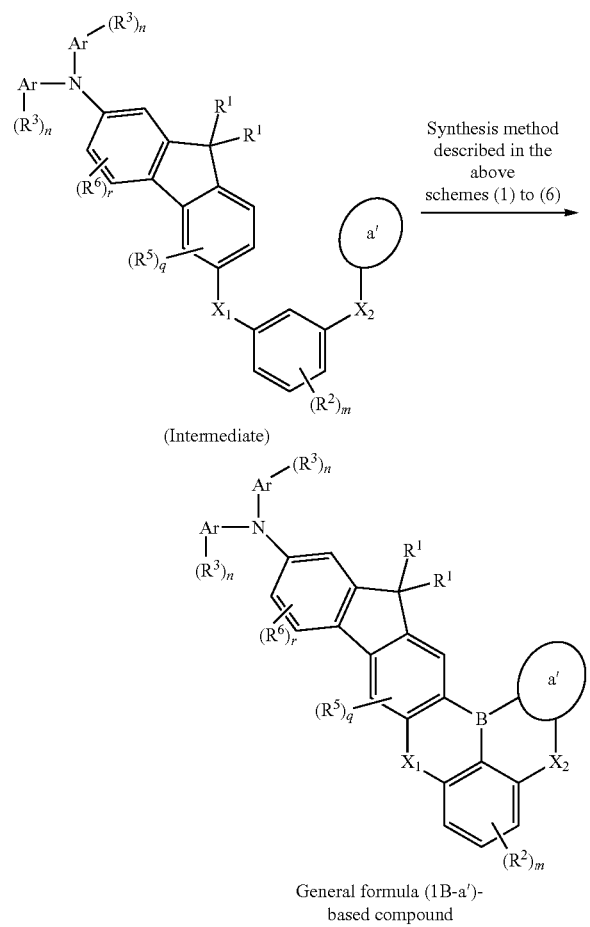

(Intermediate)

Synthesis method described in the above schemes (1) to (6)

General formula (1B-a')-based compound

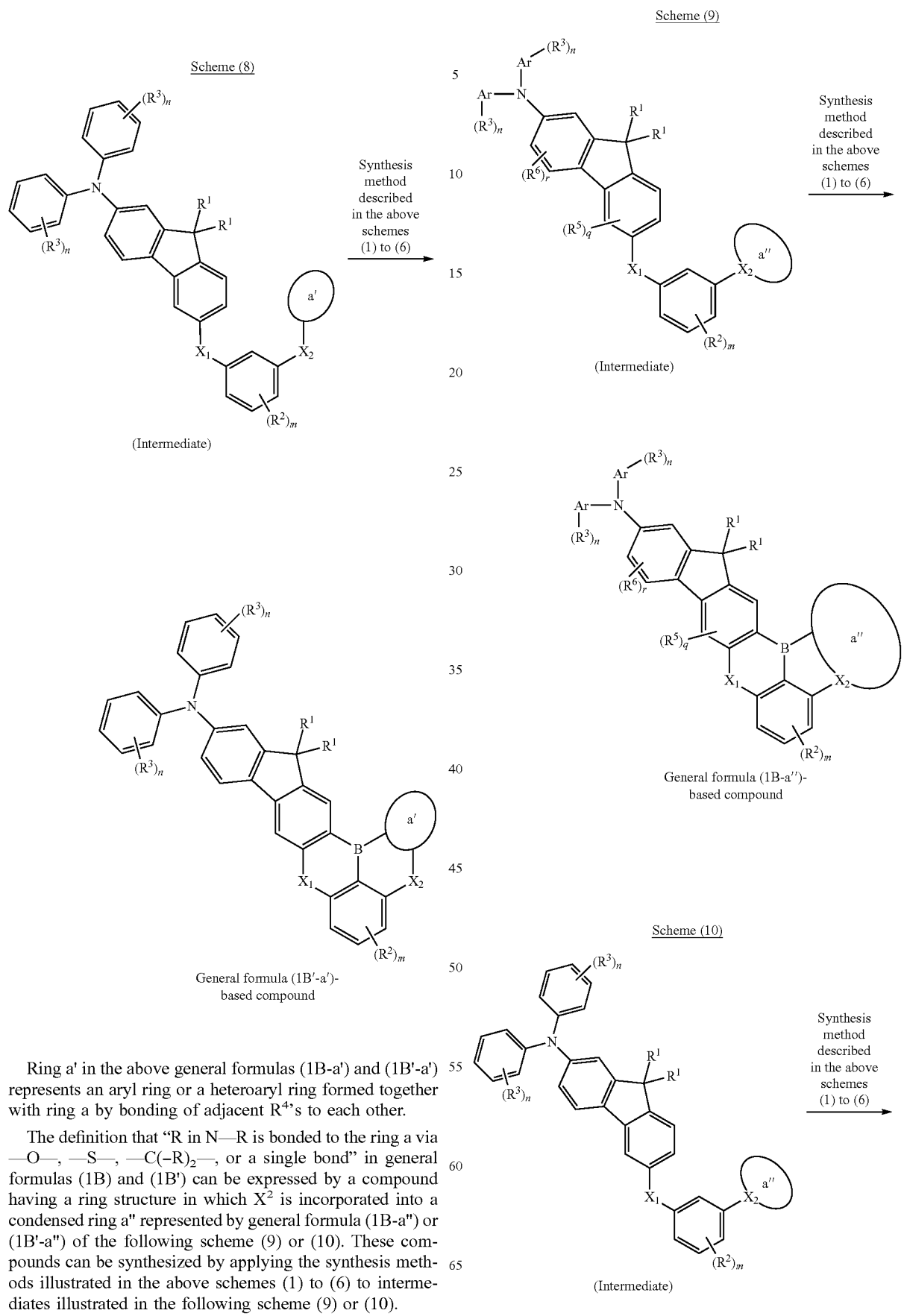

Ring a' in the above general formulas (1B-a') and (1B'-a') represents an aryl ring or a heteroaryl ring formed together with ring a by bonding of adjacent $R^4$'s to each other.

The definition that "R in N—R is bonded to the ring a via —O—, —S—, —C(-R)$_2$—, or a single bond" in general formulas (1B) and (1B') can be expressed by a compound having a ring structure in which $X^2$ is incorporated into a condensed ring a" represented by general formula (1B-a") or (1B'-a") of the following scheme (9) or (10). These compounds can be synthesized by applying the synthesis methods illustrated in the above schemes (1) to (6) to intermediates illustrated in the following scheme (9) or (10).

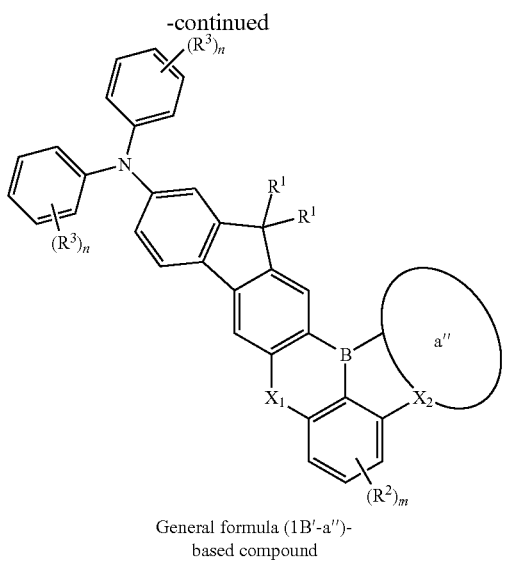

General formula (1B'-a'')-based compound

Furthermore, the synthesis methods of the above schemes (1) to (10) illustrate an example of performing a Tandem Hetero-Friedel-Crafts reaction by ortho-metalating a hydrogen atom (or a halogen atom) between $X^1$ and $X^2$ with butyllithium or the like before boron trichloride, boron tribromide, or the like is added. However, the reaction can also be caused to progress by adding boron trichloride, boron tribromide, or the like without performing ortho-metalation using butyllithium or the like.

Note that examples of an ortho-metalation reagent used in the above schemes (1) to (10) include an alkyllithium such as methyllithium, n-butyllithium, sec-butyllithium, or t-butyllithium, and an organic alkali compound such as lithium diisopropylamide, lithium tetramethylpiperidide, lithium hexamethyldisilazide, or potassium hexamethyldisilazide.

Incidentally, examples of a metal exchanging reagent for metal-B (boron) used in the above schemes (1) to (10) include a halide of B such as trifluoride of B, trichloride of B, tribromide of B, or triiodide of B, an aminated halide of B such as ClPN(NEt$_2$)$_2$, an alkoxylated product of B, and an aryloxylated product of B.

Incidentally, examples of a Brønsted base used in the above schemes (1) to (10) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, Ar$_4$BNa, Ar$_4$BK, Ar$_3$B, and Ar$_4$Si (Ar represents an aryl such as phenyl).

Examples of a Lewis acid used in the above schemes (1) to (10) include AlCl$_3$, AlBr$_3$, AlF$_3$, BF$_3$☐OEt$_2$, BCl$_3$, BBr$_3$, GaCl$_3$, GaBr$_3$, InCl$_3$, InBr$_3$, In(OTf)$_3$, SnCl$_4$, SnBr$_4$, AgOTf, ScCl$_3$, Sc(OTf)$_3$, ZnCl$_2$, ZnBr$_2$, Zn(OTf)$_2$, MgCl$_2$, MgBr$_2$, Mg(OTf)$_2$, LiOTf, NaOTf, KOTf, Me$_3$SiOTf, Cu(OTf)$_2$, CuCl$_2$, YCl$_3$, Y(OTf)$_3$, TiCl$_4$, TiBr$_4$, ZrCl$_4$, ZrBr$_4$, FeCl$_3$, FeBr$_3$, CoCl$_3$, and CoBr$_3$.

In the above schemes (1) to (10), a Brønsted base or a Lewis acid may be used in order to accelerate a Tandem Hetero Friedel-Crafts reaction. However, in a case where a halide of B such as trifluoride of B, trichloride of B, tribromide of B, or triiodide of B is used, an acid such as hydrogen fluoride, hydrogen chloride, hydrogen bromide, or hydrogen iodide is generated along with progress of an aromatic electrophilic substitution reaction. Therefore, it is effective to use a Brønsted base that captures an acid. Meanwhile, in a case where an aminated halide of B or an alkoxylated product of B is used, an amine or an alcohol is generated along with progress of an aromatic electrophilic substitution reaction. Therefore, in many cases, it is not necessary to use a Brønsted base. However, leaving ability of an amino group or an alkoxy group is low, and therefore it is effective to use a Lewis acid that promotes leaving of these groups.

The polycyclic aromatic compound of the present invention also includes a compound in which at least some hydrogen atoms are substituted by deuterium atoms or halogen atoms such as fluorine atoms or chlorine atoms. These compounds can be synthesized using raw materials that are deuterated, fluorinated, or chlorinated at desired sites in a similar manner to the above.

The polycyclic aromatic compound according to the present invention can be used as a material for an organic device. Examples of the organic device include an organic electroluminescent element, an organic field effect transistor, and an organic thin film solar cell.

3. Organic Electroluminescent Element

The polycyclic aromatic compound according to the present invention can be used as, for example, a material for an organic electroluminescent element. Hereinafter, an organic EL element according to the present embodiment will be described in detail based on the drawings. FIG. 1 is a schematic cross-sectional view illustrating the organic EL element according to the present embodiment.

<Structure of Organic Electroluminescent Element>

An organic electroluminescent element 100 illustrated in FIG. 1 includes a substrate 101, a positive electrode 102 disposed on the substrate 101, a hole injection layer 103 disposed on the positive electrode 102, a hole transport layer 104 disposed on the hole injection layer 103, a light emitting layer 105 disposed on the hole transport layer 104, an electron transport layer 106 disposed on the light emitting layer 105, an electron injection layer 107 disposed on the electron transport layer 106, and a negative electrode 108 disposed on the electron injection layer 107.

Incidentally, the organic electroluminescent element 100 may be configured, by reversing the manufacturing order, to include, for example, the substrate 101, the negative electrode 108 disposed on the substrate 101, the electron injection layer 107 disposed on the negative electrode 108, the electron transport layer 106 disposed on the electron injection layer 107, the light emitting layer 105 disposed on the electron transport layer 106, the hole transport layer 104 disposed on the light emitting layer 105, the hole injection layer 103 disposed on the hole transport layer 104, and the positive electrode 102 disposed on the hole injection layer 103.

Not all of the above layers are essential. The configuration includes the positive electrode 102, the light emitting layer 105, and the negative electrode 108 as a minimum constituent unit, and optionally includes the hole injection layer 103, the hole transport layer 104, the electron transport layer 106, and the electron injection layer 107. Each of the above layers may be formed of a single layer or a plurality of layers.

A form of layers constituting the organic electroluminescent element may be, in addition to the above configuration form of "substrate/positive electrode/hole injection layer/hole transport layer/light emitting layer/electron transport layer/electron injection layer/negative electrode", a configuration form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic Electroluminescent Element>

The substrate 101 serves as a support of the organic electroluminescent element 100, and usually, quartz, glass, a metal, a plastic, and the like are used. The substrate 101 is formed into a plate shape, a film shape, or a sheet shape according to a purpose, and for example, a glass plate, a metal plate, a metal foil, a plastic film, and a plastic sheet are used therefor. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be sufficient for maintaining mechanical strength. Therefore, the thickness is only required to be 0.2 mm or more, for example. An upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode in Organic Electroluminescent Element>

The positive electrode 102 plays a role of injecting a hole into the light emitting layer 105. Incidentally, in a case where the hole injection layer 103 and/or the hole transport layer 104 are/is disposed between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer including polythiophene such as poly(3-methylthiophene), polypyrrole, and polyaniline. In addition to these compounds, a material can be appropriately selected for use from materials used as a positive electrode of an organic electroluminescent element.

A resistance of a transparent electrode is not limited as long as a sufficient current can be supplied for light emission of a luminescent element. However, a low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of ITO can be arbitrarily selected according to a resistance value, but an ITO having a thickness of 50 to 300 nm is often used.

<Hole Injection Layer and Hole Transport Layer in Organic Electroluminescent Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 into the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron(III) chloride to the hole injection/transport material.

A hole injection/transport substance needs to efficiently inject/transport a hole coming from a positive electrode between electrodes to which an electric field is applied, and desirably has a high hole injection efficiency and transports an injected hole efficiently. For this purpose, a substance which has low ionization potential, large hole mobility, and further has excellent stability, and in which impurities serving as traps are not easily generated at the time of manufacturing and at the time of use, is preferable.

As a material to form the hole injection layer 103 and the hole transport layer 104, a polycyclic aromatic compound represented by the above general formula (1A) or (1B) can be used. Furthermore, any compound can be selected for use from compounds that have been conventionally used as charge transport materials for holes in a photoconductive material, p-type semiconductors, and known compounds used in a hole injection layer and a hole transport layer of an organic electroluminescent element.

Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl) cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-dphenyl-1,1'-diamine, $N^4,N^{4'}$-diphenyl-$N^4,N^{4'}$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4''-tris(3-methylphenyl(phenyl) amino) triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film needed for manufacturing a luminescent element, can inject a hole from a positive electrode, and can transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, literature "M. Pfeiffer, A. Beyer, T. Fritz, K. Leo, Appl. Phys. Lett., 73(22), 3202-3204 (1998" and literature "J. Blochwitz, M. Pheiffer, T. Fritz, K. Leo, Appl. Phys. Lett., 73(6), 729-731 (1998)"). These compounds generate a so-called hole by an electron migrating process in an electron-donating type base substance (hole transport substance). Electroconductivity of the base substance depends on the number and mobility of the holes fairly significantly. As a matrix substance having a hole transporting characteristic, for example, a benzidine derivative (TPD and the like), a starburst amine derivative (TDATA and the like), and a specific metal phthalocyanine (particularly, zinc phthalocyanine (ZnPc) and the like) are known (JP 2005-167175 A).

<Light Emitting Layer in Organic Electroluminescent Element>

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape and exhibits a strong light emission (fluorescence) efficiency in a solid state. In the present invention, as the material for the light emitting layer, the polycyclic aromatic compound represented by the above general formula (1A) or (1B) can be used.

The light emitting layer may be formed of a single layer or a plurality of layers, and each layer is formed of a material for a light emitting layer (a host material and a dopant material). Each of the host material and the dopant material may be formed of a single kind, or a combination of a plurality of kinds. The dopant material may be included in the host material wholly or partially. Regarding a doping method, doping can be performed by a co-deposition method with a host material, or alternatively, a dopant material may be mixed in advance with a host material, and then vapor deposition may be performed simultaneously.

The amount of use of a host material depends on the kind of the host material, and is only required to be determined according to a characteristic of the host material. The reference of the amount of use of a host material is preferably from 50 to 99.999% by weight, more preferably from 80 to 99.95% by weight, and still more preferably from 90 to 99.9% by weight with respect to the total amount of a material for a light emitting layer. The polycyclic aromatic compound represented by the above general formula (1A) or (1B) can also be used as a host material.

The amount of use of a dopant material depends on the kind of the dopant material, and is only required to be determined according to a characteristic of the dopant material. The reference of the amount of use of a dopant is preferably from 0.001 to 50% by weight, more preferably from 0.05 to 20% by weight, and still more preferably from 0.1 to 10% by weight with respect to the total amount of a material for a light emitting layer. The amount of use within the above range is preferable, for example, from a viewpoint of being able to prevent a concentration quenching phenomenon. The polycyclic aromatic compound represented by the above general formula (1A) or (1B) can also be used as a dopant material.

Examples of a host material that can be used in combination with the polycyclic aromatic compound represented by the above general formula (1A) or (1B) include a condensed ring derivative of anthracene, pyrene, or the like that has been conventionally known as a luminous body, a bisstyryl derivative such as a bisstyrylanthracene derivative or a distyrylbenzene derivative, a tetraphenylbutadiene derivative, a cyclopentadiene derivative, a fluorene derivative, and a benzofluorene derivative.

Furthermore, a dopant material that can be used in combination with the polycyclic aromatic compound represented by the above general formula (1A) or (1B) is not particularly limited, and existing compounds can be used. The dopant material can be selected from various materials depending on a desired color of emitted light. Specific examples of the dopant material include a condensed ring derivative of phenanthrene, anthracene, pyrene, tetracene, pentacene, perylene, naphthopyrene, dibenzopyrene, rubrene, chrysene, or the like, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JP 1-245087 A), a bisstyrylarylene derivative (JP 2-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

If the examples are listed for each color of emitted light, examples of blue to bluish green dopant materials include an aromatic hydrocarbon compound such as naphthalene, anthracene, phenanthrene, pyrene, triphenylene, perylene, fluorene, indene, or chrysene, and derivatives thereof, an aromatic heterocyclic compound such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, and derivatives thereof, a distyrylbenzene derivative, a tetraphenylbutadiene derivative, a stilbene derivative, an aldazine derivative, a coumarin derivative, an azole derivative such as imidazole, thiazole, thiadiazole, carbazole, oxazole, oxadiazole, or triazole, and metal complexes thereof, and an aromatic amine derivative represented by N,N'-diphenyl-N,N'-di(3-methylphenyl)-4,4'-diphenyl-1,1'-diamine.

Furthermore, examples of a green to yellow dopant material include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples of the green-yellow dopant material include compounds obtained by introducing a substituent capable of shifting a wavelength to a longer wavelength, such as an aryl, a heteroaryl, an arylvinyl, an amino, or a cyano to the above compounds listed as examples of the blue to bluish green dopant material.

Furthermore, examples of an orange to red dopant material include a naphthalimide derivative such as bis(diisopropylphenyl)perylene tetracarboxylic acid imide, a perinone derivative, a rare earth complex such as a Eu complex containing acetylacetone, benzoylacetone, phenanthroline, or the like as a ligand, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples of the orange to red dopant material include compounds obtained by introducing a substituent capable of shifting a wavelength to a longer wavelength, such as an aryl, a heteroaryl, an arylvinyl, an amino, or a cyano to the above compounds listed as examples of the blue to bluish green and green to yellow dopant materials.

In addition to the above compounds, a dopant can be appropriately selected for use from compounds and the like described in "Kagaku Kogyo (Chemical Industry)", June 2004, p. 13, and reference literatures and the like described therein.

Among the dopant materials described above, an amine having a stilbene structure, a perylene derivative, a borane derivative, an aromatic amine derivative, a coumarin derivative, a pyran derivative, and a pyrene derivative are particularly preferable.

An amine having a stilbene structure is represented by the following formula, for example.

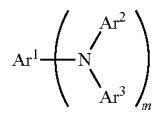

In the formula, $Ar^1$ represents an m-valent group derived from an aryl having 6 to 30 carbon atoms, and $Ar^2$ and $Ar^3$ each independently represent an aryl having 6 to 30 carbon atoms, while at least one of $Ar^1$ to $Ar^3$ has a stilbene structure, $Ar^1$ to $Ar^3$ may be substituted by an aryl, a heteroaryl, an alkyl, a trisubstituted silyl (a silyl trisubstituted by an aryl and/or an alkyl), or a cyano, and m represents an integer of 1 to 4.

The amine having a stilbene structure is more preferably a diaminostilbene represented by the following formula.

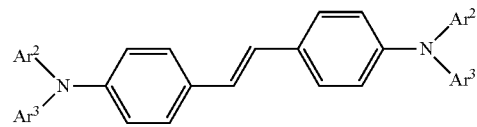

In the formula, $Ar^2$ and $Ar^3$ each independently represent an aryl having 6 to 30 carbon atoms, while $Ar^2$ and $Ar^3$ may be substituted by an aryl, a heteroaryl, an alkyl, a trisubstituted silyl (a silyl trisubstituted by an aryl and/or an alkyl), or a cyano.

Specific examples of the aryl having 6 to 30 carbon atoms include a phenyl, a naphthyl, an acenaphthylenyl, a fluorenyl, a phenalenyl, a phenanthrenyl, an anthryl, a fluoranthenyl, a triphenylenyl, a pyrenyl, a chrysenyl, a naphthacenyl, a perylenyl, a stilbenyl, a distyrylphenyl, a distyrylbiphenylyl, and a distyrylfluorenyl.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis[4"-bis(diphenylamino)styryl]-biphenyl, 1,4-bis[4'-bis (diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Furthermore, amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl) perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Furthermore, perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, JP 2001-217077 A, and the like may also be used.

Examples of the borane derivative include 1,8-diphenyl-10-(dimesitylboryl) anthracene, 9-phenyl-10-(dimesitylboryl) anthracene, 4-(9'-anthryl) dimesitylborylnaphthalene, 4-(10'-phenyl-9'-anthryl) dimesitylborylnaphthalene, 9-(dimesitylboryl) anthracene, 9-(4'-biphenylyl)-10-(dimesitylboryl) anthracene, and 9-(4'-(N-carbazolyl)phenyl)-10-(dimesitylboryl) anthracene.

Furthermore, a borane derivative described in WO 2000/40586 A or the like may also be used.

An aromatic amine derivative is represented by the following formula, for example.

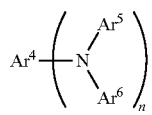

In the formula, $Ar^4$ represents an n-valent group derived from an aryl having 6 to 30 carbon atoms, and $Ar^{5'}$ and $Ar^6$ each independently represent an aryl having 6 to 30 carbon atoms, while $Ar^4$ to $Ar^6$ may be substituted by an aryl, a heteroaryl, an alkyl, a trisubstituted silyl (a silyl trisubstituted by an aryl and/or an alkyl), or a cyano, and n represents an integer of 1 to 4.

Particularly, an aromatic amine derivative in which $Ar^4$ represents a divalent group derived from anthracene, chrysene, fluorene, benzofluorene, or pyrene, $Ar^5$ and $Ar^6$ each independently represent an aryl having 6 to 30 carbon atoms, $Ar^4$ to $Ar^6$ may be substituted by an aryl, a heteroaryl, an alkyl, a trisubstituted silyl (a silyl trisubstituted by an aryl and/or an alkyl), or a cyano, and n represents 2, is more preferable.

Specific examples of the aryl having 6 to 30 carbon atoms include a phenyl, a naphthyl, an acenaphthylenyl, a fluorenyl, a phenalenyl, a phenanthrenyl, an anthryl, a fluoranthenyl, a triphenylenyl, a pyrenyl, a chrysenyl, naphthacenyl, a perylenyl, and a pentacenyl.

Examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra(m-tolyl)chrysene-6,12-diamine, N,N,N',N'-tetrakis(4-isopropylphenyl)chrysene-6,12-diamine, N,N,N',N'-tetra(naphthalen-2-yl)chrysene-6,12-dimine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Furthermore, examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1,N^6$-diphenyl-$N^1,N^6$-bis(4-trimethylsilanyl-phenyl)-1H,8H-pyrene-1,6-diamine.

Furthermore, examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl)anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylaminophenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl)anthracene.

Furthermore, examples thereof further include [4-(4-diphenylamino-phenyl)naphthalen-1-yl]-diphenylamine, [6-(4-diphenylamino-phenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, and 4,4"-bis[6-diphenylaminonaphthalen-2-yl]-p-terphenyl.

Furthermore, an aromatic amine derivative described in JP 2006-156888 A or the like may also be used.

Examples of the coumarin derivative include coumarin-6 and coumarin-334.

Furthermore, a coumarin derivative described in JP 2004-43646 A, JP 2001-76876 A, JP 6-298758 A, or the like may also be used.

Examples of the pyran derivative include DCM and DCJTB described below.

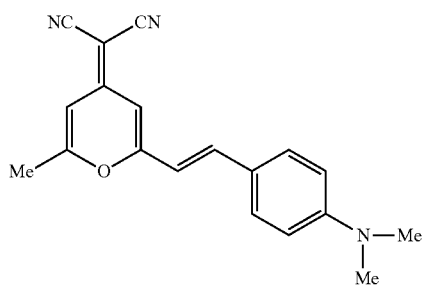

DCM

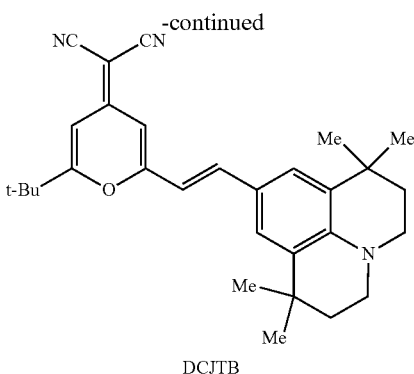

DCJTB

Furthermore, a pyran derivative described in JP 2005-126399 A, JP 2005-097283 A, JP 2002-234892 A, JP 2001-220577 A, JP 2001-081090 A, JP 2001-052869 A, or the like may also be used.

<Electron Injection Layer and Electron Transport Layer in Organic Electroluminescent Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108 or an electron injected from the negative electrode 108 through the electron injection layer 107 into the light emitting layer 105. The electron transport layer 106 and the electron injection layer 107 are each formed by laminating and mixing one or more kinds of electron transport/injection materials, or by a mixture of an electron transport/injection material and a polymer binder.

The electron injection/transport layer manages injection of an electron from a negative electrode and further manages transport of an electron, and desirably has a high electron injection efficiency and can efficiently transport an injected electron. For this purpose, a substance which has high electron affinity and large electron mobility, and further has excellent stability, and in which impurities serving as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transport ability is not so high, the electron injection/transport layer has an effect of enhancing a light emission efficiency equally to a material having high electron transport ability. Therefore, the electron injection/transport layer in the present embodiment may also include a function of a layer capable of efficiently preventing migration of a hole.

As a material to form the electron transport layer 106 or the electron injection layer 107 (electron transport material), the polycyclic aromatic compound represented by the above general formula (1A) or (1B) can be used. Furthermore, the material can be arbitrarily selected for use from compounds that have been conventionally used as electron transfer compounds in a photoconductive material, and known compounds used in an electron injection layer and an electron transport layer of an organic electroluminescent element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a condensed ring derivative thereof, and a metal complex having an electron-accepting nitrogen atom. Specific examples of the material include a condensed ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can be also used, and examples thereof include a quinolinol-based metal complex, a hydroxyazole complex such as a hydroxyphenyloxazole complex, an azomethine complex, a tropolone metal complex, a flavonol metal complex, and a benzoquinoline metal complex.

The materials described above are used singly, but may also be used in a mixture with other materials.

Among the materials described above, a quinolinol-based metal complex, a bipyridine derivative, a phenanthroline derivative, and a borane derivative are preferable.

The quinolinol-based metal complex is a compound represented by the following general formula (E-1).

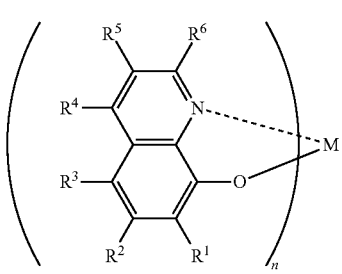

(E-1)

In the formula, $R^1$ to $R^6$ each independently represent a hydrogen atom, a fluorine atom, an alkyl, an aralkyl, an alkenyl, a cyano, an alkoxy, or an aryl, M represents Li, Al, Ga, Be, or Zn, and n represents an integer of 1 to 3.

Specific examples of the quinolinol-based metal complex include 8-quinolinollithium, tris(8-quinolinolato) aluminum, tris(4-methyl-8-quinolinolato)aluminum, tris(5-methyl-8-quinolinolato)aluminum, tris(3,4-dimethyl-8-quiolinolato)aluminum, tris(4,5-dimethyl-8-quinolinolato) aluminum, tris(4,6-dimethyl-8-quinolinolato)aluminum, bis (2-methyl-8-quinolinolato)(phenolato)aluminum, bis(2-methyl-8-quinolinolato)(2-methylphenolato)aluminum, bis (2-methyl-8-quinolinolato)(3-methylphenolato)aluminum, bis(2-methyl-8-quinolinolato)(4-methylphenolato)aluminum, bis(2-methyl-8-quinolinolato)(2-phenylphenolato)aluminum, bis(2-methyl-8-quinolinolato)(3-phenylphenolato) aluminum, bis(2-methyl-8-quinolinolato)(4-phenylphenolato)aluminum, bis(2-methyl-8-quinolinolato) (2,3-dimethylphenolato)aluminum, bis(2-methyl-8-quinolinolato)(2,6-dimethylphenolato)aluminum, bis(2-methyl-8-quinolinolato)(3,4-dimethylphenolato)aluminum, bis(2-methyl-8-quinolinolato)(3,5-dimethylphenolato)aluminum, bis(2-methyl-8-quinolinolato)(3,5-di-t-butylphenolato)aluminum, bis(2-methyl-8-quinolinolato)(2,6-diphenylphenolato)aluminum, bis(2-methyl-8-quinolinolato)(2,4, 6-triphenylphenolato)aluminum, bis(2-methyl-8-quinolinolato)(2,4,6-trimethylphenolato)aluminum, bis(2-methyl-8-quinolinolato)(2,4,5,6-tetramethylphenolato) aluminum, bis(2-methyl-8-quinolinolato)(1-naphtholato) aluminum, bis(2-methyl-8-quinolinolato)(2-naphtholato) aluminum, bis(2,4-dimethyl-8-quinolinolato)(2-phenylphenolato)aluminum, bis(2,4-dimethyl-8-quinolinolato)(3-phenylphenolato)aluminum, bis(2,4-dimethyl-8-quinolinolato)(4-phenylphenolato)aluminum, bis(2,4-dimethyl-8-quinolinolato)(3,5-dimethylphenolato) aluminum, bis(2,4-dimethyl-8-quinolinolato)(3,5-di-t-butylphenolato)aluminum, bis(2-methyl-8-quinolinolato)aluminum-µ-oxo-bis(2-methyl-8-quinolinolato)aluminum, bis(2, 4-dimethyl-8-quinolinolato)aluminum-µ-oxo-bis(2,4-dimethyl-8-quinolinolato)aluminum, bis(2-methyl-4-ethyl-8-quinolinolato)aluminum-µ-oxo-bis(2-methyl-4-ethyl-8-quinolinolato)aluminum, bis(2-methyl-4-methoxy-8-quinolinolato)aluminum-µ-oxo-bis(2-methyl-4-methoxy-8-quinolinolato)aluminum, bis(2-methyl-5-cyano-8-quinolinolato)aluminum-µ-oxo-bis(2-methyl-5-cyano-8-quinolinolato)aluminum, bis(2-methyl-5-trifluoromethyl-8-quinolinolato)aluminum-µ-oxo-bis(2-methyl-5-trifluoromethyl-8-quiolinolato)aluminum, and bis(10-hydroxybenzo[h]quinoline)beryllium.

The bipyridine derivative is a compound represented by the following general formula (E-2).

(E-2)

In the formula, G represents a simple bond or an n-valent linking group, and n represents an integer of 2 to 8. A carbon not used for a pyridine-pyridine bond or a pyridine-G bond may be substituted by an aryl, a heteroaryl, an alkyl, or a cyano.

Examples of G in general formula (E-2) include groups represented by the following structural formulas. Note that R's in the following structural formulas each independently represent a hydrogen atom, a methyl, an ethyl, an isopropyl, a cyclohexyl, a phenyl, a 1-naphthyl, a 2-naphthyl, a biphenylyl, or a terphenylyl.

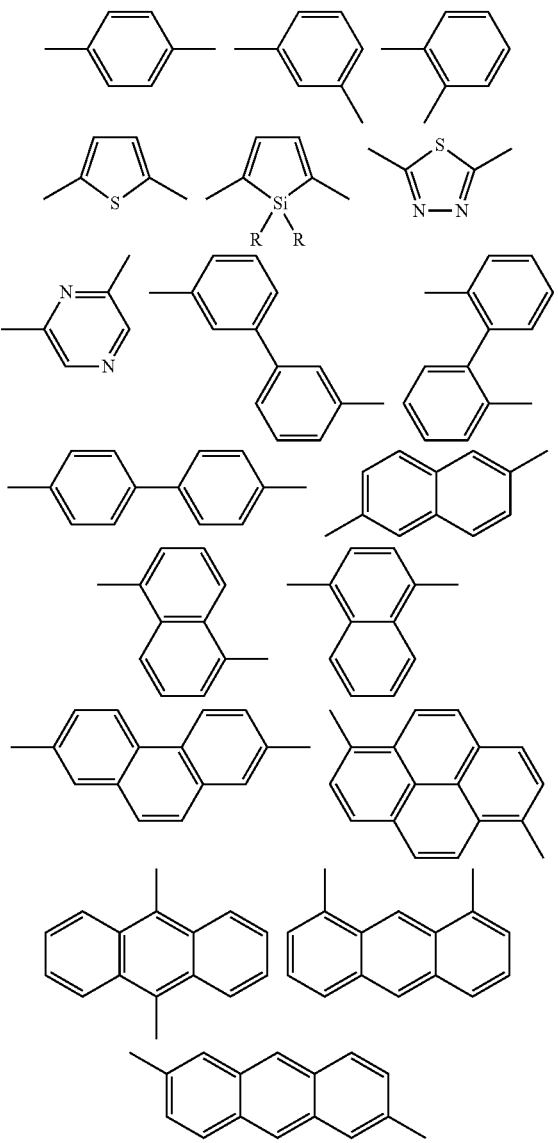

-continued

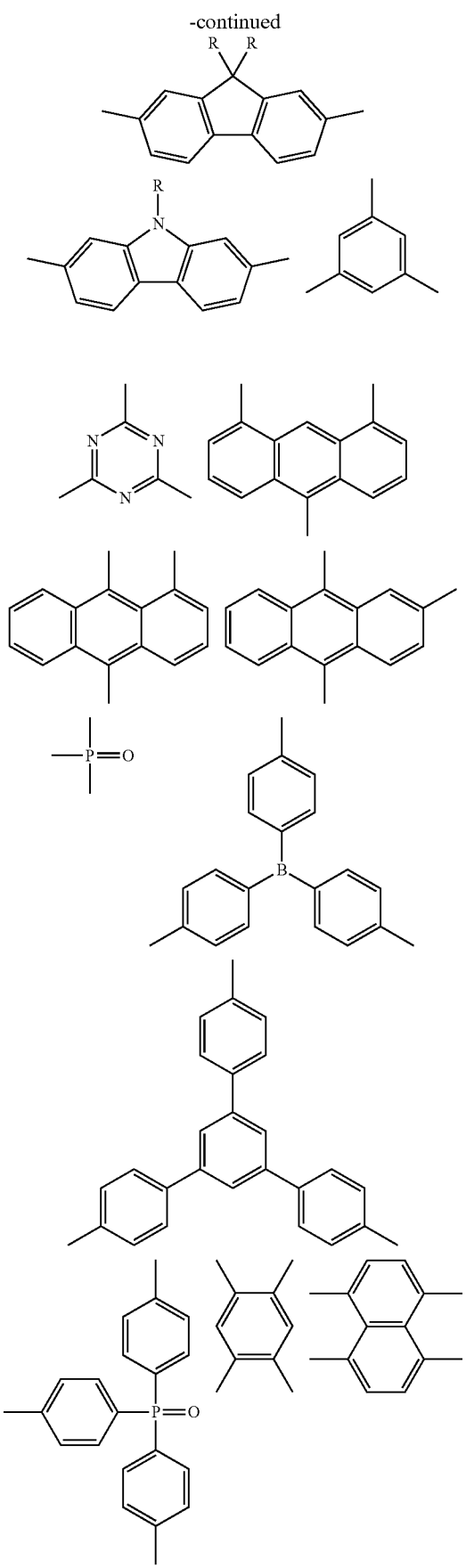

-continued

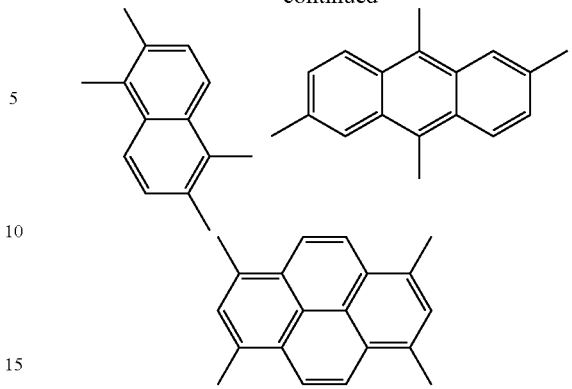

Specific examples of the pyridine derivative include 2,5-bis(2,2'-pyridin-6-yl)-1,1-dimethyl-3,4-diphenylsilole, 2,5-bis(2,2'-pyridin-6-yl)-1,1-dimethyl-3,4-dimesitylsilole, 2,5-bis(2,2'-pyridin-5-yl)-1,1-dimethyl-3,4-diphenylsilole, 2,5-bis(2,2'-pyridin-5-yl)-1,1-dimethyl-3,4-dimesitylsilole, 9,10-di(2,2'-pyridin-6-yl)anthracene, 9,10-di(2,2'-pyridin-5-yl)anthracene, 9,10-di(2,3'-pyridin-6-yl)anthracene, 9,10-di(2,3'-pyridin-5-yl)anthracene, 9,10-di(2,3'-pyridin-6-yl)-2-phenylanthracene, 9,10-di(2,3'-pyridin-5-yl)-2-phenylanthracene, 9,10-di(2,2'-pyridin-6-yl)-2-phenylanthracene, 9,10-di(2,2'-pyridin-5-yl)-2-phenylanthracene, 9,10-di(2,4'-pyridin-6-yl)-2-phenylanthracene, 9,10-di(2,4'-pyridin-5-yl)-2-phenylanthracene, 9,10-di(3,4'-pyridin-6-yl)-2-phenylanthracene, 9,10-di(3,4'-pyridin-5-yl)-2-phenylanthracene, 3,4-diphenyl-2,5-di(2,2'-pyridin-6-yl)thiophene, 3,4-diphenyl-2,5-di(2,3'-pyridin-5-yl)thiophene, and 6',6"-di(2-pyridyl)-2,2':4',4":2",2"'-quaterpyridine.

The phenanthroline derivative is a compound represented by the following general formula (E-3-1) or (E-3-2).

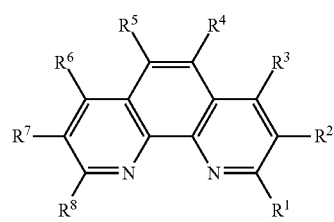

(E-3-1)

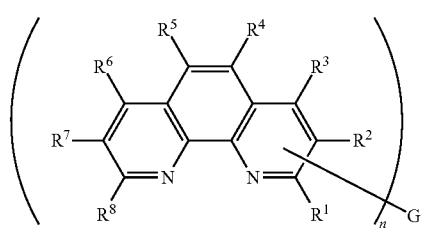

(E-3-2)

In the formula, $R^1$ to $R^8$ each independently represent a hydrogen atom, an alkyl (a methyl, an ethyl, an isopropyl, a hydroxyethyl, a methoxymethyl, a trifluoromethyl, a t-butyl, a cyclopentyl, a cyclohexyl, a benzyl, or the like), an alkyloxy (a methoxy, an ethoxy, an isopropoxy, a butoxy, or the like), an aryloxy (a phenoxy, a 1-naphthyloxy, a 4-tolyloxy, or the like), a halogen atom (a fluorine atom, a chlorine atom, a bromine atom, an iodine atom, or the like), an aryl (a phenyl, a naphthyl, a p-tolyl, a p-chlorophenyl, or the like), an alkylthio (a methylthio, an ethylthio, an isopropylthio, or the like), an arylthio (a phenylthio or the like), a cyano, a nitro, and a heterocyclic ring (a pyrrole, a pyrrolidyl, a pyrazolyl, an imidazolyl, a pyridyl, a benzimidazolyl, a benzthiazolyl, a benzoxazolyl, or the like). An alkyl or a halogen atom is preferable. A methyl, an ethyl, an isopropyl, or a fluorine atom is more preferable. Adjacent groups may be bonded to each other to form a condensed ring. G represents a simple bond or an n-valent linking group, and n represents an integer of 2 to 8. Examples of G of general formula (E-3-2) include the same groups as those described in the section of the bipyridine derivative.

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bi(1,10-phenanthrolin-5-yl), bathocuproine, and 1,3-bis(2-phenyl-1,10-phenanthrolin-9-yl)benzene.

Particularly, a case of using a phenanthroline derivative in an electron transport layer or an electron injection layer will be described. In order to obtain stable light emission over a long time, a material having excellent thermal stability or thin film formability is desired. Among phenanthroline derivatives, a phenanthroline derivative in which a substituent itself has a three-dimensional steric structure, a phenanthroline derivative having a three-dimensional steric structure as a result of steric repulsion between a substituent and a phenanthroline skeleton or between a substituent and an adjacent substituent, or a phenanthroline derivative having a plurality of phenanthroline skeletons linked together, is preferable. Furthermore, in a case of linking a plurality of phenanthroline skeletons, a compound containing a conjugated bond, a substituted or unsubstituted aromatic hydrocarbon, or a substituted or unsubstituted heterocyclic aromatic ring in a linked unit, is more preferable.

The borane derivative is a compound represented by the following general formula (E-4), specific examples of which are disclosed in JP 2007-27587 A.

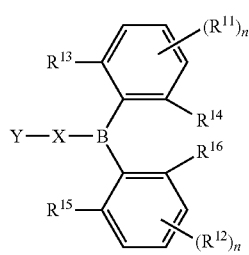

(E-4)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. Examples of a substituent in a case of being "optionally substituted" or "substituted" include an aryl, a heteroaryl, and an alkyl.

Among compounds represented by the above general formula (E-4), a compound represented by the following general formula (E-4-1) is preferable, and compounds represented by the following general formulas (E-4-1-1) to (E-4-1-4) are more preferable. Specific examples of the compounds include 9-[4-(4-dimesitylborylnaphthalen-1-yl)phenyl]carbazole and 9-[4-(4-dimesitylborylnaphthalen-1-yl)naphthalen-1-yl]carbazole.

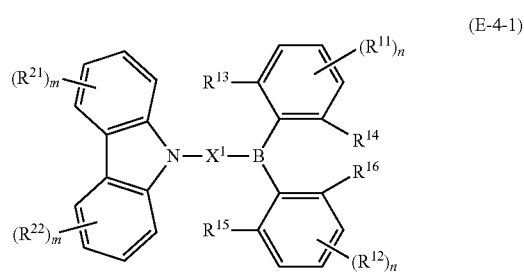

(E-4-1)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and a cyano, $X^1$ represents an optionally substituted arylene having 20 or fewer carbon atoms, n's each independently represent an integer of 0 to 3, and m's each independently represent an integer of 0 to 4. Examples of a substituent in a case of being "optionally substituted" or "substituted" include an aryl, a heteroaryl, and an alkyl.

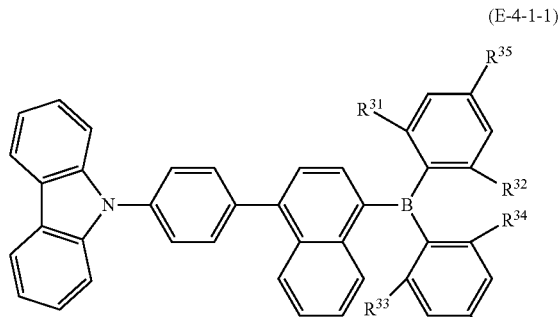

(E-4-1-1)

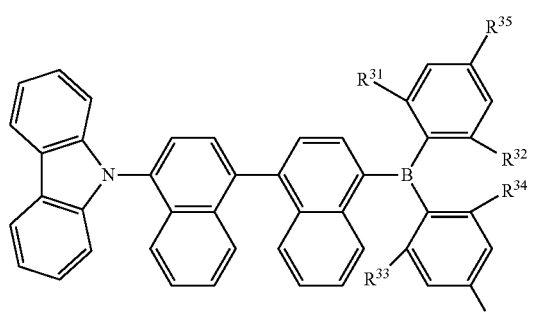

(E-4-1-2)

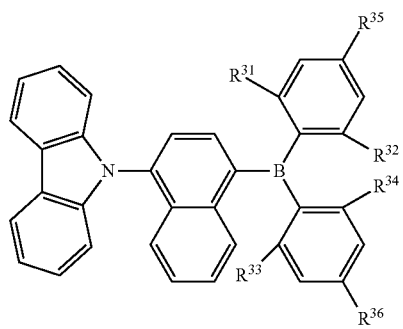

(E-4-1-3)

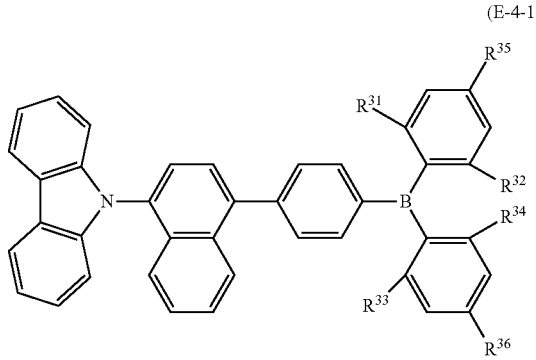

(E-4-1-4)

In each of the formulas, R³¹ to R³⁴ each independently represent any one of a methyl, an isopropyl, and a phenyl, and R³⁵ and R³⁶ each independently represent any one of a hydrogen atom, a methyl, an isopropyl, and a phenyl.

Among compounds represented by the above general formula (E-4), a compound represented by the following general formula (E-4-2) is preferable, and a compound represented by the following general formula (E-4-2-1) is more preferable.

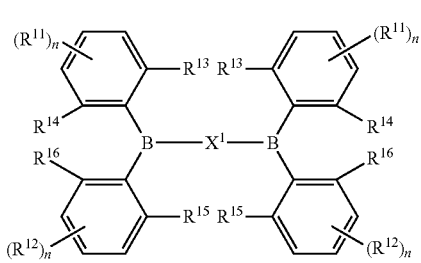

(E-4-2)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 20 or fewer carbon atoms, and n's each independently represent an integer of 0 to 3. Examples of a substituent in a case of being "optionally substituted" or "substituted" include an aryl, a heteroaryl, and an alkyl.

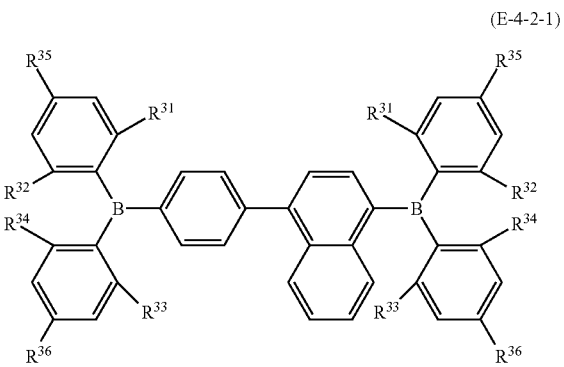

(E-4-2-1)

In the formula, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

Among compounds represented by the above general formula (E-4), a compound represented by the following general formula (E-4-3) is preferable, and a compound represented by the following general formula (E-4-3-1) or (E-4-3-2) is more preferable.

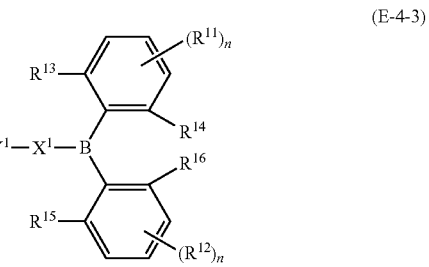

(E-4-3)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 10 or fewer carbon atoms, $Y^1$ represents an optionally substituted aryl having 14 or fewer carbon atoms, and n's each independently represent an integer of 0 to 3. Examples of a substituent in a case of being "optionally substituted" or "substituted" include an aryl, a heteroaryl, and an alkyl.

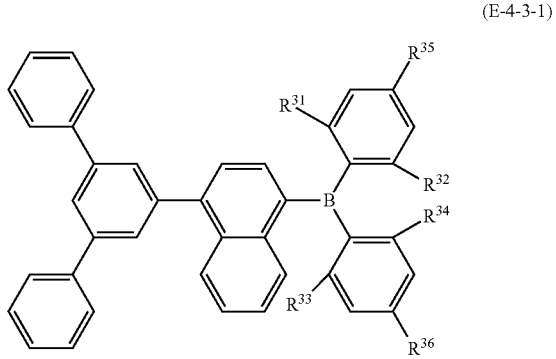

(E-4-3-1)

-continued

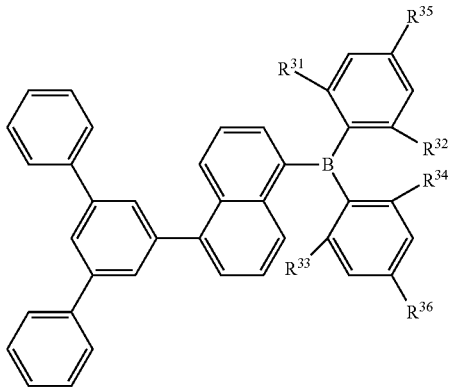

(E-4-3-2)

In each of the formulas, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

The benzimidazole derivative is a compound represented by the following general formula (E-5).

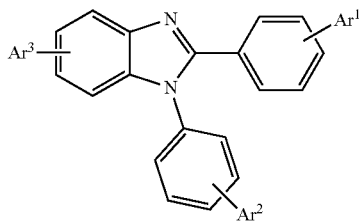

(E-5)

In the formula, $Ar^1$ to $Ar^a$ each independently represent a hydrogen atom or an optionally substituted aryl having 6 to 30 carbon atoms. Examples of a substituent in a case of being "optionally substituted" include an aryl, a heteroaryl, an alkyl, and a cyano. Particularly, a benzimidazole derivative in which $Ar^1$ is an anthryl optionally substituted by an aryl, a heteroaryl, an alkyl, or a cyano is preferable.

Specific examples of the aryl having 6 to 30 carbon atoms include a phenyl, a 1-naphthyl, a 2-naphthyl, an acenaphthylen-1-yl, an acenaphthylen-3-yl, an acenaphthylen-4-yl, an acenaphthylen-5-yl, a fluoren-1-yl, a fluoren-2-yl, a fluoren-3-yl, a fluoren-4-yl, a fluoren-9-yl, a phenalen-1-yl, a phenalen-2-yl, a 1-phenanthryl, a 2-phenanthryl, a 3-phenanthryl, a 4-phenanthryl, a 9-phenanthryl, a 1-anthryl, a 2-anthryl, a 9-anthryl, a fluoranthen-1-yl, a fluoranthen-2-yl, a fluoranthen-3-yl, a fluoranthen-7-yl, a fluoranthen-8-yl, a triphenylen-1-yl, a triphenylen-2-yl, a pyren-1-yl, a pyren-2-yl, a pyren-4-yl, a chrysen-1-yl, a chrysen-2-yl, a chrysen-3-yl, a chrysen-4-yl, a chrysen-5-yl, a chrysen-6-yl, a naphthacen-1-yl, a naphthacen-2-yl, a naphthacen-5-yl, a perylen-1-yl, a perylen-2-yl, a perylen-3-yl, a pentacen-1-yl, a pentacen-2-yl, a pentacen-5-yl, and a pentacen-6-yl.

Specific examples of the benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

The electron transport layer or the electron injection layer may further contain a substance capable of reducing a material to form the electron transport layer or the electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include alkali metals such as Na (work function 2.36 eV), K (work function 2.28 eV), Rb (work function 2.16 eV), and Cs (work function 1.95 eV); and alkaline earth metals such as Ca (work function 2.9 eV), Sr (work function 2.0 to 2.5 eV), and Ba (work function 2.52 eV). A reducing substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

<Negative Electrode in Organic Electroluminescent Element>

The negative electrode 108 plays a role of injecting an electron into the light emitting layer 105 through the electron injection layer 107 and the electron transport layer 106.

A material to form the negative electrode 108 is not particularly limited as long as being a substance capable of efficiently injecting an electron into an organic layer. However, a material similar to the materials to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and alloys thereof (a magnesium-silver alloy, a magnesium-indium alloy, an aluminum-lithium alloy such as lithium fluoride/aluminum, and the like) are preferable. In order to enhance element characteristics by increasing an electron injection efficiency, lithium, sodium, potassium, cesium, calcium, magnesium, or an alloy containing these low work function metals is effective. However, many of these low work function-metals are generally unstable in air. In order to ameliorate this problem, for example, a method using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. A method for manufacturing these electrodes is not particularly limited as long as being able to obtain conduction, such as resistance heating, electron beam deposition, sputtering, ion plating, or coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin, as a polymer binder.

<Method for Manufacturing Organic Electroluminescent Element>

Each layer constituting an organic electroluminescent element can be formed by forming thin films of materials to constitute each layer by a method such as a vapor deposition method, resistance heating vapor deposition, electron beam vapor deposition, sputtering, a molecular lamination method, a printing method, a spin coating method, a casting method, or a coating method. The film thickness of each layer thus formed is not particularly limited, and can be appropriately set according to a property of a material, but is usually within a range of 2 nm to 5000 nm. The film thickness can be usually measured using a crystal oscillation type film thickness measuring apparatus or the like. In a case of forming a thin film using a vapor deposition method, vapor deposition conditions depend on the kind of a material, an intended crystal structure of a film, an association structure, and the like. It is preferable to appropriately set the vapor deposition conditions generally in ranges of a vapor deposition crucible heating temperature of +50 to +400° C., a degree of vacuum of $10^{-6}$ to $10^{-3}$ Pa, a vapor deposition rate of 0.01 to 50 nm/sec, a substrate temperature of −150 to +300° C., and a film thickness of 2 nm to 5 μm.

Next, as an example of a method for manufacturing an organic electroluminescent element, a method for manufacturing an organic electroluminescent element formed of positive electrode/hole injection layer/hole transport layer/light emitting layer including host material and dopant material/electron transport layer/electron injection layer/negative electrode will be described. A thin film of a positive electrode material is formed on an appropriate substrate by a vapor deposition method or the like to manufacture a positive electrode, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is further formed by a vapor deposition method or the like to obtain a negative electrode. An intended organic electroluminescent element is thereby obtained. Incidentally, in manufacturing the above organic electroluminescent element, it is also possible to manufacture the element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic electroluminescent element thus obtained, it is only required to apply the voltage by using a positive electrode as a positive polarity and using a negative electrode as a negative polarity. By applying a voltage of about 2 to 40 V, light emission can be observed from a transparent or semi-transparent electrode side (the positive electrode or the negative electrode, or both the electrodes). This organic electroluminescent element also emits light also in a case where a pulse current or an alternating current is applied. Note that a waveform of an alternating current applied may be any waveform.

Application Examples of Organic Electroluminescent Element

The present invention can be also applied to a display apparatus including an organic electroluminescent element, a lighting apparatus including an organic electroluminescent element, or the like.

The display apparatus or lighting apparatus including an organic electroluminescent element can be manufactured by a known method such as connecting the organic electroluminescent element according to the present embodiment to a known driving apparatus, and can be driven by appropriately using a known driving method such as direct driving, pulse driving, or alternating driving.

Examples of the display apparatus include a panel display such as a color flat panel display; and a flexible display such as a flexible color organic electroluminescent (EL) display (see, for example, JP 10-335066 A, JP 2003-321546 A, and JP 2004-281086 A). Examples of a display method of the display include a matrix method and/or a segment method. Note that the matrix display and the segment display may co-exist in the same panel.

The matrix refers to a system in which pixels for display are arranged two-dimensionally as in a lattice form or a mosaic form, and characters or images are displayed by an assembly of pixels. The shape or size of the pixel depends on intended use. For example, for display of images and characters of a personal computer, a monitor, or a television, square pixels each having a size of 300 μm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green, and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method and the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-A). The backlight is mainly used for enhancing visibility of a display apparatus that is not self-luminous, and is used in a liquid crystal display apparatus, a timepiece, an audio apparatus, an automotive panel, a display panel, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

4. Other Organic Devices

The polycyclic aromatic compound according to the present invention can be used for manufacturing an organic field effect transistor, an organic thin film solar cell, or the like, in addition to the organic electroluminescent element described above.

The organic field effect transistor is a transistor that controls a current by means of an electric field generated by voltage input, and is provided with a source electrode, a drain electrode, and a gate electrode. When a voltage is applied to the gate electrode, an electric field is generated, and the organic field effect transistor can control a current by arbitrarily damming a flow of electrons (or holes) flowing between the source electrode and the drain electrode. The field effect transistor can be easily miniaturized compared with a simple transistor (bipolar transistor), and is often used as an element constituting an integrated circuit or the like.

The structure of the organic field effect transistor is usually as follows. That is, a source electrode and a drain electrode are provided in contact with an organic semiconductor active layer formed using the polycyclic aromatic compound according to the present invention, and it is only required to further provide a gate electrode so as to interpose an insulating layer (dielectric layer) in contact with the organic semiconductor active layer. Examples of the element structure include the following structures.

(1) Substrate/gate electrode/insulator layer/source electrode and drain electrode/organic semiconductor active layer (2) Substrate/gate electrode/insulator layer/organic semiconductor active layer/source electrode and drain electrode (3) Substrate/organic semiconductor active layer/source electrode and drain electrode/insulator layer/gate electrode (4) Substrate/source electrode and drain electrode/organic semiconductor active layer/insulator layer/gate electrode An organic field effect transistor thus configured can be applied as a pixel driving switching element of an active matrix driving type liquid crystal display or an organic electroluminescent display, or the like.

An organic thin film solar cell has a structure in which a positive electrode such as ITO, a hole transport layer, a photoelectric conversion layer, an electron transport layer, and a negative electrode are laminated on a transparent substrate of glass or the like. The photoelectric conversion layer has a p-type semiconductor layer on the positive electrode side, and has an n-type semiconductor layer on the negative electrode side. The polycyclic aromatic compound according to the present invention can be used as a material for a hole transport layer, a p-type semiconductor layer, an n-type semiconductor layer, or an electron transport layer depending on physical properties thereof. The polycyclic aromatic compound according to the present invention can function as a hole transport material or an electron transport material in an organic thin film solar cell. The organic thin film solar cell may appropriately include a hole blocking layer, an electron blocking layer, an electron injection layer, a hole injection layer, a smoothing layer, and the like, in addition to the members described above. For the organic thin film solar cell, known materials used for an organic thin film solar cell can be appropriately selected and used in combination.

EXAMPLES

Hereinafter, the present invention will be described more specifically by way of Examples, but the present invention is not limited thereto. First, a synthesis example of a polycyclic aromatic compound will be described below.

Synthesis Example (1)

Synthesis of compound of formula (1A-1): 16,16, 19,19-tetramethyl-$N^2,N^2,N^{14},N^{14}$-tetraphenyl-16,19-dihydro-6,10-dioxa-17b-boraindeno[1,2-b]indeno[1', 2':6,7]naphtho[1,2,3-fg]anthracene-2,14-diamine

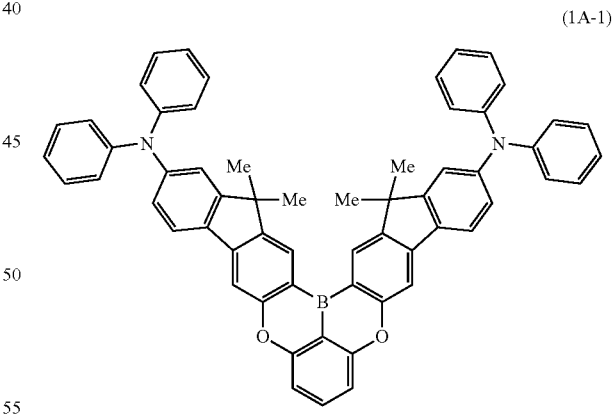

(1A-1)

Synthesis of Methyl 4-methoxy-2-(((trifluoromethyl) sulfonyl) oxy) benzoate

In a nitrogen atmosphere, a flask containing methyl 4-methoxysalicylate (50.0 g) and pyridine (dehydrated) (350 ml) was cooled in an ice bath. Subsequently, trifluoromethanesulfonic anhydride (154.9 g) was added dropwise to this solution. After completion of the dropwise addition, the ice bath was removed, the solution was stirred at room temperature for two hours, and water was added thereto to stop the reaction. Toluene was added thereto, and the solution was partitioned. Thereafter, purification by silica gel short pass column chromatography (eluent:toluene) was performed to obtain methyl 4-methoxy-2-(((trifluoromethyl) sulfonyl) oxy) benzoate (86.0 g).

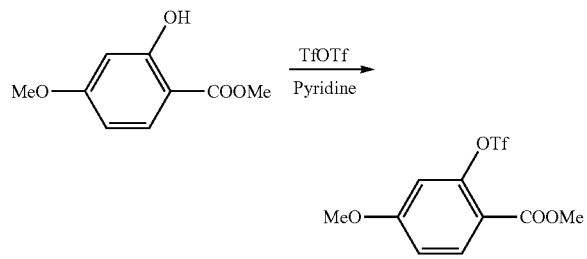

Synthesis of Methyl 4'-(diphenylamino)-5-methoxy-[1,1'-biphenyl]-2-carboxylate In a nitrogen atmosphere, Pd(PPh$_3$)$_4$ (2.5 g) was added to a suspension solution of methyl 4-methoxy-2-(((trifluoromethyl) sulfonyl) oxy) benzoate (23.0 g), (4-(diphenylamino) phenyl) boronic acid (25.4 g), tripotassium phosphate (31.1 g), toluene (184 ml), ethanol (27.6 ml), and water (27.6 ml), and the resulting mixture was stirred at a reflux temperature for three hours. The reaction liquid was cooled to room temperature, water and toluene were added thereto, and the solution was partitioned. The solvent of the organic layer was distilled off under reduced pressure. The obtained solid was purified by silica gel column chromatography (eluent: mixed solvent of heptane/toluene) to obtain methyl 4'-(diphenylamino)-5-methoxy-[1,1'-biphenyl]-2-carboxylate (29.7 g). In this case, referring to the method described on page 94 of "Guide To Organic Chemistry Experiment (1)-Substance Handling Method and Separation and Purification Method", Kagaku-Dojin Publishing Company, INC., the proportion of toluene in the eluent was gradually increased, and a desired product was thereby eluted.

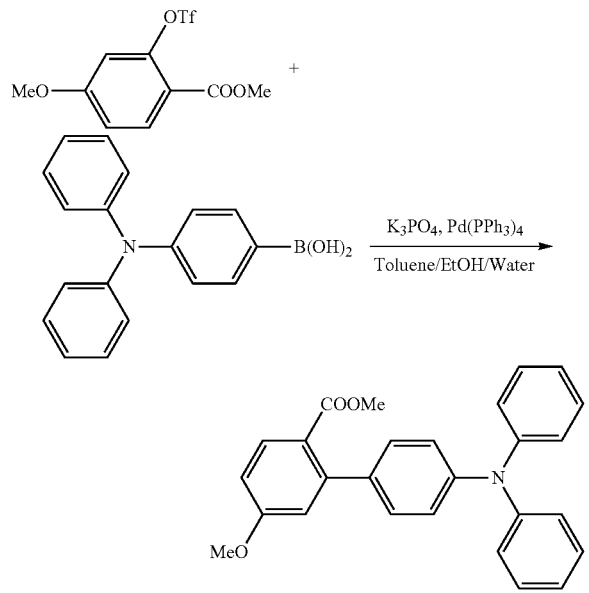

Synthesis of 2-(5'-(diphenylamino)-5-methoxy-[1,1'-biphenyl]-2-yl) propan-2-ol In a nitrogen atmosphere, a THF (111.4 ml) solution having methyl 4'-(diphenylamino)-5-methoxy-[1,1'-biphenyl]-2-carboxylate (11.4 g) dissolved therein was cooled in a water bath. To the solution, a methyl magnesium bromide THF solution (1.0 M, 295 ml) was added dropwise. After completion of the dropwise addition, the water bath was removed, the temperature of the solution was raised to a reflux temperature, and the solution was stirred for four hours. Thereafter, the solution was cooled in an ice bath, an ammonium chloride aqueous solution was added thereto to stop the reaction, ethyl acetate was added thereto, and the solution was partitioned. Thereafter, the solvent was distilled off under reduced pressure. The obtained solid was purified by silica gel column chromatography (eluent: toluene) to obtain 2-(5'-(diphenylamino)-5-methoxy-[1,1'-biphenyl]-2-yl) propan-2-ol (8.3 g).

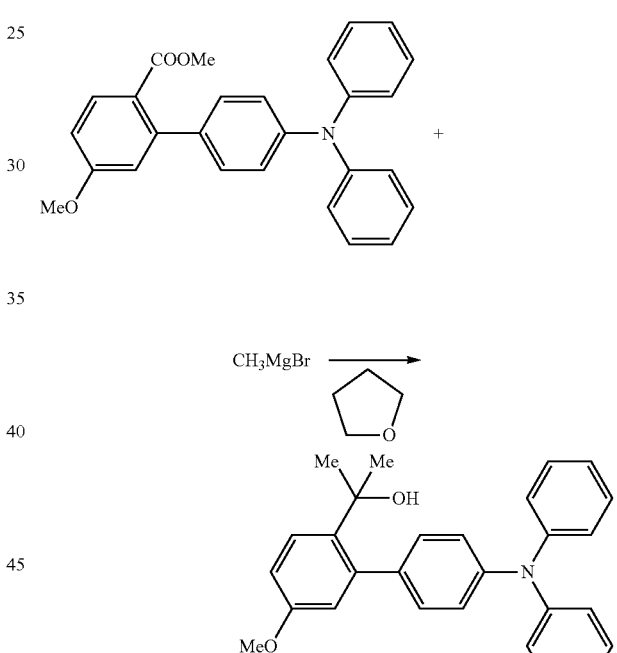

Synthesis of 6-methoxy-9,9'-dimethyl-N,N-diphenyl-9H-fluoren-2-amine

In a nitrogen atmosphere, a flask containing 2-(5'-(diphenylamino)-5-methoxy-[1,1'-biphenyl]-2-yl) propan-2-ol (27.0 g), TAYCACURE-15 (13.5 g), and toluene (162 ml) was stirred at a reflux temperature for two hours. The reaction liquid was cooled to room temperature and caused to pass through a silica gel short pass column (eluent: toluene) to remove TAYCACURE-15. Thereafter, the solvent was distilled off under reduced pressure to obtain 6-methoxy-9,9'-dimethyl-N,N-diphenyl-9H-fluoren-2-amine (25.8 g).

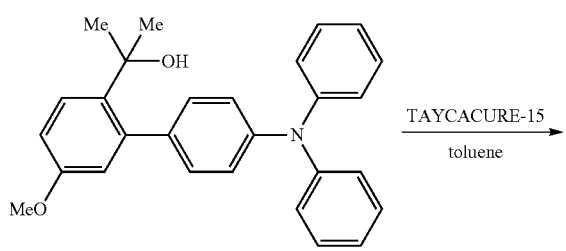

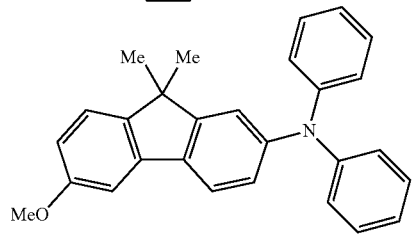

Synthesis of 7-(diphenylamino)-9,9'-dimethyl-9H-fluoren-3-ol

In a nitrogen atmosphere, a flask containing 6-methoxy-9,9'-dimethyl-N,N-diphenyl-9H-fluoren-2-amine (25.0 g), pyridine hydrochloride (36.9 g), and N-methyl-2-pyrrolidone (NMP) (22.5 ml) was stirred at a reflux temperature for six hours. The reaction liquid was cooled to room temperature, water and ethyl acetate were added thereto, and the solution was partitioned. The solvent was distilled off under reduced pressure. Thereafter, the residue was purified by silica gel column chromatography (eluent:toluene) to obtain 7-(diphenylamino)-9,9'-dimethyl-9H-fluoren-3-ol (22.0 g).

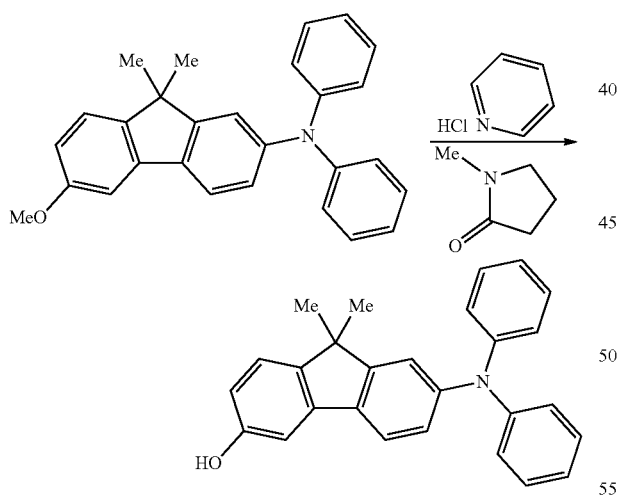

Synthesis of 6,6'-((2-bromo-1,3-phenylene) bis(oxy)) bis(9,9-dimethyl-N,N-diphenyl-9H-fluoren-2-amine)

In a nitrogen atmosphere, a flask containing 7-(diphenylamino)-9,9'-dimethyl-9H-fluoren-3-ol (14.1 g), 2-bromo-1,3-difluorobenzene (3.6 g), potassium carbonate (12.9 g), and NMP (30 ml) was heated and stirred at a reflux temperature for five hours. After the reaction was stopped, the reaction liquid was cooled to room temperature, and water was added thereto. A precipitate precipitated was collected by suction filtration. The obtained precipitate was washed with water and then with methanol and then purified by silica gel column chromatography (eluent:heptane/toluene mixed solvent) to obtain 6,6'-((2-bromo-1,3-phenylene) bis(oxy)) bis(9,9-dimethyl-N,N-diphenyl-9H-fluoren-2-amine) (12.6 g). At this time, the proportion of toluene in the eluent was gradually increased, and a desired product was thereby eluted.

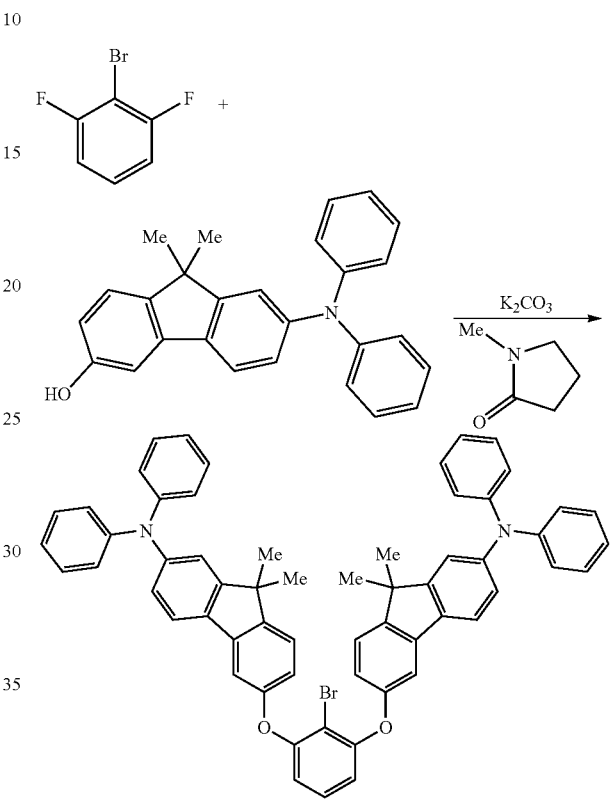

Synthesis of Compound of Formula (1A-1)

In a nitrogen atmosphere, a flask containing 6,6'-((2-bromo-1,3-phenylene) bis(oxy)) bis(9,9-dimethyl-N,N-diphenyl-9H-fluoren-2-amine) (11.0 g) and xylene (60.5 ml) was cooled to −40° C., and a 2.6 M n-butyllithium hexane solution (5.1 ml) was added dropwise thereto. After completion of the dropwise addition, the solution was stirred at this temperature for 0.5 hours. Thereafter, the temperature of the solution was raised to 60° C., and the solution was stirred for three hours. Thereafter, the reaction liquid was depressurized to distill off a component having a low boiling point. Thereafter, the residue was cooled to −40° C., and boron tribromide (4.3 g) was added thereto. The temperature of the solution was raised to room temperature, and the solution was stirred for 0.5 hours. Thereafter, the solution was cooled to 0° C., N-ethyl-N-isopropylpropan-2-amine (3.8 g) was added thereto, and the solution was heated and stirred at 125° C. for eight hours. The reaction liquid was cooled to room temperature, and a sodium acetate aqueous solution was added thereto to stop the reaction. Thereafter, toluene was added thereto, and the solution was partitioned. The organic layer was purified with a silica gel short pass column, then by silica gel column chromatography (eluent: heptane/toluene=4), and further by activated carbon column chromatography (eluent:toluene) to obtain a compound of formula (1A-1) (1.2 g).

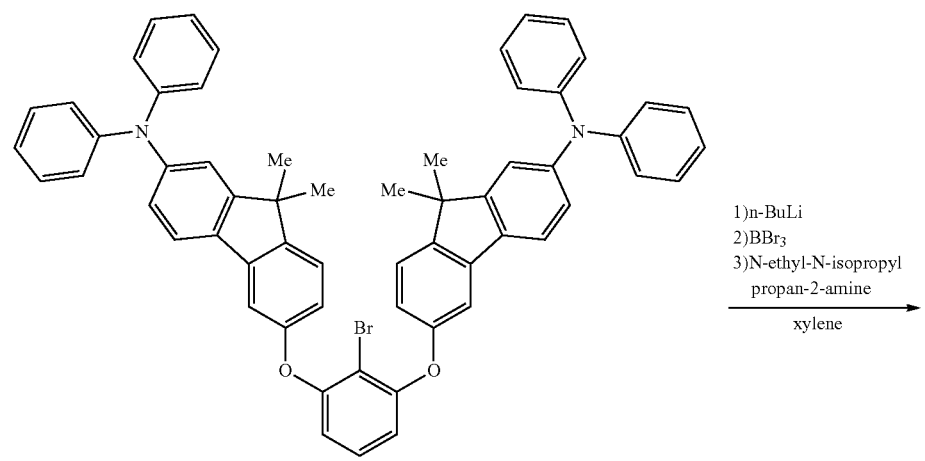
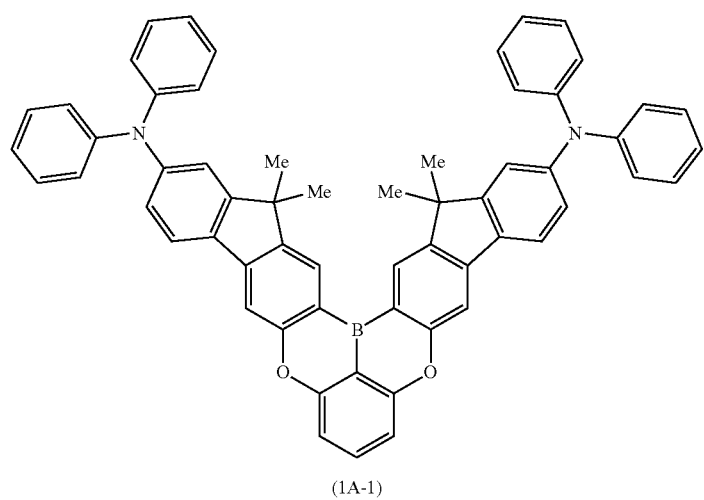
(1A-1)

The structure of compound (1A-1) thus obtained was identified by NMR measurement.

¹H-NMR (400 MHz, CDCl₃): δ=8.64 (s, 2H), 7.75 (m, 3H), 7.69 (d, 2H), 7.30 (t, 8H), 7.25 (s, 2H), 7.20 (m, 10H), 7.08 (m, 6H), 1.58 (s, 12H).

Synthesis Example (2)

Synthesis of Compound of formula (1A-3): 16,16,19,19-tetramethyl-$N^2,N^2,N^{14},N^{14}$-tetra-p-tolyl-16H,19H-6,10-dioxa-17b-boraindeno[1,2-b]indeno[1',2':6,7]naphtho[1,2,3-fg]anthracene-2,14-diamine

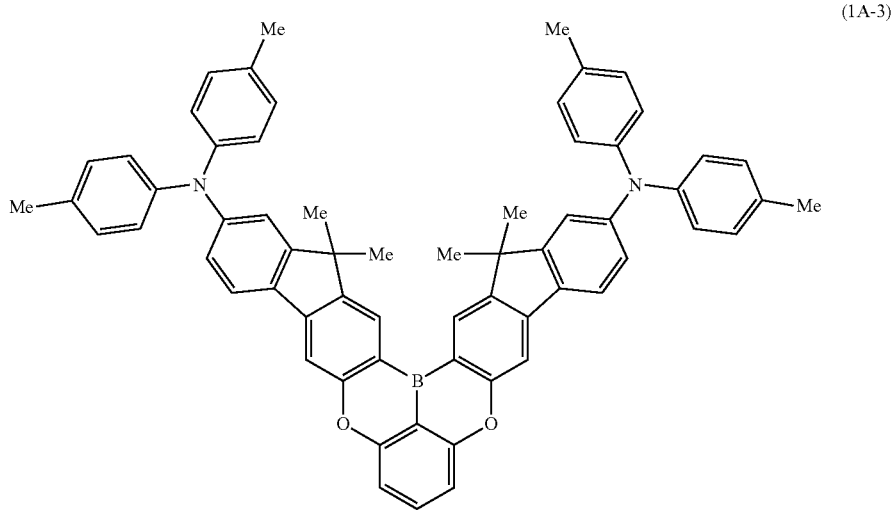 [SMILES: Cc1ccc(N(c2ccc(C)cc2)c2ccc3c(c2)C(C)(C)c2cc4c(cc2-3)Oc2cccc3c2B4c2cc4c(cc2O3)-c2ccc(N(c3ccc(C)cc3)c3ccc(C)cc3)cc2C4(C)C)cc1]

(1A-3)

Synthesis of 4-(6-methoxy-9,9-dimethyl-N,N-di-p-tolyl-9H-fluoren-2-amine

In a nitrogen atmosphere, a flask containing di-p-tolylamine (20.0 g), 2-chloro-6-methoxy-9,9-dimethyl-9H-fluorene (25.2 g), Pd-132 (Johnson Massey) (0.7 g), NaOtBu (14.0 g), and toluene (130 ml) was heated and refluxed for two hours. The reaction liquid was cooled to room temperature. Thereafter, water and toluene were added thereto, and the solution was partitioned. Subsequently, purification was performed by activated carbon column chromatography (eluent:toluene), and washing was further performed with Solmix to obtain 26.8 g of 4-(6-methoxy-9,9-dimethyl-N,N-di-p-tolyl-9H-fluoren-2-amine (yield: 66.1%).

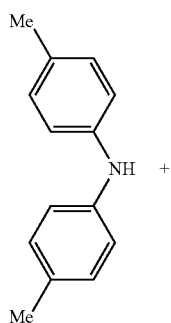

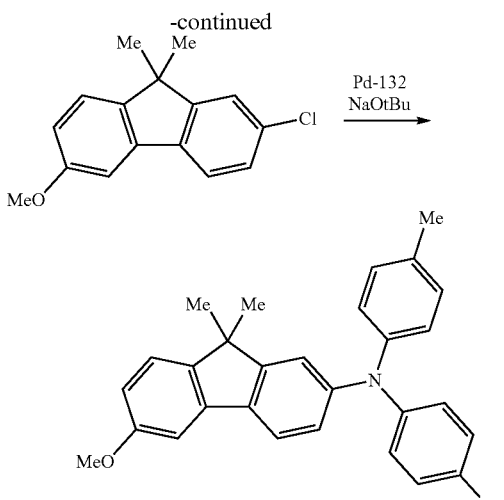

Synthesis of 7-(di-p-tolylamino)-9,9-dimethyl-9H-fluoren-3-ol

In a nitrogen atmosphere, 4-(6-methoxy-9,9-dimethyl-N,N-di-p-tolyl-9H-fluoren-2-amine (21.5 g), pyridine hydrochloride (29.6 g), and NMP (21.5 ml) were put in a flask and heated at 185° C. for five hours. After completion of heating, the reaction liquid was cooled to room temperature. Thereafter, water and toluene were added thereto, and the solution was partitioned. Subsequently, the organic layer was dried with anhydrous sodium sulfate. Thereafter, the desiccant was removed, and the solvent was distilled off under reduced pressure to obtain a crude product. The crude product was purified with a short column (eluent:toluene) to obtain 20.8 g of 7-(di-p-tolylamino)-9,9-dimethyl-9H-fluoren-3-ol (yield: 100%).

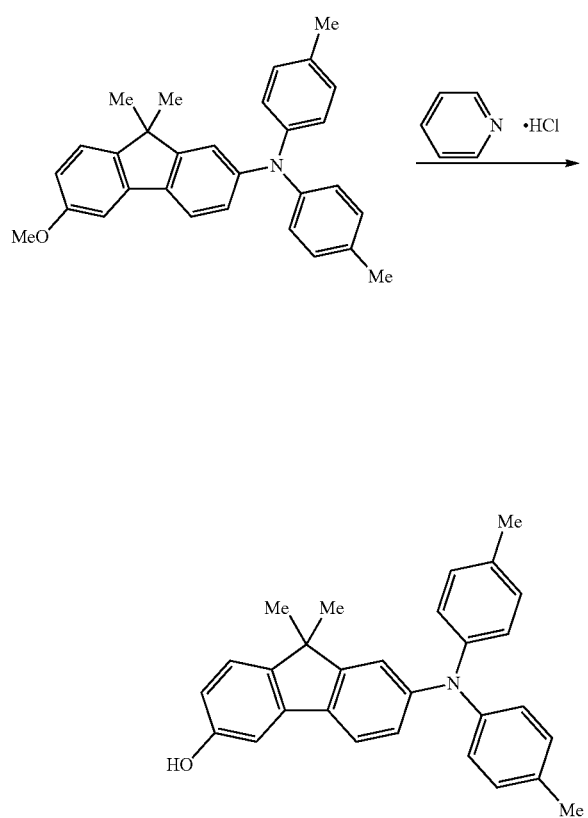

(Synthesis of 6,6'-((2-bromo-1,3-phenylene) bis ((oxy) bis(9,9-dimethyl-N,N-di-p-tolyl-9H-fluoren-2-amine)

In a nitrogen atmosphere, a flask containing 7-(di-p-tolylamino)-9,9'-dimethyl-9H-fluoren-3-ol (20.6 g), 2-bromo-1,3-difluorobenzene (4.9 g), potassium carbonate (17.5 g), and NMP (39 ml) was heated and stirred at a reflux temperature for two hours. After the reaction was stopped, the reaction liquid was cooled to room temperature, and water was added thereto. A precipitate precipitated was collected by suction filtration. The obtained precipitate was washed with water and then with Solmix and then purified by silica gel column chromatography (eluent: mixed solvent of heptane/toluene=2/1 (volume ratio) to obtain 17.3 g of 6,6'-((2-bromo-1,3-phenylene) bis(oxy)) bis(9,9-dimethyl-N,N-di-p-tolyl-9H-fluoren-2-amine) (yield: 70.7%).

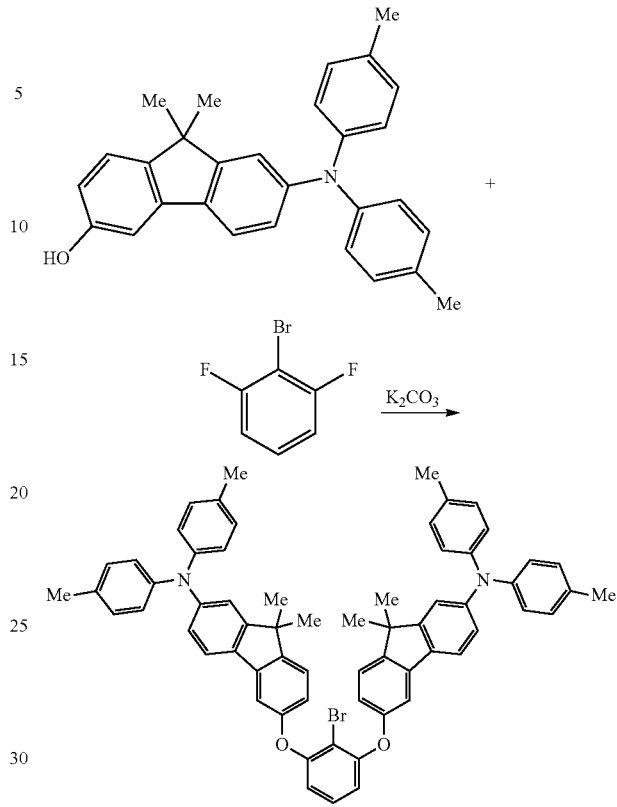

Synthesis of Compound of Formula (1A-3)

In a nitrogen atmosphere, a flask containing 6,6'-((2-bromo-1,3-phenylene) bis(oxy)) bis(9,9-dimethyl-N,N-di-p-tolyl-9H-fluoren-2-amine) (15.0 g) and xylene (100 ml) was cooled to −40° C., and a 1.6 M n-butyllithium hexane solution (10.7 ml) was added dropwise thereto. After completion of the dropwise addition, the solution was stirred at this temperature for 0.5 hours, and then the temperature of the solution was raised to room temperature. Thereafter, the reaction liquid was depressurized to distill off a component having a low boiling point. Thereafter, the residue was cooled to −40° C., and boron tribromide (5.1 g) was added thereto. The temperature of the solution was raised to room temperature, and the solution was stirred for 0.5 hours. Thereafter, the solution was cooled to 0° C., N-ethyl-N-isopropylpropan-2-amine (4.0 g) was added thereto, and the solution was heated and stirred at 120° C. for five hours. The reaction liquid was cooled to room temperature, and a sodium acetate aqueous solution was added thereto to stop the reaction. Thereafter, toluene was added thereto, and the solution was partitioned. The organic layer was purified with a silica gel short pass column (eluent:toluene) and then by NH2 silica gel column chromatography (eluent: ethyl acetate toluene), and reprecipitation was performed several times with Solmix. Thereafter, purification was performed by silica gel column chromatography (eluent:heptane/toluene 3/1 (volume ratio)). Furthermore, sublimation purification was performed to obtain 1.5 g of a compound of formula (1A-3) (yield: 11%).

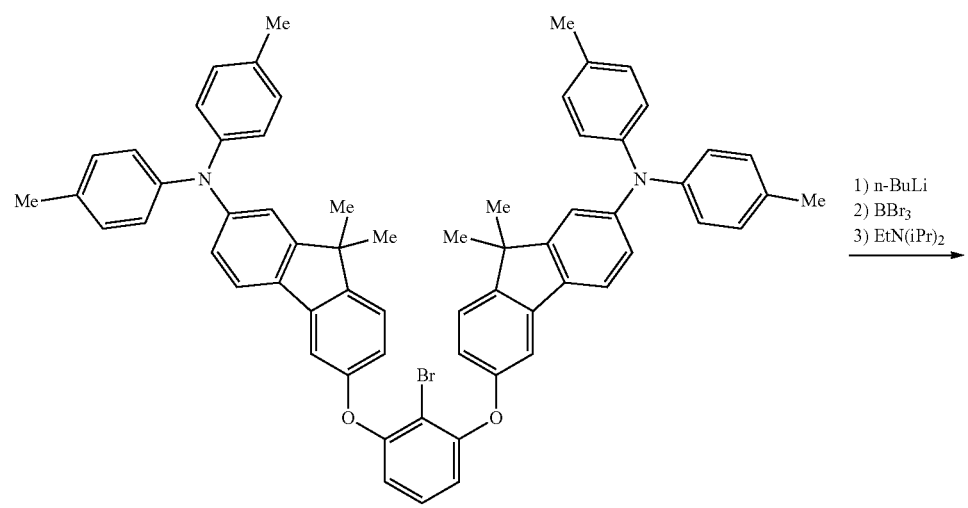
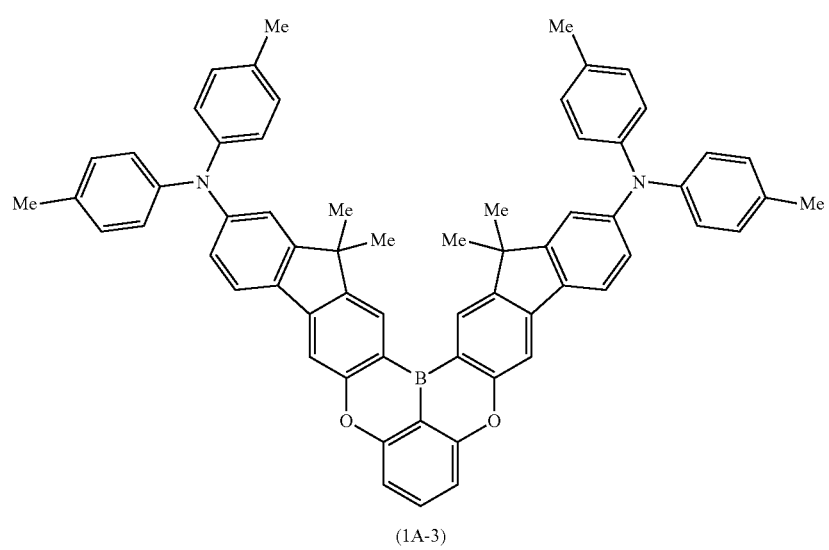
(1A-3)

The structure of the compound of formula (1A-3) was identified by MS spectrum and NMR measurement.

$^1$H-NMR (CDCl$_3$): δ=8.62 (s, 2H), 7.74 (t, 1H), 7.72 (s, 2H), 7.65 (d, 2H), 7.25 to 7.06 (m, 20H), 7.00 (dd, 2H), 2.35 (s, 12H), 1.57 (s, 12H).

The compound of formula (1A-3) had a glass transition temperature (Tg) of 179.2° C.

[Measuring instrument: Diamond DSC (manufactured by PERKIN-ELMER); measurement conditions: cooling rate 200° C./min., heating rate 10° C./min.]

Synthesis Example (3)

Synthesis of Compound of Formula (1A-25): 8,16,16,19,19-pentamethyl-N$^2$,N$^2$,N$^{14}$,N$^{14}$-tetraphenyl-16H,19H-6,10-dioxa-17b-boraindeno[1,2-b]indeno[1',2':6,7]naphtho[1,2,3-fg]anthracene-2,14-diamine (1A-25)

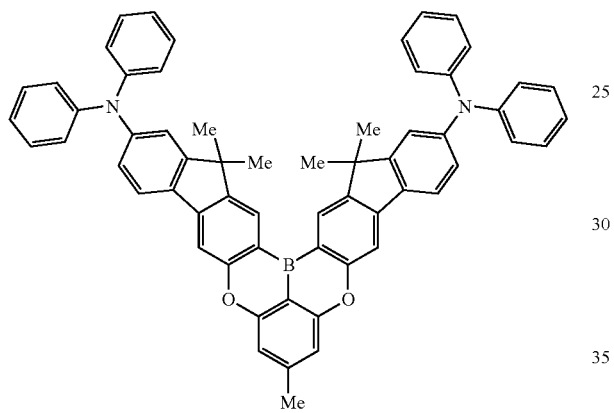

Synthesis of 6,6'-((5-methyl-1,3-phenylene) bis(oxy)) bis(9,9-dimethyl-N,N-diphenyl-9H-fluoren-2-amine)

In a nitrogen atmosphere, a flask containing 7-(diphenylamino)-9,9'-dimethyl-9H-fluoren-3-ol (39.0 g), 1,3-difluoro-5-methylbenzene (6.6 g), tripotassium phosphate (54.8 g), and NMP (98 ml) was heated and stirred at a reflux temperature for 14 hours. After the reaction was stopped, the reaction liquid was cooled to room temperature, and water was added thereto. A precipitate precipitated was collected by suction filtration. The obtained precipitate was washed with water and then with Solmix and then purified by silica gel column chromatography (eluent:heptane/toluene=4/1→2/1 (volume ratio)) to obtain 41.0 g of 6,6'-((5-methyl-1,3-phenylene) bis(oxy)) bis(9,9-dimethyl-N,N-diphenyl-9H-fluoren-2-amine) (yield: 94.1%).

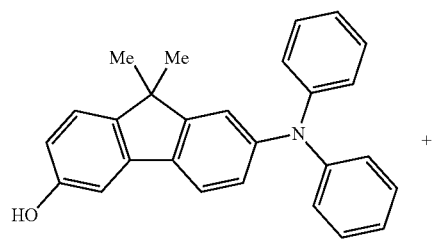

+

-continued

$\xrightarrow{K_3PO_4}$

Synthesis of Compound of Formula (1A-25)

In a nitrogen atmosphere, a flask containing 6,6'-((5-methyl-1,3-phenylene) bis(oxy)) bis(9,9-dimethyl-N,N-diphenyl-9H-fluoren-2-amine) (41.0 g) and xylene (246 ml) was cooled to −10° C., and a 1.6 M n-butyllithium hexane solution (33.4 ml) was added dropwise thereto. After completion of the dropwise addition, the solution was stirred at this temperature for 0.5 hours. Thereafter, the temperature of the solution was raised to 70° C., and the solution was stirred for two hours. Thereafter, the reaction liquid was depressurized to distill off a component having a low boiling point. Thereafter, the residue was cooled to −40° C., and boron tribromide (18.3 g) was added thereto. The temperature of the solution was raised to room temperature, and the solution was stirred for 0.5 hours. Thereafter, the solution was cooled to 0° C., N-ethyl-N-isopropylpropan-2-amine (12.6 g) was added thereto, and the solution was stirred at room temperature for ten minutes. Subsequently, aluminum chloride (AlCl$_3$) (13.0 g) was added thereto, and the resulting mixture was heated at 110° C. for three hours. The reaction liquid was cooled to room temperature, and a potassium acetate aqueous solution was added thereto to stop the reaction. Thereafter, toluene was added thereto, and the solution was partitioned. The organic layer was purified with a silica gel short pass column (eluent:toluene) and then by NH2 silica gel column chromatography (eluent:ethyl acetate→toluene), and reprecipitation was performed several times with a mixed solvent of Solmix/heptane (volume ratio of 1/1). Thereafter, purification was performed by silica gel column chromatography (eluent:heptane/toluene=3/1 (volume ratio)). Furthermore, sublimation purification was performed to obtain 3.4 g of a compound of formula (1A-25) (yield: 8.2%).

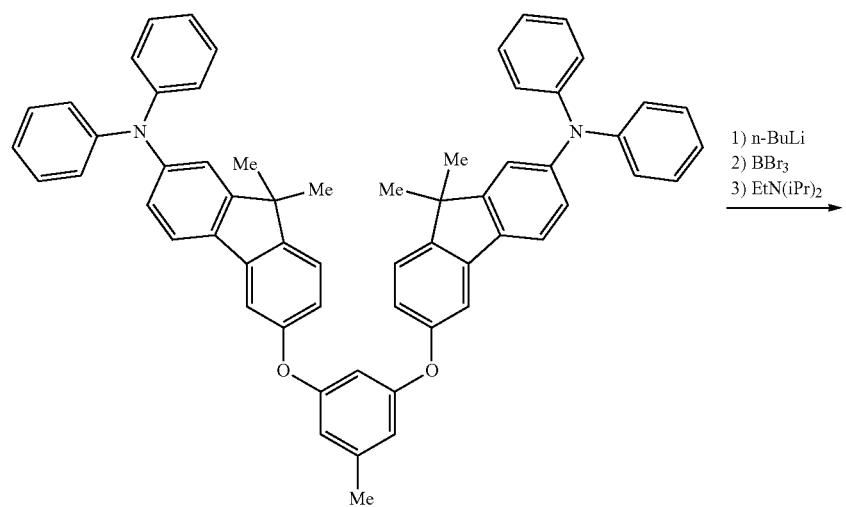
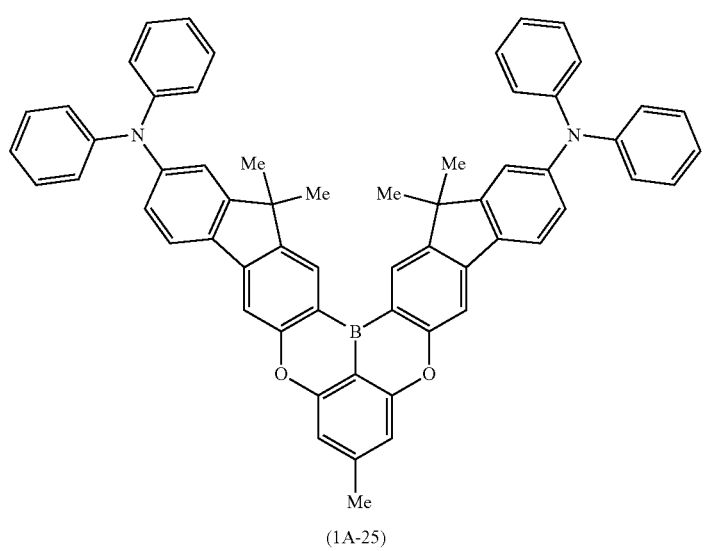
(1A-25)

The structure of the compound of formula (1A-3) was identified by MS spectrum and NMR measurement.

$^1$H-NMR (CDCl$_3$): δ=8.62 (s, 2H), 7.72 (s, 2H), 7.68 (d, 2H), 7.30 (t, 8H), 7.25 (s, 2H), 7.18 (d, 8H), 7.08 to 7.03 (m, 8H), 2.58 (s, 3H), 1.57 (s, 12H).

The compound of formula (1A-25) had a glass transition temperature (Tg) of 182.5° C.

[Measuring instrument: Diamond DSC (manufactured by PERKIN-ELMER); measurement conditions: cooling rate 200° C./min., heating rate 10° C./min.]

Synthesis Example (4)

Synthesis of compound of formula (1B-1): 15,15-dimethyl-N,N-diphenyl-15H-5,9-dioxa-16b-borain-deno[1,2-b]naphtho[1,2,3-fg]anthracen-13-amine (1B-1)

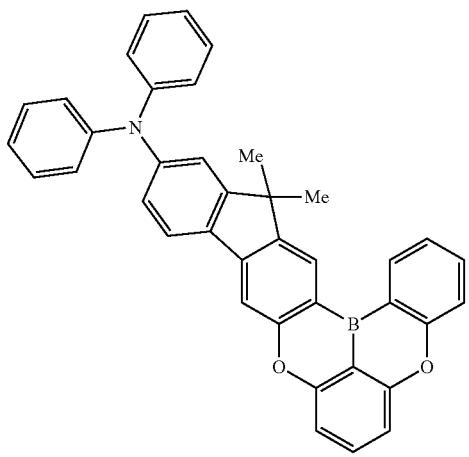

Synthesis of 6-(2-bromo-3-phenoxyphenoxy)-9,9-dimethyl-N,N-diphenyl-9H-fluoren-2-amine In a nitrogen atmosphere, a flask containing 7-(diphenylamino)-9,9'-dimethyl-9H-fluoren-3-ol (20.0 g), 2-bromo-1-fluoro-3-phenoxybenzene (15.6 g), potassium carbonate (18.3 g), and NMP (50 ml) was heated and stirred at a reflux temperature for four hours. After the reaction was stopped, the reaction liquid was cooled to room temperature, and water was added thereto. A precipitate precipitated was collected by suction filtration. The obtained precipitate was washed with water and then with Solmix and then purified by silica gel column chromatography (eluent:heptane/toluene=1/1 (volume ratio)) to obtain 30.0 g of 6-(2-bromo-3-phenoxyphenoxy)-9,9-dimethyl-N,N-diphenyl-9H-fluoren-2-amine (yield: 90.6%).

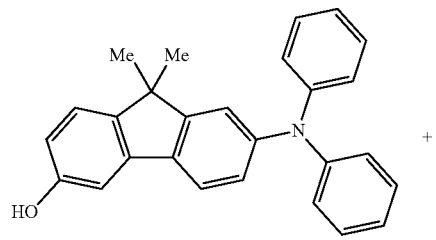

+

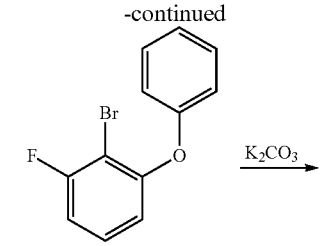

-continued

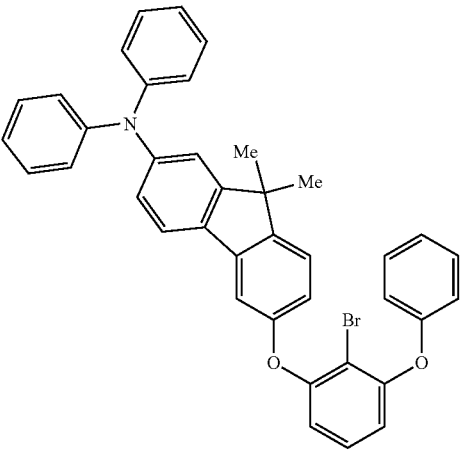

Synthesis of Compound of Formula (1B-1)

In a nitrogen atmosphere, a flask containing 6-(2-bromo-3-phenoxyphenoxy)-9,9-dimethyl-N,N-diphenyl-9H-fluoren-2-amine (28.0 g) and xylene (200 ml) was cooled to −30° C., and a 1.6 M n-butyllithium hexane solution (30.8 ml) was added dropwise thereto. After completion of the dropwise addition, the solution was stirred at room temperature for 0.5 hours. Thereafter, the reaction liquid was depressurized to distill off a component having a low boiling point. Thereafter, the residue was cooled to −30° C., and boron tribromide (16.8 g) was added thereto. The temperature of the solution was raised to room temperature, and the solution was stirred for 0.5 hours. Thereafter, the solution was cooled to 0° C., N-ethyl-N-isopropylpropan-2-amine (12.6 g) was added thereto, and the solution was stirred at room temperature for ten minutes. Subsequently, aluminum chloride (AlCl$_3$) (12.0 g) was added thereto, and the resulting mixture was heated at 90° C. for two hours. The reaction liquid was cooled to room temperature, and a potassium acetate aqueous solution was added thereto to stop the reaction. Thereafter, a precipitate precipitated was collected as a crude product 1 by suction filtration. The filtrate was extracted with ethyl acetate and dried with anhydrous sodium sulfate. Thereafter, the desiccant was removed, and the solvent was distilled off under reduced pressure to obtain a crude product 2. The crude products 1 and 2 were mixed with each other. The resulting mixture was reprecipitated several times with each of Solmix and heptane and then purified by NH2 silica gel column chromatography (eluent:ethyl acetate→toluene). Furthermore, sublimation purification was performed to obtain 6.4 g of a compound of formula (1B-1) (yield:25.6%).

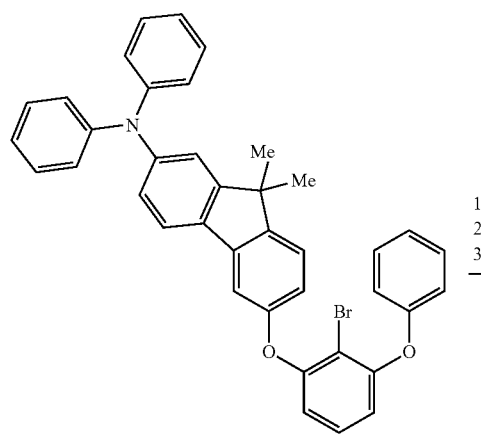

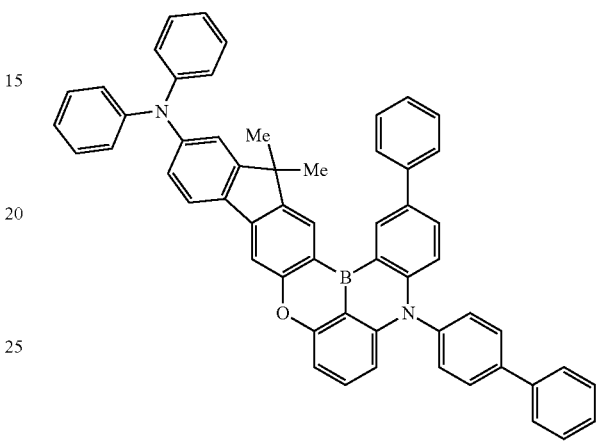

Synthesis Example (5)

Synthesis of Compound of Formula (1B-10): 5-([1,1'-biphenyl]-4-yl)-15,15-dimethyl-N,N,2-triphenyl-5H,15H-9-oxa-5-aza-16b-boraindeno[1,2-b]naphtho[1,2,3-fg]anthracen-13-amine (1B-10)

Synthesis of 6-(2,3-dibromophenoxy)-9,9-dimethyl-N,N-diphenyl-9H-fluoren-2-amine In a nitrogen atmosphere, a flask containing 7-(diphenylamino)-9,9'-dimethyl-9H-fluoren-3-ol (9.0 g), 1,2-bromo-3-fluorobenzene (7.9 g), potassium carbonate (8.2 g), and NMP (45 ml) was heated and stirred at a reflux temperature for two hours. After the reaction was stopped, the reaction liquid was cooled to room temperature, and water was added thereto. A precipitate precipitated was collected by suction filtration. The obtained precipitate was washed with water and then with Solmix and then purified by silica gel column chromatography (eluent: heptane/toluene=3/1 (volume ratio)) to obtain 12.4 g of 6-(2,3-dibromophenoxy)-9,9-dimethyl-N,N-diphenyl-9H-fluoren-2-amine (yield: 84.8%).

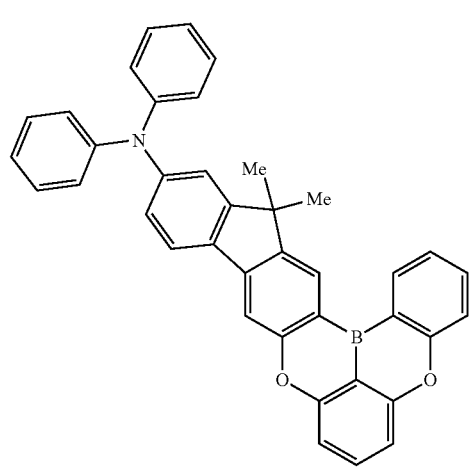

(1B-1)

The structure of the compound of formula (1B-1) was identified by MS spectrum and NMR measurement.

$^1$H-NMR (CDCl$_3$):δ=8.72 (d, 1H), 8.60 (s, 1H), 7.79 to 7.68 (m, 4H), 7.55 (d, 1H), 7.41 (t, 1H), 7.31 to 7.17 (m, 11H), 7.09 to 7.05 (m, 3H), 1.57 (s, 6H).

The compound of formula (1B-1) had a glass transition temperature (Tg) of 116.6° C.

[Measuring instrument: Diamond DSC (manufactured by PERKIN-ELMER); measurement conditions: cooling rate 200° C./min., heating rate 10° C./min.]

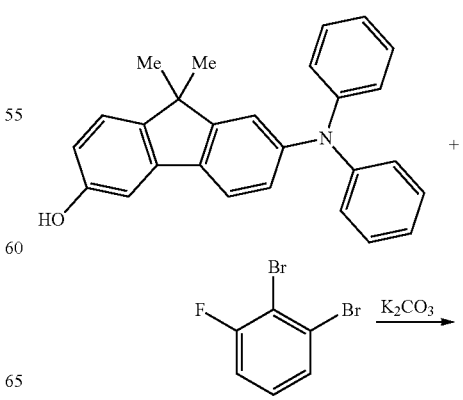

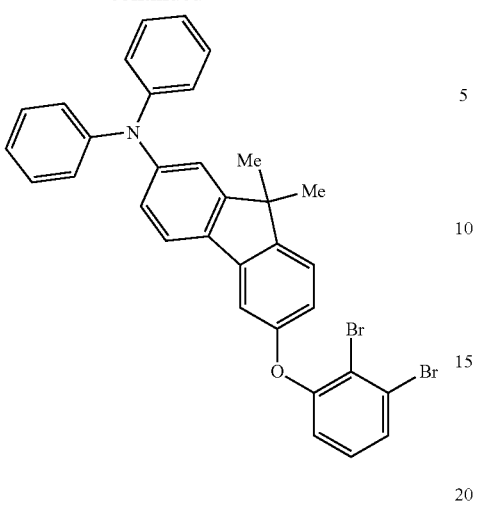

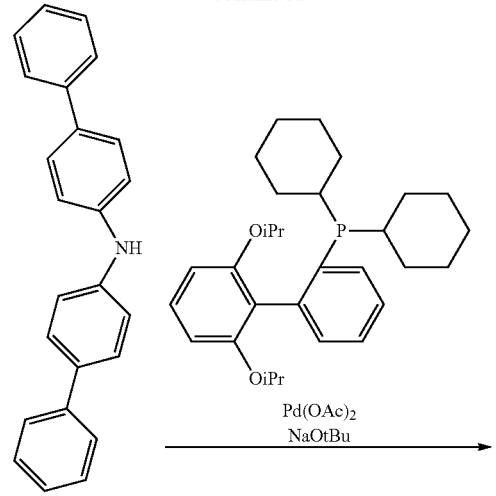

Synthesis of 6-(2-bromo-3-(di([1,1'-biphenyl]-4-yl) amino) phenoxy)-9,9-dimethyl-N,N-diphenyl-9H-fluoren-2-amine In a nitrogen atmosphere, a flask containing 6-(2,3-dibromophenoxy)-9,9-dimethyl-N,N-diphenyl-9H-fluoren-2-amine (10.0 g), di([1,1'-biphenyl]-4-yl) amine (5.3 g), palladium acetate (0.15 g), dicyclohexyl (2',6'-diisopropoxy-[1,1'-biphenyl]-2-yl) phosphane (0.61 g), NaOtBu (2.4 g), and toluene (35 ml) was heated at 80° C. for six hours. The reaction liquid was cooled to room temperature. Thereafter, water and toluene were added thereto, and the solution was partitioned. Furthermore, purification was performed by silica gel column chromatography (eluent:heptane/toluene=2/1 (volume ratio)) to obtain 7.4 g of 6-(2-bromo-3-(di([1,1'-biphenyl]-4-yl) amino) phenoxy)-9,9-dimethyl-N,N-diphenyl-9H-fluoren-2-amine (yield: 53.1%).

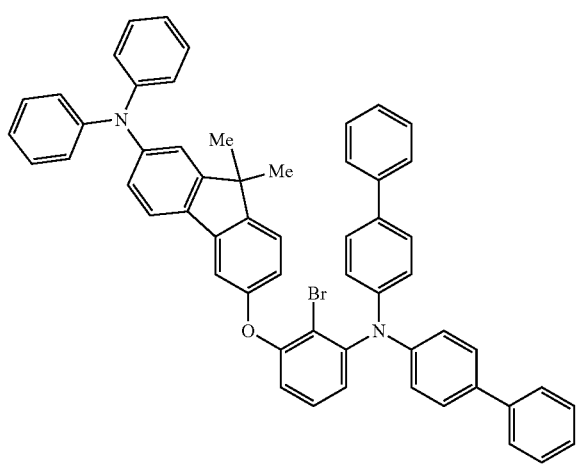

Synthesis of Dimethyl (2-(di([1,1'-biphenyl]-4-yl) amino)-6-((7-(diphenylamino)-9,9-dimethyl-9H-fluoren-3-yl) oxy) phenyl) boronate In a nitrogen atmosphere, 6-(2-bromo-3-(di([1,1'-biphenyl]-4-yl) amino) phenoxy)-9,9-dimethyl-N,N-diphenyl-9H-fluoren-2-amine (7.9 g) and tetrahydrofuran (42 ml) were put in a flask and cooled to −40° C. A 1.6 M n-butyllithium hexane solution (6 ml) was added dropwise thereto. After completion of the dropwise addition, the solution was stirred at this temperature for one hour. Thereafter, trimethylborate (1.7 g) was added thereto. The temperature of the solution was raised to room temperature, and the solution was stirred for two hours. Thereafter, water (100 ml) was slowly added dropwise thereto. Subsequently, the reaction mixture was extracted with ethyl acetate and dried with anhydrous sodium sulfate. Thereafter, the desiccant was removed to obtain 7.0 g of dimethyl (2-(di([1,1'-biphenyl]-4-yl) amino)-6-((7-(diphenylamino)-9,9-dimethyl-9H-fluoren-3-yl) oxy) phenyl) boronate (yield: 100%).

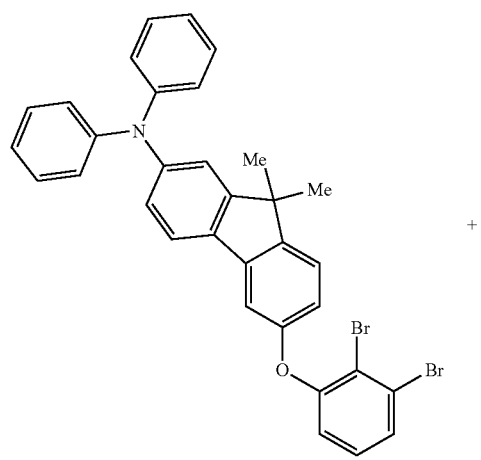

+

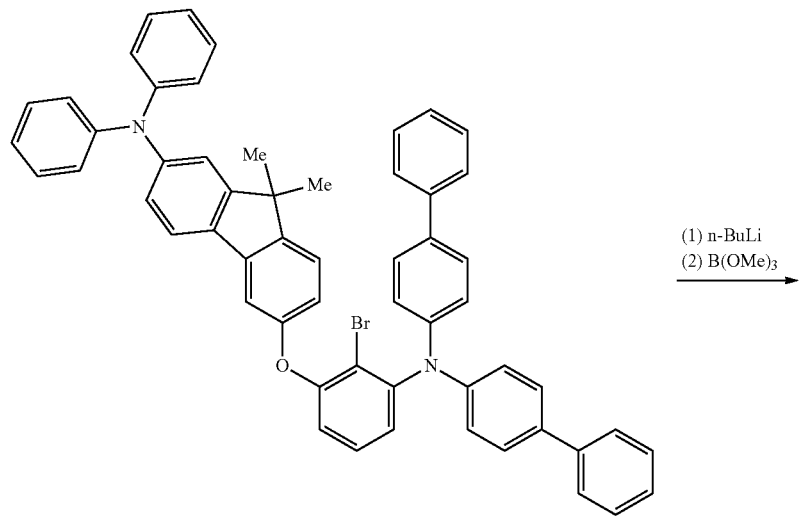

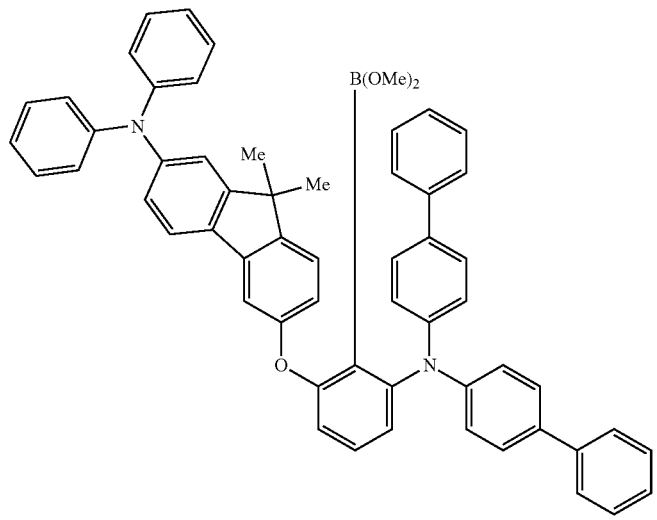

Synthesis of Compound of Formula (1B-10)

In a nitrogen atmosphere, dimethyl (2-(di([1,1'-biphenyl]-4-yl) amino)-6-((7-(diphenylamino)-9,9-dimethyl-9H-fluoren-3-yl) oxy) phenyl) boronate (6.5 g), aluminum chloride (10.3 g), and toluene (39 ml) were put in a flask and stirred for three minutes. Thereafter, N-ethyl-N-isopropylpropan-2-amine (2.5 g) was added thereto, and the resulting mixture was heated and stirred at 105° C. for one hour. After completion of heating, the reaction liquid was cooled, and ice water (20 ml) was added thereto. Thereafter, the reaction mixture was extracted with toluene. The organic layer was purified with a silica gel short pass column (eluent:toluene) and then by silica gel column chromatography (eluent: heptane/toluene=3/1 (volume ratio)). Thereafter, reprecipitation was performed with heptane, and purification was further performed with a NH2 silica gel column (solvent: heptane/toluene=1/1 (volume ratio)). Finally, sublimation purification was performed to obtain 0.74 g of the compound of formula (1B-10) (yield: 12.3%).

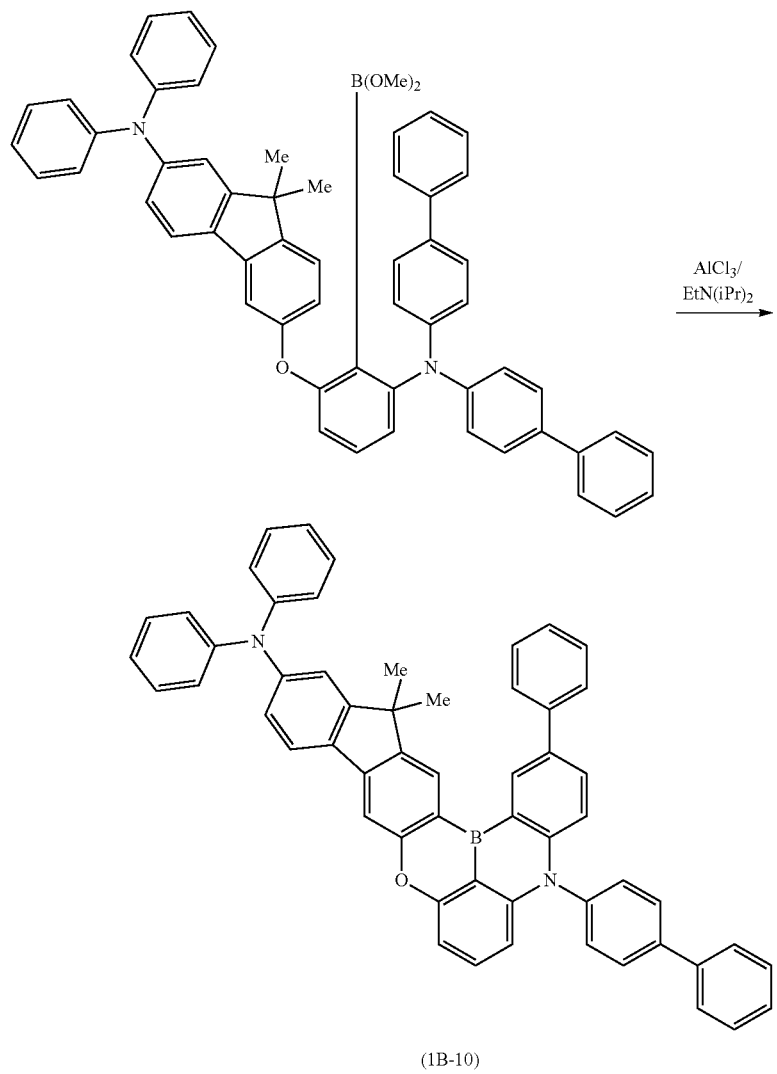

(1B-10)

The structure of the compound of formula (1B-10) was identified by MS spectrum and NMR measurement.

$^1$H-NMR (CDCl$_3$):δ=9.22 (s, 1H), 8.78 (s, 1H), 7.96 (d, 2H), 7.80 to 7.77 (m, 6H), 7.71 (d, 1H), 7.59 to 7.44 (m, 8H), 7.39 (t, 1H), 7.32 to 7.29 (m, 4H), 7.71 (d, 1H), 7.19 (dd, 4H), 7.12 to 7.06 (m, 4H), 7.00 (d, 1H), 6.45 (d, 1H), 1.57 (s, 6H).

The compound of formula (1B-10) had a glass transition temperature (Tg) of 165.6° C.

[Measuring instrument: Diamond DSC (manufactured by PERKIN-ELMER); measurement conditions: cooling rate 200° C./min., heating rate 10° C./min.]

By appropriately changing compounds as raw materials, other polycyclic aromatic compounds of the present invention can be synthesized by a method in accordance with the methods in Synthesis Examples described above.

Hereinafter, Examples will be described in order to describe the present invention in more detail, but the present invention is not limited thereto.

<Measurement of Fluorescence Quantum Yield>

The fluorescence quantum yields of the compounds represented by formulas (1A-1), (1A-3), (1A-25), (1B-1), and (1B-10) and compounds of Comparative Examples were measured. The fluorescence quantum yield was measured by a method for dispersing a compound to be evaluated in a commercially available PMMA (polymethyl methacrylate) resin, then forming a thin film, and evaluating the thin film.

First, a 3% by weight (specimen:PMMA=3:97 [weight ratio]) PMMA dispersion film sample was prepared as follows. Each specimen was dissolved in a solution obtained by dissolving a PMMA resin (400 mg) in toluene (2.4 mL) so as to have a concentration of 3% by weight with respect to the PMMA resin. This solution was applied onto a synthetic quartz substrate (10 mm×10 mm×1 mmt) by a spin coating method (3000 rmp×20 seconds). This substrate was dried on a hot plate (90° C.×10 minutes) and then further heated in a vacuum desiccator. The residual solvent was thereby distilled off under reduced pressure (1 kPa or less×90° C.×one hour) to obtain a PMMA dispersion film sample.

An absolute PL quantum yield measuring apparatus C9920-02G manufactured by Hamamatsu Photonics KK was used as a measuring apparatus. A Xe lamp spectral light source 150 W was used as an excitation light source, and monochromatic light of 320 nm was used as excitation light.

According to Japanese Journal of Applied Physics Vol. 43, No. 11A, 2004, pp. 7729-7730, a fluorescence quantum yield $\eta_{PL}$ is given by the following formula.

$$\eta_{PL} = \frac{N_{emission}}{N_{Absorption}} = \frac{\alpha \int \frac{\lambda}{hc} I_{em}(\lambda) d\lambda}{\alpha \int \frac{\lambda}{hc} [I_{ex}(\lambda) - I'_{ex}(\lambda)] d\lambda}$$

$N_{emission}$ is the number of photons emitted from a material, $N_{Absorption}$ is the number of photons absorbed by the material, and the fluorescence quantum yield is obtained as a ratio thereof. Here, α represents a correction coefficient of a measurement system, A represents a wavelength, h represents Planck's constant, c represents the speed of light, $I_{em}$ (A) represents emission intensity of a sample, $I_{ex}$ (A) represents excitation light intensity before a sample is set, and $I'_{ex}$ (A) represents excitation light intensity observed when a sample is irradiated with excitation light. By observing two spectra of $I_{em}$ and $I'_{ex}+I_{em}$, the fluorescence quantum yield can be measured.

For the measurement, a synthetic quartz substrate similar to the PMMA dispersion film sample was used as a blank substrate. The blank substrate was set in a sample holder for an absolute PL quantum yield, and $T_{ex}$ (λ) was measured. The blank substrate was removed from the sample holder, the PMMA dispersion film sample was set therein, and $I'_{ex}(\lambda)+I_{em}(\lambda)$ was observed.

The following Table illustrates measurement results of the fluorescence quantum yield. Note that Table 2 illustrates measurement results of compounds of Comparative Examples and illustrates the compounds described in WO 2015/102118 A together with the compound numbers thereof.

TABLE 1

| Compound to be measured | Quantum yield (%) |
|---|---|
| 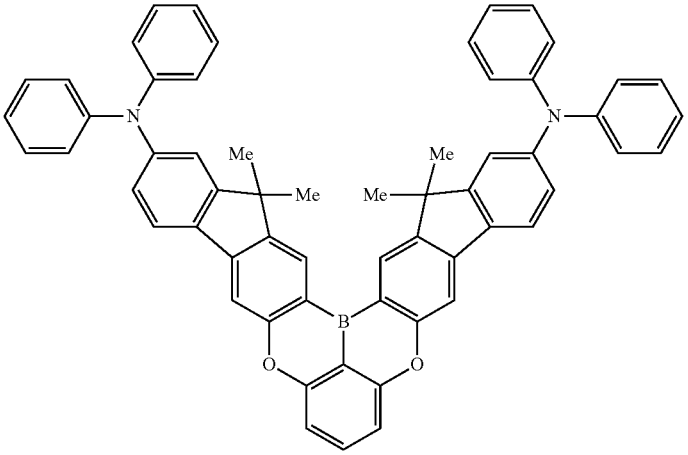 1A-1 | 97.4 |
| 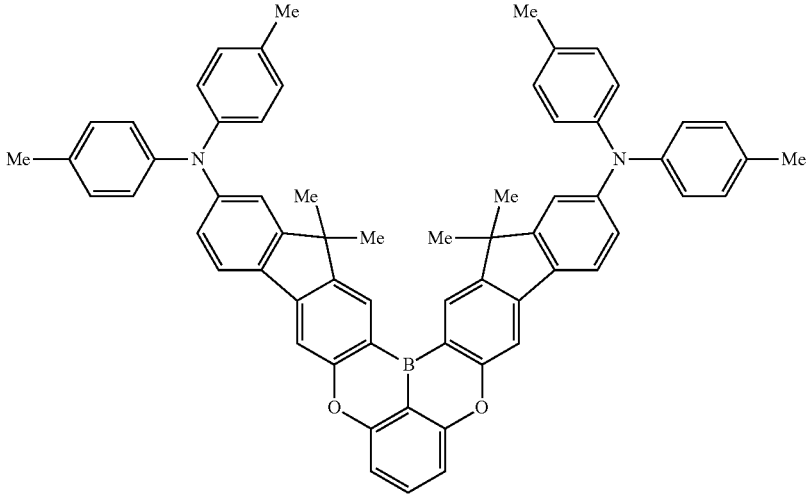 1A-3 | 96.0 |

TABLE 1-continued
| Compound to be measured | Quantum yield (%) |
|---|---|
| 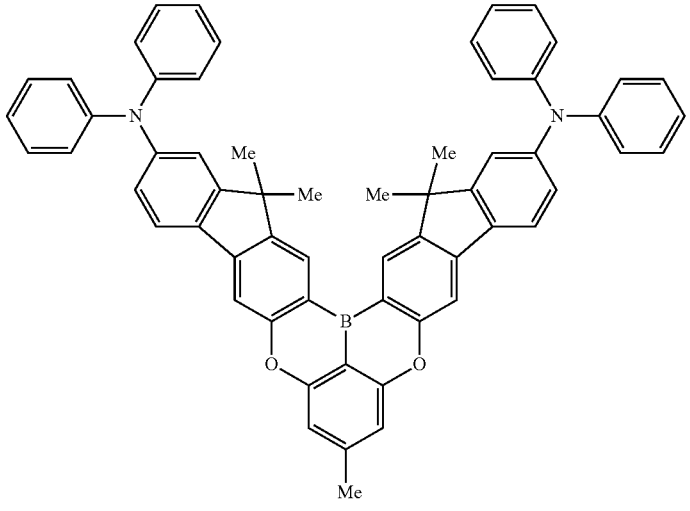 1A-25 | 91.0 |
| 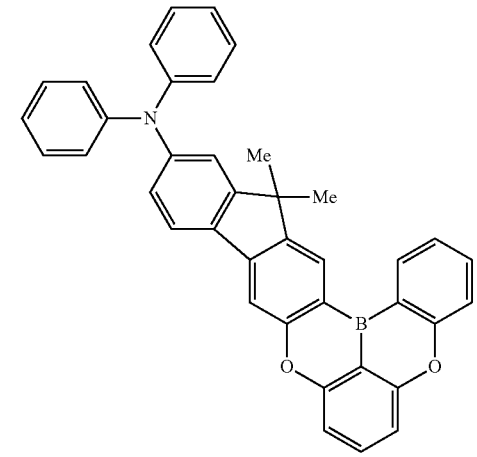 1B-1 | 96.0 |
| 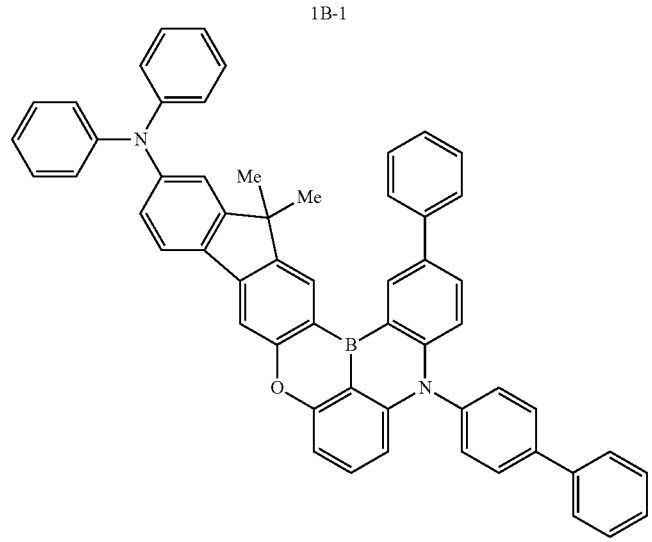 1B-10 | 92.4 |

TABLE 2A
| Compound to be measured | Quantum yield (%) |
|---|---|
| 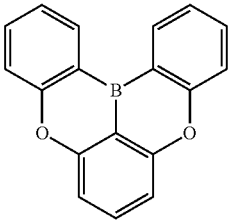 1-1 | 74.8 |
| 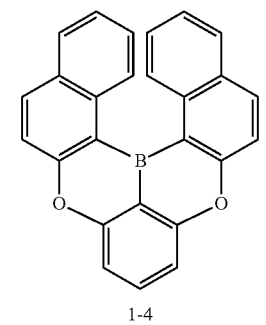 [SMILES: c1cc2c3c(c1)Oc1ccc4ccccc4c1B3c1c(ccc3ccccc13)O2] 1-4 | 39.9 |
| 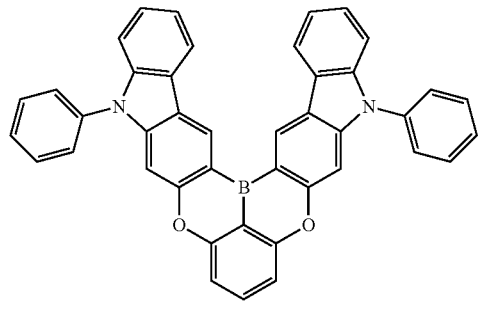 1-10 | 61.1 |
| 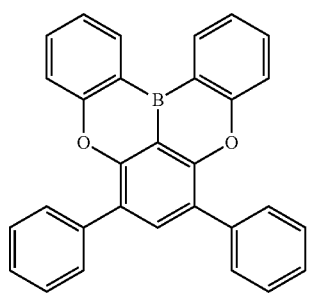 1-91 | 52.8 |
TABLE 2A-continued
| Compound to be measured | Quantum yield (%) |
|---|---|
| 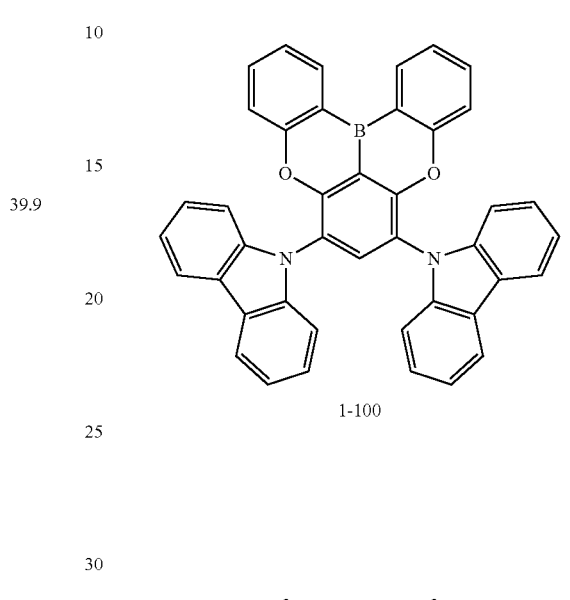 1-100 | 75.2 |
| 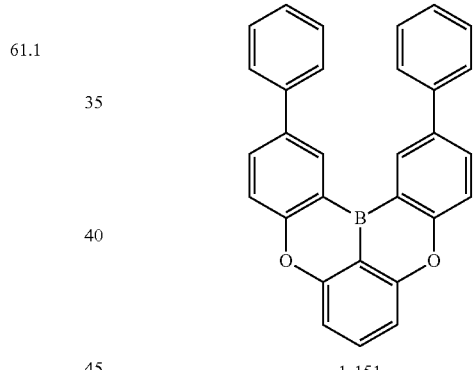 1-151 | 64.9 |
| 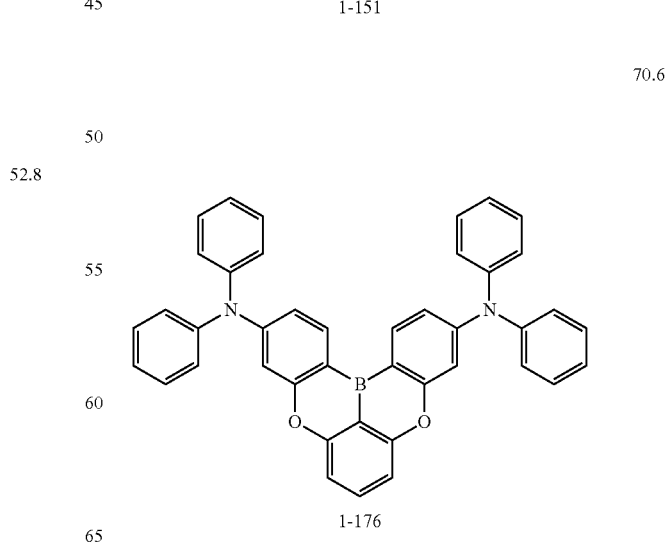 1-176 | 70.6 |

TABLE 2A-continued

| Compound to be measured | Quantum yield (%) |
|---|---|
| 1-50 | 46.8 |
| 1-152 | 54.3 |
| 1-401 | 77.8 |
| 1-1050 | 65.9 |
| 1-1069 | 74.9 |
| 1-1084 | 46.0 |
| 1-1090 | 64.5 |

TABLE 2A-continued
| Compound to be measured | Quantum yield (%) |
|---|---|
| 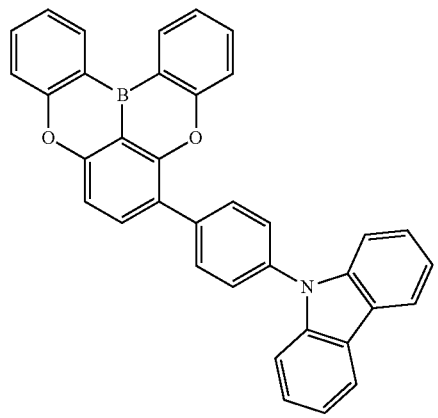<br>1-1092 | 41.7 |
| 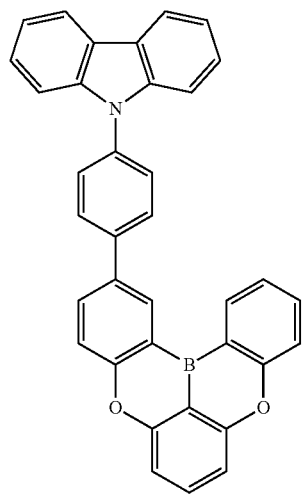<br>1-1101 | 57.1 |
| 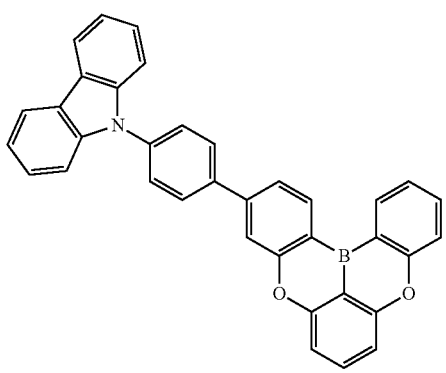<br>1-1102 | 62.6 |
TABLE 2A-continued
| Compound to be measured | Quantum yield (%) |
|---|---|
| 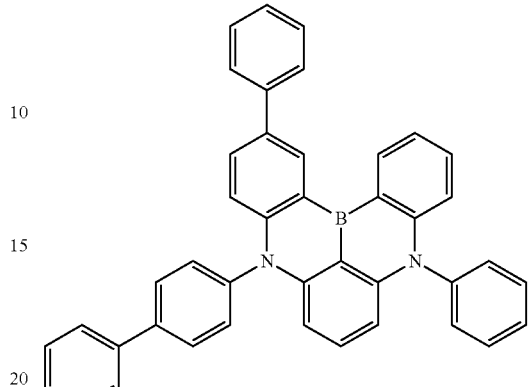<br>1-1152 | 78.6 |
| 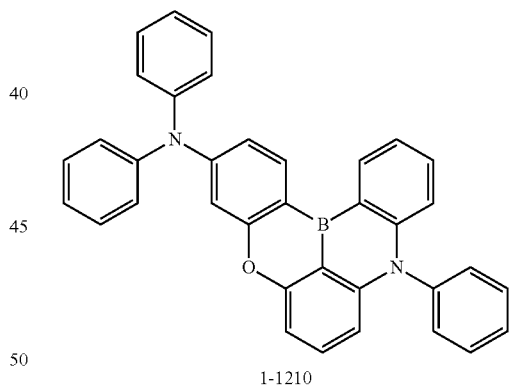<br>1-1201 | 61.9 |
| 1-1210 | 79.2 |
| 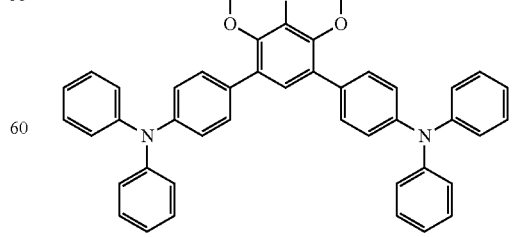<br>1-142 | 54.1 |

TABLE 2A-continued
| Compound to be measured | Quantum yield (%) |
|---|---|
| 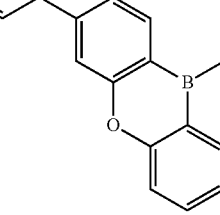 1-152-2 | 70.7 |
| 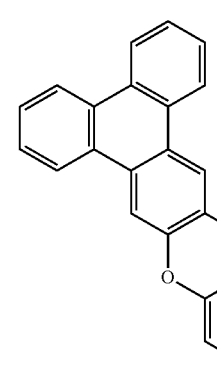 1-1006 | 50.6 |
| 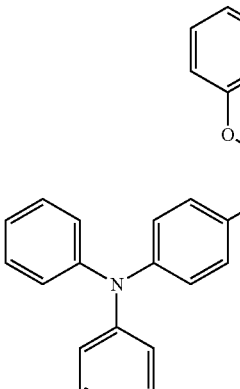 1-1104 | 42.8 |
| 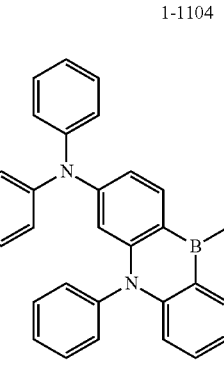 1-2626 | 76.1 |
| 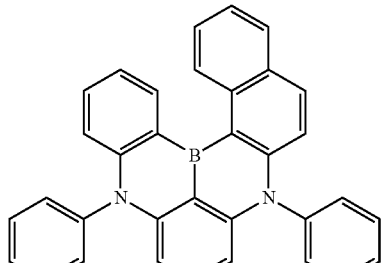 1-2657 | 75.7 |
| 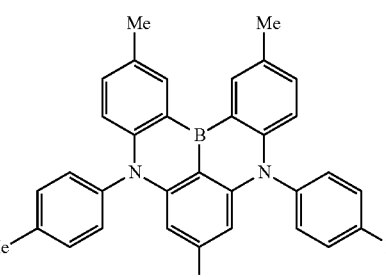 1-2662 | 76.4 |
| 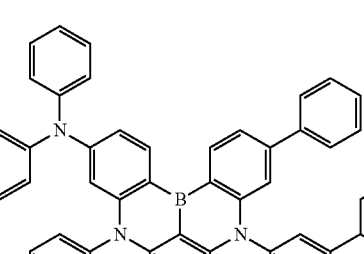 1-2676 | 84.8 |
| 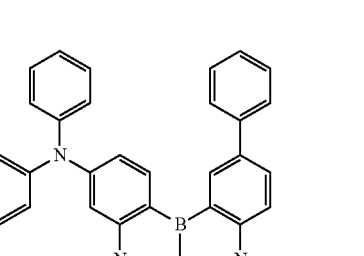 1-2679 | 79.4 |

TABLE 2A-continued

| Compound to be measured | Quantum yield (%) |
|---|---|
| 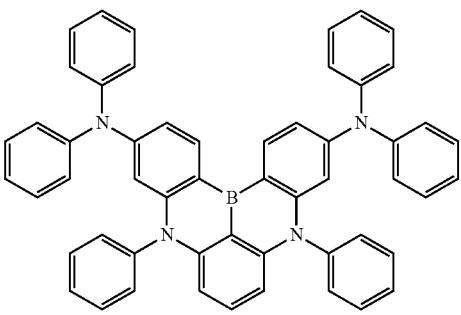 1-2680 | 76.1 |
| 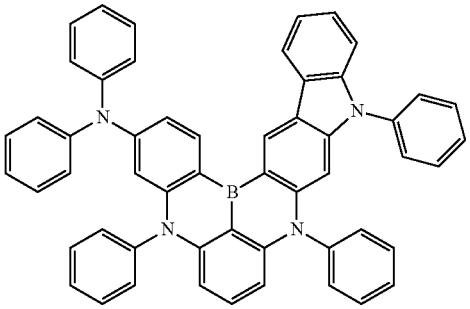 1-2681 | 72.1 |
| 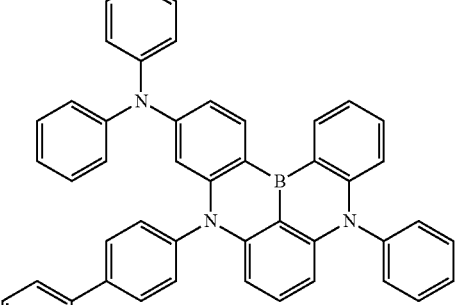 1-2683 | 76.6 |
| 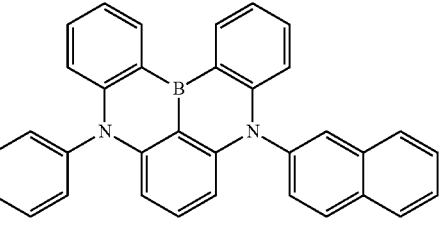 1-2699 | 74.5 |
| 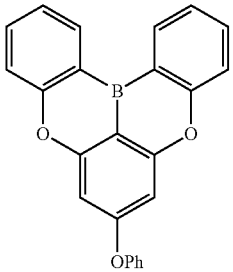 1-4401 | 49.3 |

<Evaluation of Organic EL Element (1)>

Organic EL elements according to Example 1 and Comparative Examples 1 to 10 were manufactured. When each of the organic EL elements was driven at a current density that could give luminance of 1000 cd/m², external quantum efficiency was measured. The following Table 3 illustrates a material configuration of each of layers in the organic EL elements thus manufactured. Dopant materials in Comparative Examples 1 to 10 are all the compounds disclosed in WO 2015/102118 A.

TABLE 3

| | Hole injection layer | | Hole transport layer | Light emitting layer | | Electron transport layer | | Negative electrode |
|---|---|---|---|---|---|---|---|---|
| | First layer | Second layer | | | | First layer | Second layer | |
| | (40 nm) | (5 nm) | (25 nm) | Host | Dopant | (5 nm) | (25 nm) | (1 nm/100 nm) |
| Example 1 | HI | HAT-CN | HT | BH1 | Compound (1A-1) | ET-5 | ET-6 | Liq/MgAg |
| Comparative Example 1 | HI | HAT-CN | HT | BH1 | Compound 1-2680 | ET-5 | ET-6 | Liq/MgAg |
| Comparative Example 2 | HI | HAT-CN | HT | BH1 | Compound 1-2679 | ET-5 | ET-6 | Liq/MgAg |

TABLE 3-continued

| | Hole injection layer | | Hole transport layer | Light emitting layer (20 nm) | | Electron transport layer | | Negative electrode |
|---|---|---|---|---|---|---|---|---|
| | First layer (40 nm) | Second layer (5 nm) | (25 nm) | Host | Dopant | First layer (5 nm) | Second layer (25 nm) | (1 nm/100 nm) |
| Comparative Example 3 | HI | HAT-CN | HT | BH1 | Compound 1-422 | ET-5 | ET-6 | Liq/MgAg |
| Comparative Example 4 | HI | HAT-CN | HT | BH1 | Compound 1-1145 | ET-5 | ET-6 | Liq/MgAg |
| Comparative Example 5 | HI | HAT-CN | HT | BH1 | Compound 1-2681 | ET-5 | ET-6 | Liq/MgAg |
| Comparative Example 6 | HI | HAT-CN | HT | BH1 | Compound 1-2682 | ET-5 | ET-6 | Liq/MgAg |
| Comparative Example 7 | HI | HAT-CN | HT | BH1 | Compound 1-2626 | ET-5 | ET-6 | Liq/MgAg |
| Comparative Example 8 | HI | HAT-CN | HT | BH1 | Compound 1-2683 | ET-5 | ET-6 | Liq/MgAg |
| Comparative Example 9 | HI | HAT-CN | HT | BH1 | Compound 1-2699 | ET-5 | ET-6 | Liq/MgAg |
| Comparative Example 10 | HI | HAT-CN | HT | BH1 | Compound 1-2676 | ET-5 | ET-6 | Liq/MgAg |

* Host:dopant = 95:5 (weight ratio) in Example 1 and Comparative Examples 1 to 10

In Table 3, "HI" represents $N^4,N^{4'}$-diphenyl-$N^4,N^{4'}$-bis(9-phenyl-9H-carbazol-3-yl)-[1,1'-biphenyl]-4,4'-diamine, "HAT-CN" represents 1,4,5,8,9,12-hexaazatriphenylene hexacarbonitrile, "HT" represents N-([1,1'-biphenyl]-4-yl)-N-(4-(9-phenyl-9H-carbazol-3-yl) phenyl)-[1,1'-biphenyl]-4-amine, "BH1" represents 9-phenyl-10-(4-phenylnaphthalen-1-yl) anthracene, "ET-5" represents 9-(7-(dimesitylboryl)-9,9-dimethyl-9H-fluoren-2-yl)-3,6-dimethyl-9H-carbazole, and "ET-6" represents 5,5'-((2-phenylanthracene-9,10-diyl) bis(3,1-phenylene)) bis(3-methylpyridine). Chemical structures of these compounds are illustrated below together with a chemical structure of "Liq" used for the negative electrode.

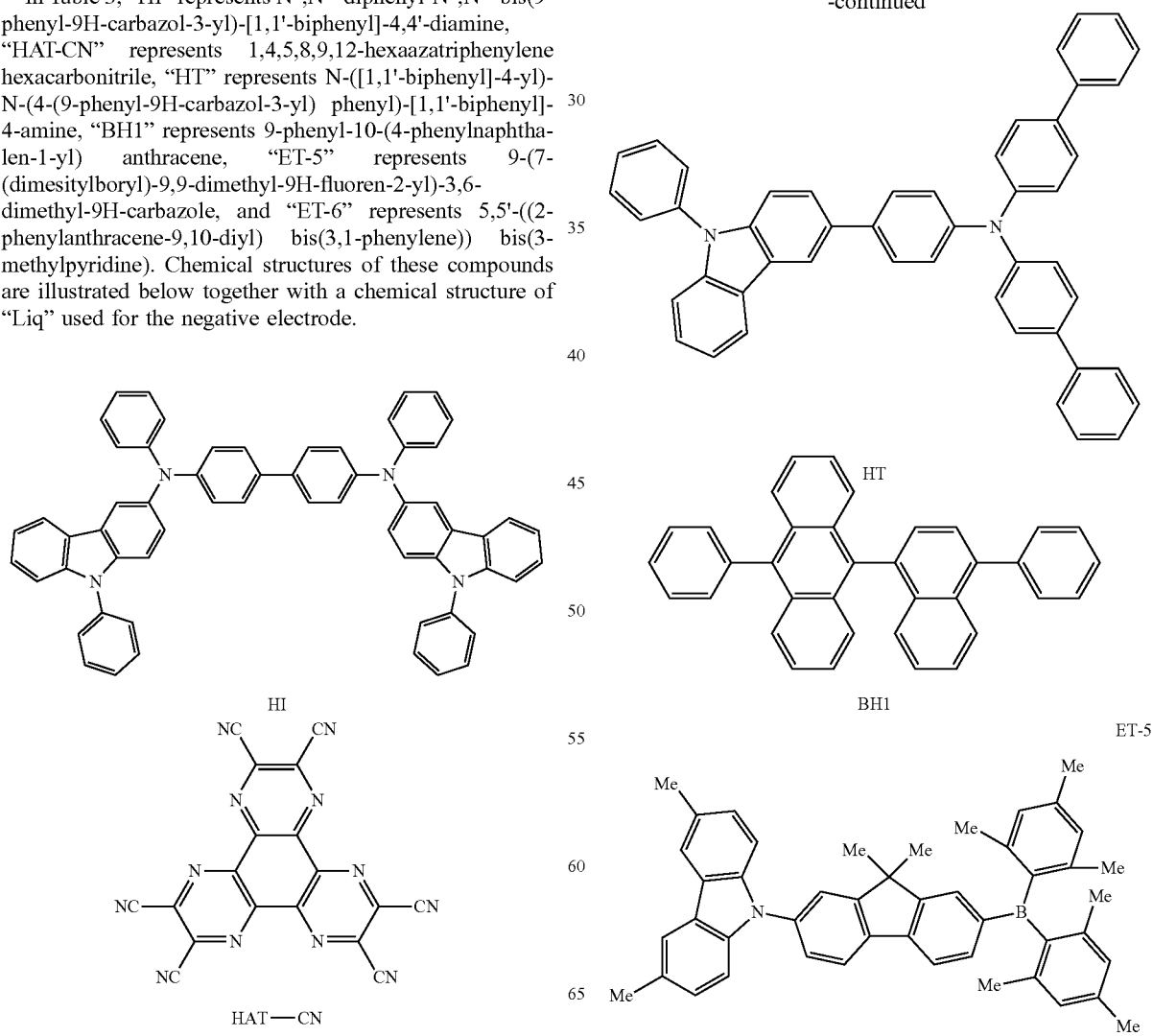

-continued

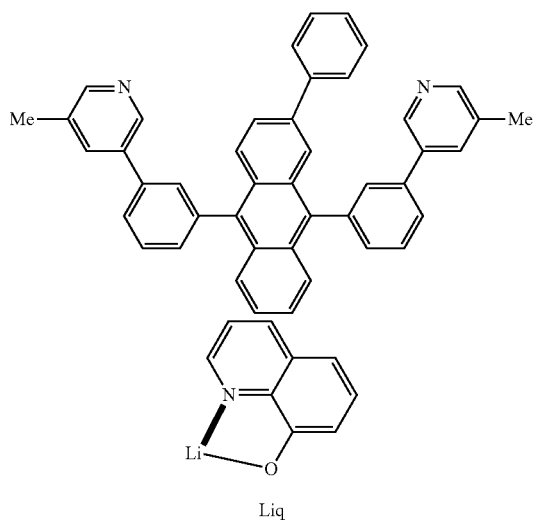

Liq

Example 1

<Element in which Compound (1A-1) is Used as Dopant of Light Emitting Layer>

A glass substrate (manufactured by Opto Science, Inc.) having a size of 26 mm×28 mm×0.7 mm, obtained by forming a film of ITO having a thickness of 180 nm by sputtering and polishing the ITO film to 150 nm, was used as a transparent supporting substrate. This transparent supporting substrate was fixed to a substrate holder of a commercially available vapor deposition apparatus (manufactured by Choshu Industry Co., Ltd.), and a vapor deposition crucible made of tantalum and containing HI, a vapor deposition crucible made of tantalum and containing HAT-CN, a vapor deposition crucible made of tantalum and containing HT, a vapor deposition crucible made of tantalum and containing BH1, a vapor deposition crucible made of tantalum and containing compound (1A-1) of the present invention, a vapor deposition crucible made of tantalum and containing ET-5, a vapor deposition crucible made of tantalum and containing ET-6, a vapor deposition crucible made of aluminum nitride and containing Liq, a vapor deposition crucible made of aluminum nitride and containing magnesium, and a vapor deposition crucible made of aluminum nitride and containing silver were mounted in the apparatus.

Layers as described below were formed sequentially on the ITO film of the transparent supporting substrate. The pressure in a vacuum chamber was reduced to $2.0 \times 10^{-4}$ Pa. First, the vapor deposition crucible containing HI was heated, and vapor deposition was performed so as to obtain a film thickness of 40 nm. Subsequently, the vapor deposition crucible containing HAT-CN was heated, and vapor deposition was performed so as to obtain a film thickness of 5 nm. Furthermore, the vapor deposition crucible containing HT was heated, and vapor deposition was performed so as to obtain a film thickness of 25 nm. Thus, a hole injection layer and a hole transport layer each formed of three layers were formed. Subsequently, the vapor deposition crucible containing BH1 and the vapor deposition crucible containing compound (1A-1) of the present invention were simultaneously heated, and vapor deposition was performed so as to obtain a film thickness of 20 nm. Thus, a light emitting layer was formed. A vapor deposition rate was adjusted such that a weight ratio between compound BH1 and compound (1A-1) of the present invention was approximately 95:5. Subsequently, the vapor deposition crucible containing ET-5 was heated, and vapor deposition was performed so as to obtain a film thickness of 5 nm. Subsequently, the vapor deposition crucible containing ET-6 was heated, and vapor deposition was performed so as to obtain a film thickness of 25 nm. Thus, an electron transport layer formed of two layers was formed. The vapor deposition rate for each layer was 0.01 to 1 nm/sec.

Thereafter, the vapor deposition crucible containing Liq was heated, and vapor deposition was performed at a vapor deposition rate of 0.01 to 0.1 nm/sec so as to obtain a film thickness of 1 nm. Subsequently, the vapor deposition crucible containing magnesium and the vapor deposition crucible containing silver were simultaneously heated, and vapor deposition was performed so as to obtain a film thickness of 100 nm. Thus, a negative electrode was formed, and an organic electroluminescent element was obtained. At this time, the vapor deposition rate was adjusted in a range between 0.1 nm to 10 nm/sec such that the ratio of the numbers of atoms between magnesium and silver was 10:1.

When a direct current voltage was applied to the ITO electrode as a positive electrode and the magnesium/silver electrode as a negative electrode, blue light emission having a peak top at about 456 nm was obtained. At this time, the CIE chromaticity was (x, y)=(0.137, 0.088), and the external quantum efficiency at luminance of 1000 cd/m² was 7.17%.

Comparative Example 1

<Dopant Material: Compound (1-2680) Described in WO 2015/102118 A>

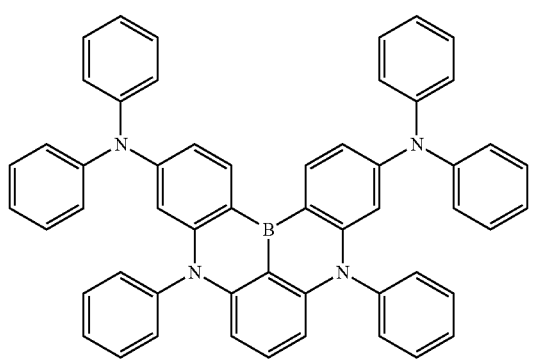

(1-2680)

An organic EL element was obtained by a method in accordance with the method in Example 1 except that compound (1A-1) as a dopant material of a light emitting layer was replaced with compound (1-2680) described in WO 2015/102118 A. When a direct current voltage was applied to the two electrodes, blue light emission having a peak top at about 455 nm was obtained. At this time, the CIE chromaticity was (x, y)=(0.142, 0.051), and the external quantum efficiency was 6.14%.

Comparative Example 2

<Dopant Material: Compound (1-2679) Described in WO 2015/102118 A>

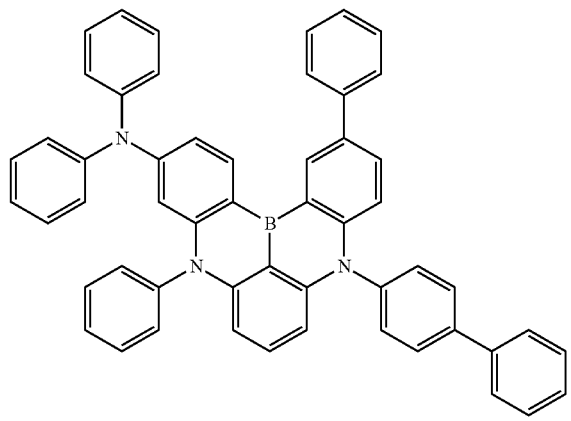

(1-2679)

An organic EL element was obtained by a method in accordance with the method in Example 1 except that compound (1A-1) as a dopant material of a light emitting layer was replaced with compound (1-2679) described in WO 2015/102118 A. When a direct current voltage was applied to the two electrodes, blue light emission having a peak top at about 463 nm was obtained. At this time, the CIE chromaticity was (x, y)=(0.129, 0.084), and the external quantum efficiency was 6.42%.

Comparative Example 3

<Dopant Material: Compound (1-422) Described in WO 2015/102118 A>

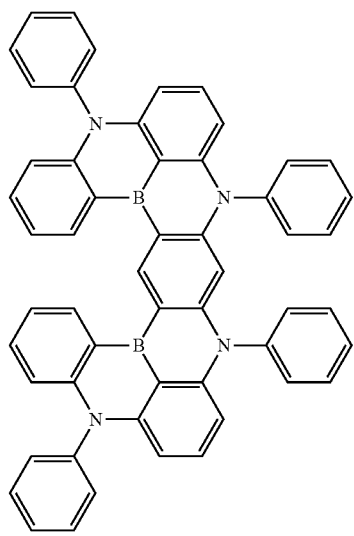

(1-422)

An organic EL element was obtained by a method in accordance with the method in Example 1 except that compound (1A-1) as a dopant material of a light emitting layer was replaced with compound (1-422) described in WO 2015/102118 A. When a direct current voltage was applied to the two electrodes, blue light emission having a peak top at about 464 nm was obtained. At this time, the CIE chromaticity was (x, y)=(0.127, 0.094), and the external quantum efficiency was 5.66%.

Comparative Example 4

<Dopant Material: Compound (1-1145) Described in WO 2015/102118 A>

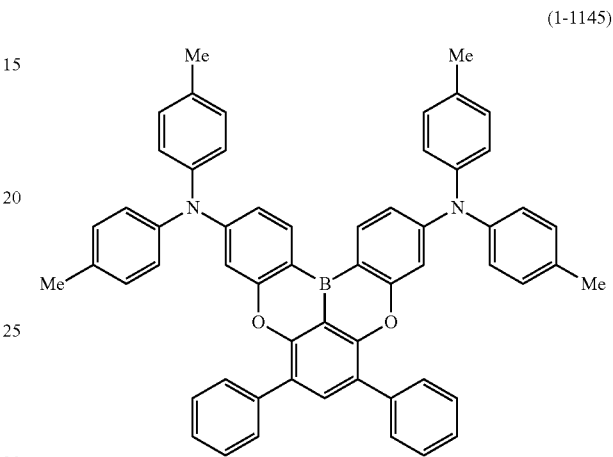

(1-1145)

An organic EL element was obtained by a method in accordance with the method in Example 1 except that compound (1A-1) as a dopant material of a light emitting layer was replaced with compound (1-1145) described in WO 2015/102118 A. When a direct current voltage was applied to the two electrodes, blue light emission having a peak top at about 451 nm was obtained. At this time, the CIE chromaticity was (x, y)=(0.146, 0.059), and the external quantum efficiency was 6.50%.

Comparative Example 5

<Dopant Material: Compound (1-2681) Described in WO 2015/102118 A>

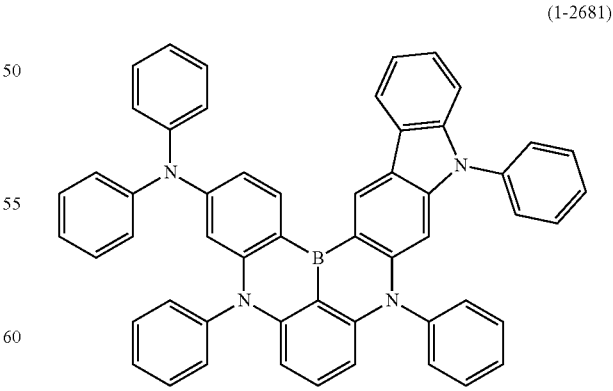

(1-2681)

An organic EL element was obtained by a method in accordance with the method in Example 1 except that compound (1A-1) as a dopant material of a light emitting layer was replaced with compound (1-2681) described in WO 2015/102118 A. When a direct current voltage was applied to the two electrodes, blue light emission having a peak top at about 465 nm was obtained. At this time, the CIE chromaticity was (x, y)=(0.127, 0.091), and the external quantum efficiency was 5.25%.

Comparative Example 6

<Dopant Material: Compound (1-2682) Described in WO 2015/102118 A>

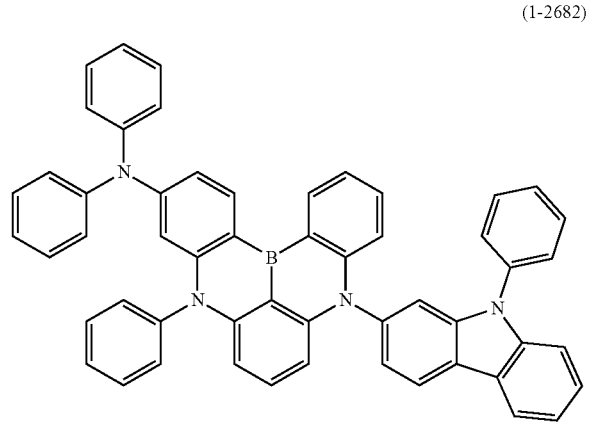 [SMILES: c1ccc(N(c2ccccc2)c2ccc3c(c2)N(c2ccccc2)c2cccc4c2B3c2ccccc2N4c2ccc3c4ccccc4n(-c4ccccc4)c3c2)cc1]

(1-2682)

An organic EL element was obtained by a method in accordance with the method in Example 1 except that compound (1A-1) as a dopant material of a light emitting layer was replaced with compound (1-2682) described in WO 2015/102118 A. When a direct current voltage was applied to the two electrodes, blue light emission having a peak top at about 457 nm was obtained. At this time, the CIE chromaticity was (x, y)=(0.139, 0.059), and the external quantum efficiency was 5.83%.

Comparative Example 7

<Dopant Material: Compound (1-2626) Described in WO 2015/102118 A>

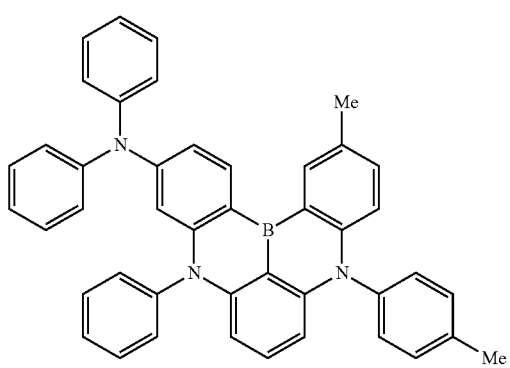

(1-2626)

An organic EL element was obtained by a method in accordance with the method in Example 1 except that compound (1A-1) as a dopant material of a light emitting layer was replaced with compound (1-2626) described in WO 2015/102118 A. When a direct current voltage was applied to the two electrodes, blue light emission having a peak top at about 462 nm was obtained. At this time, the CIE chromaticity was (x, y)=(0.131, 0.078), and the external quantum efficiency was 5.66%.

Comparative Example 8

<Dopant Material: Compound (1-2683) Described in WO 2015/102118 A>

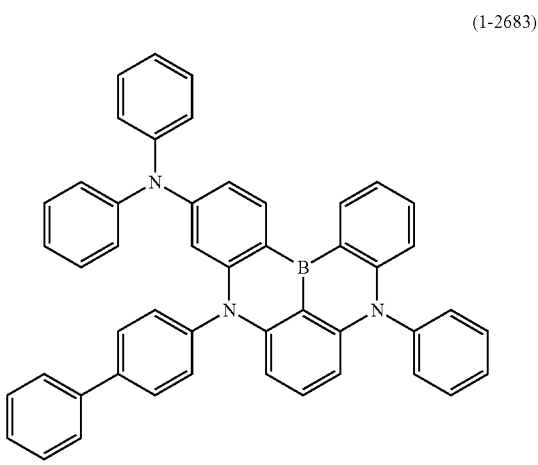 [SMILES: c1ccc(-c2ccc(N3c4cc(N(c5ccccc5)c5ccccc5)ccc4B4c5ccccc5N(c5ccccc5)c5cccc3c54)cc2)cc1]

(1-2683)

An organic EL element was obtained by a method in accordance with the method in Example 1 except that compound (1A-1) as a dopant material of a light emitting layer was replaced with compound (1-2683) described in WO 2015/102118 A. When a direct current voltage was applied to the two electrodes, blue light emission having a peak top at about 456 nm was obtained. At this time, the CIE chromaticity was (x, y)=(0.140, 0.057), and the external quantum efficiency was 5.64%.

Comparative Example 9

<Dopant Material: Compound (1-2699) Described in WO 2015/102118 A>

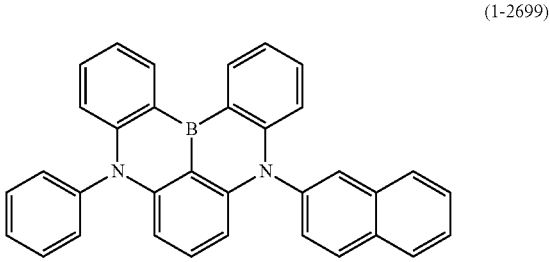 [SMILES: c1ccc(N2c3ccccc3B3c4ccccc4N(c4ccc5ccccc5c4)c4cccc2c43)cc1]

(1-2699)

An organic EL element was obtained by a method in accordance with the method in Example 1 except that compound (1A-1) as a dopant material of a light emitting layer was replaced with compound (1-2699) described in WO 2015/102118 A. When a direct current voltage was applied to the two electrodes, blue light emission having a peak top at about 459 nm was obtained. At this time, the CIE chromaticity was (x, y)=(0.133, 0.091), and the external quantum efficiency was 5.18%.

Comparative Example 10

<Dopant Material: Compound (1-2676) Described in WO 2015/102118 A>

<Element in which Compound (1-2676) Described in Prior Art Literature is Used as Dopant Material of Light Emitting Layer>

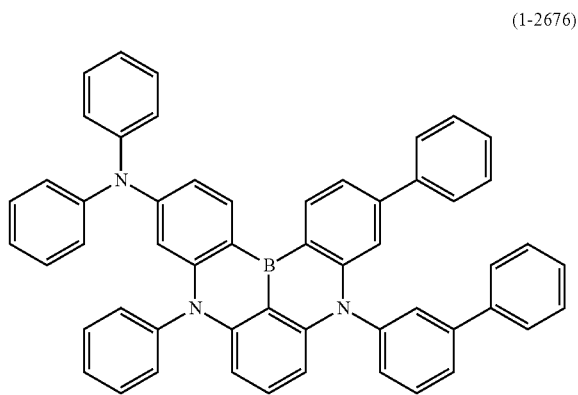 [SMILES: c1ccc(-c2cccc(N3c4cc(-c5ccccc5)ccc4B4c5ccc(N(c6ccccc6)c6ccccc6)cc5N(c5ccccc5)c5cccc3c54)c2)cc1]

(1-2676)

An organic EL element was obtained by a method in accordance with the method in Example 1 except that compound (1A-1) as a dopant material of a light emitting layer was replaced with compound (1-2676) described in WO 2015/102118 A. When a direct current voltage was applied to the two electrodes, blue light emission having a peak top at about 459 nm was obtained. At this time, the CIE chromaticity was (x, y)=(0.124, 0.111), and the external quantum efficiency was 6.82%.

The above results are summarized in Table 4.

TABLE 4

| Dopant | | Emission wavelength (nm) | CIE chromaticity (x, y) | External quantum efficiency (%) |
|---|---|---|---|---|
| Example 1 | Compound (1A-1) | 456 | 0.137, 0.088 | 7.17 |
| Comparative Example 1 | Compound (1-2680) | 455 | 0.142, 0.051 | 6.14 |

TABLE 4-continued

| Dopant | | Emission wavelength (nm) | CIE chromaticity (x, y) | External quantum efficiency (%) |
|---|---|---|---|---|
| Comparative Example 2 | Compound (1-2679) | 463 | 0.129, 0.084 | 6.42 |
| Comparative Example 3 | Compound (1-422) | 464 | 0.127, 0.094 | 5.66 |
| Comparative Example 4 | Compound (1-1145) | 451 | 0.146, 0.059 | 6.50 |
| Comparative Example 5 | Compound (1-2681) | 465 | 0.127, 0.091 | 5.25 |
| Comparative Example 6 | Compound (1-2682) | 457 | 0.139, 0.059 | 5.83 |
| Comparative Example 7 | Compound (1-2626) | 462 | 0.131, 0.078 | 5.66 |
| Comparative Example 8 | Compound (1-2683) | 456 | 0.140, 0.057 | 5.64 |
| Comparative Example 9 | Compound (1-2699) | 459 | 0.133, 0.091 | 5.18 |
| Comparative Example 10 | Compound (1-2676) | 459 | 0.124, 0.111 | 6.82 |

<Evaluation of Organic EL Element (2)>

Organic EL elements according to Examples 2 to 13 and Comparative Examples 11 to 24 were manufactured. A voltage (V), an EL emission wavelength (nm), and an external quantum efficiency (%) as characteristics during light emission of 1000 cd/m$^2$ were measured for each of the organic EL elements. Subsequently, time to retain luminance of 90% or more of initial luminance was measured when constant current driving was performed with a current density of 10 mA/cm$^2$. Hereinafter, Examples and Comparative Examples will be described in detail.

The following Tables 5 to 7 illustrate a material configuration of each of layers in the organic EL elements thus manufactured. Note that dopant materials in Comparative Examples 11 to 24 are all the compounds disclosed in WO 2015/102118 A.

TABLE 5

| | Hole injection layer | | Hole transport layer | Light emitting layer (25 nm) | | Electron transport layer | | Negative electrode |
|---|---|---|---|---|---|---|---|---|
| | First layer (40 nm) | Second layer (5 nm) | (25 nm) | Host | Dopant | First layer (5 nm) | Second layer (25 nm) | (1 nm/100 nm) |
| Example 2 | HI | HAT-CN | HT | BH1 | Compound (1A-1) | ET5 | ET6 + Liq | Liq/MgAg |
| Example 3 | HI | HAT-CN | HT | BH1 | Compound (1A-3) | ET5 | ET6 + Liq | Liq/MgAg |
| Example 4 | HI | HAT-CN | HT | BH1 | Compound (1A-25) | ET5 | ET6 + Liq | Liq/MgAg |
| Example 5 | HI | HAT-CN | HT | BH1 | Compound (1B-1) | ET5 | ET6 + Liq | Liq/MgAg |
| Example 6 | HI | HAT-CN | HT | BH1 | Compound (1B-10) | ET5 | ET6 + Liq | Liq/MgAg |
| Comparative Example 11 | HI | HAT-CN | HT | BH1 | Compound (1-10) | ET5 | ET6 + Liq | Liq/MgAg |
| Comparative Example 12 | HI | HAT-CN | HT | BH1 | Compound (1-100) | ET5 | ET6 + Liq | Liq/MgAg |
| Comparative Example 13 | HI | HAT-CN | HT | BH1 | Compound (1-141) | ET5 | ET6 + Liq | Liq/MgAg |

TABLE 5-continued

| | Hole injection layer | | Hole transport layer | Light emitting layer (25 nm) | | Electron transport layer | | Negative electrode |
|---|---|---|---|---|---|---|---|---|
| | First layer (40 nm) | Second layer (5 nm) | (25 nm) | Host | Dopant | First layer (5 nm) | Second layer (25 nm) | (1 nm/100 nm) |
| Comparative Example 14 | HI | HAT-CN | HT | BH1 | Compound (1-176) | ET5 | ET6 + Liq | Liq/MgAg |
| Comparative Example 15 | HI | HAT-CN | HT | BH1 | Compound (1-447) | ET5 | ET6 + Liq | Liq/MgAg |
| Comparative Example 16 | HI | HAT-CN | HT | BH1 | Compound (1-2623) | ET5 | ET6 + Liq | Liq/MgAg |
| Comparative Example 17 | HI | HAT-CN | HT | BH1 | Compound (1-1201) | ET5 | ET6 + Liq | Liq/MgAg |
| Comparative Example 18 | HI | HAT-CN | HT | BH1 | Compound (1-1210) | ET5 | ET6 + Liq | Liq/MgAg |
| Comparative Example 19 | HI | HAT-CN | HT | BH1 | Compound (1-79) | ET5 | ET6 + Liq | Liq/MgAg |
| Comparative Example 20 | HI | HAT-CN | HT | BH1 | Compound (1-1006) | ET5 | ET6 + Liq | Liq/MgAg |
| Comparative Example 21 | HI | HAT-CN | HT | BH1 | Compound (1-2305) | ET5 | ET6 + Liq | Liq/MgAg |
| Comparative Example 22 | HI | HAT-CN | HT | BH1 | Compound (1-1203) | ET5 | ET6 + Liq | Liq/MgAg |
| Example 7 | HI | HAT-CN | HT | BH1 | Compound (1A-1) | ET5 | ET6 + Liq | Liq/MgAg |
| Example 8 | HI | HAT-CN | HT | BH1 | Compound (1B-1) | ET5 | ET6 + Liq | Liq/MgAg |
| Comparative Example 23 | HI | HAT-CN | HT | BH1 | Compound (1-2679) | ET5 | ET6 + Liq | Liq/MgAg |
| Comparative Example 24 | HI | HAT-CN | HT | BH1 | Compound (1-1203) | ET5 | ET6 + Liq | Liq/MgAg |
| Example 9 | HI | HAT-CN | HT | BH1 | Compound (1B-1) | ET5 | ET6 + Liq | Liq/MgAg |
| Example 10 | HI | HAT-CN | HT | BH1 | Compound (1A-1) | ET5 | ET6 + Liq | Liq/MgAg |
| Example 11 | HI | HAT-CN | HT | BH1 | Compound (1B-1) | ET5 | ET6 + Liq | Liq/MgAg |

\* Host:dopant = 98:2 (weight ratio) in Examples 2 to 6 and Comparative Examples 11 to 22
\* Host:dopant = 95:5 (weight ratio) in Examples 7 and 8 and Comparative Examples 23 and 24
\* Host:dopant = 92:8 (weight ratio) in Example 9
\* Host:dopant = 90:10 (weight ratio) in Examples 10 and 11

TABLE 6

| | Hole injection layer | | Hole transport layer | | Light emitting layer (25 nm) | | Electron transport layer | Negative electrode |
|---|---|---|---|---|---|---|---|---|
| | First layer (40 nm) | Second layer (5 nm) | First layer (15 nm) | Second layer (10 nm) | Host | Dopant | (30 nm) | (1 nm/100 nm) |
| Example 12 | HI | HAT-CN | HT | HT2 | BH1 | Compound (1A-1) | ET7 + Liq | Liq/MgAg |

\* Host:dopant = 98:2 (weight ratio) in Example 12

TABLE 7

| | Hole injection layer | | Hole transport layer | | Light emitting layer (25 nm) | | Electron transport layer | | Negative electrode |
|---|---|---|---|---|---|---|---|---|---|
| | First layer (40 nm) | Second layer (5 nm) | First layer (15 nm) | Second layer (10 nm) | Host | Dopant | First layer (5 nm) | Second layer (25 nm) | (1 nm/100 nm) |
| Example 13 | HI | HAT-CN | HT | HT2 | BH1 | Compound (1A-1) | ET8 | ET9 + Liq | Liq/MgAg |

* Host:dopant = 98:2 (weight ratio) in Example 13

In Tables 5 to 7, "HI", "HAT-CN", "HT", "BH1", "ET5", and "ET6" are the same as those described in Table 3. "HT2" represents N,N-bis(4-dibenzo[b,d]furan-4-yl) phenyl)-[1,1':4',1"-terphenyl]-4-amine. "ET7" represents 4-(3-(4-(10-phenylanthracen-9-yl) naphthalen-1-yl) phenyl) pyridine. "ET8" represents 4,6,8,10-tetraphenyl-5,9-dioxy-13b-boranaphtho[3,2,1-de]anthracene. "ET9" represents 3,3'-((2-phenylanthracene-9,10-diyl) bis(4,1-phenylene)) bis(4-methylpyridine).

HT2

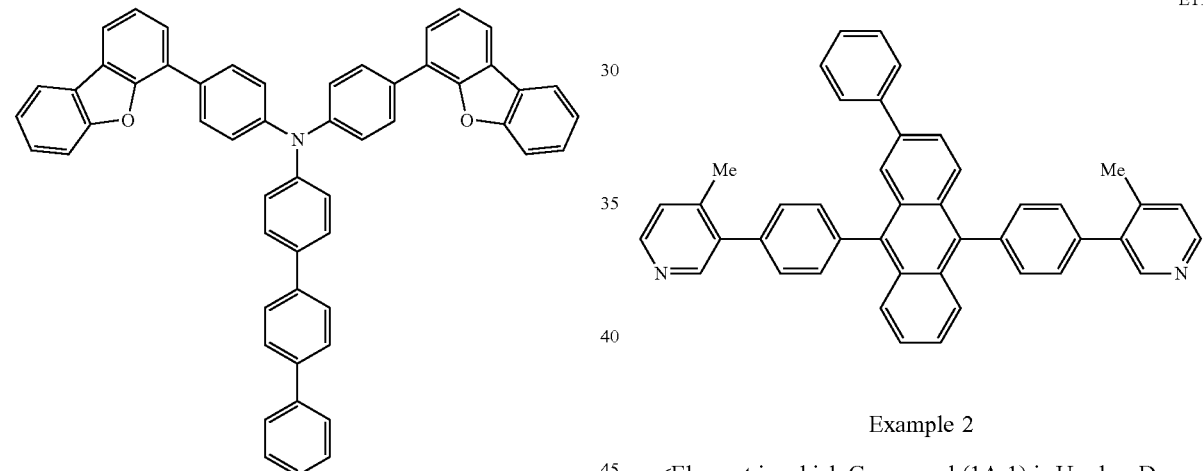

ET8

ET9

ET7

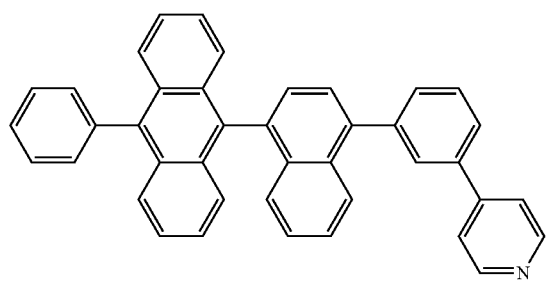

Example 2

<Element in which Compound (1A-1) is Used as Dopant of Light Emitting Layer>

A glass substrate (manufactured by Opto Science, Inc.) having a size of 26 mm×28 mm×0.7 mm, obtained by forming a film of ITO having a thickness of 180 nm by sputtering and polishing the ITO film to 150 nm, was used as a transparent supporting substrate. This transparent supporting substrate was fixed to a substrate holder of a commercially available vapor deposition apparatus (manufactured by Choshu Industry Co., Ltd.), and a vapor deposition crucible made of tantalum and containing HI, a vapor deposition crucible made of tantalum and containing HAT-CN, a vapor deposition crucible made of tantalum and containing HT, a vapor deposition crucible made of tantalum and containing BH1, a vapor deposition crucible made of tantalum and containing compound (1A-1) of the present invention, a vapor deposition crucible made of tantalum and containing ET5, a vapor deposition crucible made of tantalum and containing ET6, a vapor deposition crucible made of aluminum nitride and containing Liq, a vapor deposition crucible made of aluminum nitride and containing magnesium, and a vapor deposition crucible made of aluminum nitride and containing silver were mounted in the apparatus.

Layers as described below were formed sequentially on the ITO film of the transparent supporting substrate. The pressure in a vacuum chamber was reduced to $2.0 \times 10^{-4}$ Pa. First, the vapor deposition crucible containing HI was heated, and vapor deposition was performed so as to obtain a film thickness of 40 nm. Subsequently, the vapor deposition crucible containing HAT-CN was heated, and vapor deposition was performed so as to obtain a film thickness of 5 nm. Furthermore, the vapor deposition crucible containing HT was heated, and vapor deposition was performed so as to obtain a film thickness of 25 nm. Thus, a hole injection layer and a hole transport layer each formed of three layers were formed. Subsequently, the vapor deposition crucible containing BH1 and the vapor deposition crucible containing compound (1A-1) of the present invention were simultaneously heated, and vapor deposition was performed so as to obtain a film thickness of 25 nm. Thus, a light emitting layer was formed. A vapor deposition rate was adjusted such that a weight ratio between BH1 and compound (1A-1) of the present invention was approximately 98:2. Subsequently, the vapor deposition crucible containing ET5 was heated, and vapor deposition was performed so as to obtain a film thickness of 5 nm. Subsequently, the vapor deposition crucible containing ET6 and the vapor deposition crucible containing Liq were simultaneously heated, and vapor deposition was performed so as to obtain a film thickness of 25 nm. Thus, an electron transport layer formed of two layers was formed. The vapor deposition rate was adjusted such that the weight ratio between ET6 and Liq was approximately 1:1. The vapor deposition rate for each layer was 0.01 to 1 nm/sec.

Thereafter, the vapor deposition crucible containing Liq was heated, and vapor deposition was performed at a vapor deposition rate of 0.01 to 0.1 nm/sec so as to obtain a film thickness of 1 nm. Subsequently, the vapor deposition crucible containing magnesium and the vapor deposition crucible containing silver were simultaneously heated, and vapor deposition was performed so as to obtain a film thickness of 100 nm. Thus, a negative electrode was formed, and an organic electroluminescent element was obtained. At this time, the vapor deposition rate was adjusted in a range between 0.1 nm to 10 nm/sec such that the ratio of the numbers of atoms between magnesium and silver was 10:1.

Characteristics during light emission of 1000 cd/m$^2$ were measured using the ITO electrode as a positive electrode and the Liq/magnesium+silver electrode as a negative electrode. As a result, a driving voltage was 3.71 V, an external quantum efficiency was 7.13% (blue light emission with a wavelength of about 456 nm), and the CIE chromaticity at this time was (x, y)=(0.138, 0.083). In addition, a constant current driving test was performed at a current density of 10 mA/cm$^2$. As a result, time to retain luminance of 90% or more of initial luminance was 134 hours.

Example 3

<Element in which Compound (1A-3) is Used as Dopant of Light Emitting Layer>

An organic EL element was obtained by a method in accordance with the method in Example 2 except that compound (1A-1) as a dopant of a light emitting layer was replaced with compound (1A-3). Characteristics were measured similarly. As a result, a driving voltage was 3.61 V, an external quantum efficiency was 7.75% (blue light emission with a wavelength of about 465 nm), and the CIE chroma- ticity at this time was (x, y)=(0.128, 0.127). Time to retain luminance of 90% or more of initial luminance was 169 hours.

Example 4

<Element in which Compound (1A-25) is Used as Dopant of Light Emitting Layer>

An organic EL element was obtained by a method in accordance with the method in Example 2 except that compound (1A-1) as a dopant of a light emitting layer was replaced with compound (1A-25). Characteristics were measured similarly. As a result, a driving voltage was 3.86 V, an external quantum efficiency was 6.83% (blue light emission with a wavelength of about 450 nm), and the CIE chromaticity at this time was (x, y)=(0.144, 0.062). Time to retain luminance of 90% or more of initial luminance was 115 hours.

Example 5

<Element in which Compound (1B-1) is Used as Dopant of Light Emitting Layer>

An organic EL element was obtained by a method in accordance with the method in Example 2 except that compound (1A-1) as a dopant of a light emitting layer was replaced with compound (1B-1). Characteristics were measured similarly. As a result, a driving voltage was 4.02 V, an external quantum efficiency was 6.28% (blue light emission with a wavelength of about 449 nm), and the CIE chromaticity at this time was (x, y)=(0.144, 0.067). Time to retain luminance of 90% or more of initial luminance was 105 hours.

Example 6

<Element in which Compound (1B-10) is Used as Dopant of Light Emitting Layer>

An organic EL element was obtained by a method in accordance with the method in Example 2 except that compound (1A-1) as a dopant of a light emitting layer was replaced with compound (1B-10). Characteristics were measured similarly. As a result, a driving voltage was 4.23 V, an external quantum efficiency was 6.42% (blue light emission with a wavelength of about 461 nm), and the CIE chromaticity at this time was (x, y)=(0.129, 0.106). Time to retain luminance of 90% or more of initial luminance was 167 hours.

Comparative Example 11

<Element in which Compound (1-10) Described in WO 2015/102118 A is Used as Dopant of Light Emitting Layer>

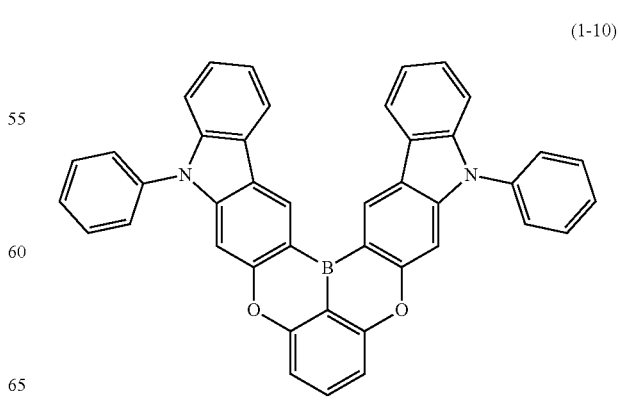

(1-10)

An organic EL element was obtained by a method in accordance with the method in Example 2 except that compound (1A-1) as a dopant of a light emitting layer was replaced with compound (1-10) described in WO 2015/102118 A. Characteristics were measured similarly. As a result, a driving voltage was 5.40 V, an external quantum efficiency was 2.00% (blue light emission with a wavelength of about 445 nm), and the CIE chromaticity at this time was (x, y)=(0.151, 0.075). Time to retain luminance of 90% or more of initial luminance was 31 hours.

Comparative Example 12

<Element in which Compound (1-100) Described in WO 2015/102118 A is Used as Dopant of Light Emitting Layer>

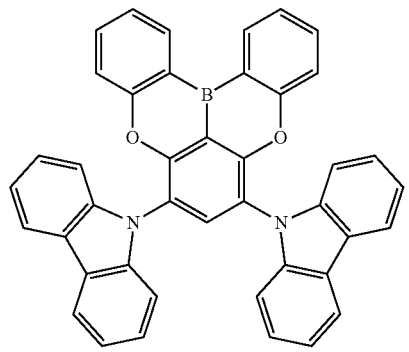

(1-100)

An organic EL element was obtained by a method in accordance with the method in Example 2 except that compound (1A-1) as a dopant of a light emitting layer was replaced with compound (1-100) described in WO 2015/102118 A. Characteristics were measured similarly. As a result, a driving voltage was 4.72 V, an external quantum efficiency was 2.81% (blue light emission with a wavelength of about 456 nm), and the CIE chromaticity at this time was (x, y)=(0.144, 0.092). Time to retain luminance of 90% or more of initial luminance was 57 hours.

Comparative Example 13

<Element in which Compound (1-141) Described in WO 2015/102118 A is Used as Dopant of Light Emitting Layer>

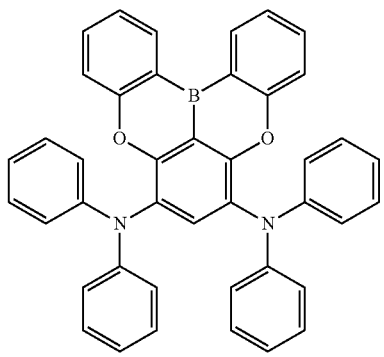

(1-141)

An organic EL element was obtained by a method in accordance with the method in Example 2 except that compound (1A-1) as a dopant of a light emitting layer was replaced with compound (1-141) described in WO 2015/102118 A. Characteristics were measured similarly. As a result, a driving voltage was 3.81 V, an external quantum efficiency was 4.33% (blue light emission with a wavelength of about 510 nm), and the CIE chromaticity at this time was (x, y)=(0.217, 0.537). Time to retain luminance of 90% or more of initial luminance was 87 hours.

Comparative Example 14

<Element in which Compound (1-176) described in WO 2015/102118 A is Used as Dopant of Light Emitting Layer>

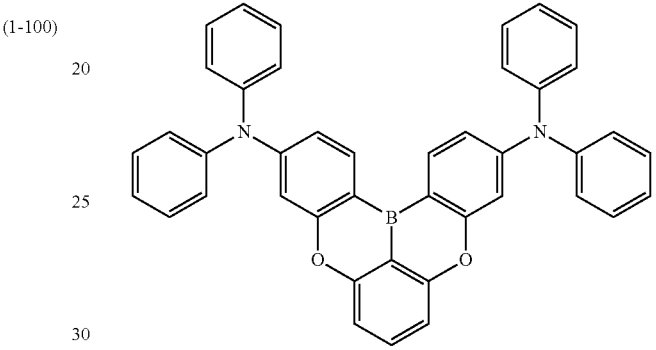

(1-176)

An organic EL element was obtained by a method in accordance with the method in Example 2 except that compound (1A-1) as a dopant of a light emitting layer was replaced with compound (1-176) described in WO 2015/102118 A. Characteristics were measured similarly. As a result, a driving voltage was 4.88 V, an external quantum efficiency was 2.94% (blue light emission with a wavelength of about 449 nm), and the CIE chromaticity at this time was (x, y)=(0.150, 0.063). Time to retain luminance of 90% or more of initial luminance was 27 hours.

Comparative Example 15

<Element in which Compound (1-447) Described in WO 2015/102118 A is Used as Dopant of Light Emitting Layer>

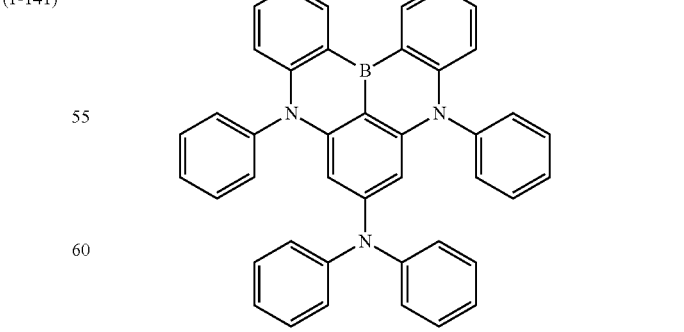

(1-447)

An organic EL element was obtained by a method in accordance with the method in Example 2 except that compound (1A-1) as a dopant of a light emitting layer was replaced with compound (1-447) described in WO 2015/102118 A. Characteristics were measured similarly. As a result, a driving voltage was 4.89 V, an external quantum efficiency was 4.24% (blue light emission with a wavelength of about 449 nm), and the CIE chromaticity at this time was (x, y)=(0.146, 0.048). Time to retain luminance of 90% or more of initial luminance was 72 hours.

Comparative Example 16

<Element in which Compound (1-2623) Described in WO 2015/102118 A is Used as Dopant of Light Emitting Layer>

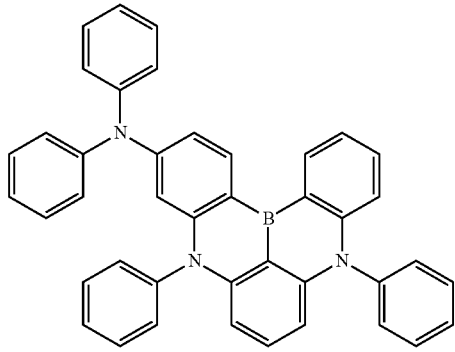

(1-2623)

An organic EL element was obtained by a method in accordance with the method in Example 2 except that compound (1A-1) as a dopant of a light emitting layer was replaced with compound (1-2623) described in WO 2015/102118 A. Characteristics were measured similarly. As a result, a driving voltage was 4.54 V, an external quantum efficiency was 5.07% (blue light emission with a wavelength of about 456 nm), and the CIE chromaticity at this time was (x, y)=(0.139, 0.061). Time to retain luminance of 90% or more of initial luminance was 82 hours.

Comparative Example 17

<Element in which Compound (1-1201) Described in WO 2015/102118 A is Used as Dopant of Light Emitting Layer>

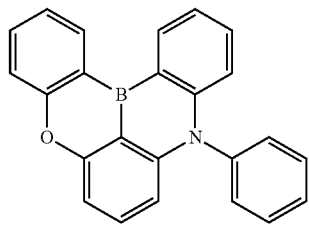

(1-1201)

An organic EL element was obtained by a method in accordance with the method in Example 2 except that compound (1A-1) as a dopant of a light emitting layer was replaced with compound (1-1201) described in WO 2015/102118 A. Characteristics were measured similarly. As a result, a driving voltage was 4.38 V, an external quantum efficiency was 3.60% (blue light emission with a wavelength of about 439 nm), and the CIE chromaticity at this time was (x, y)=(0.153, 0.042). Time to retain luminance of 90% or more of initial luminance was 57 hours.

Comparative Example 18

<Element in which Compound (1-1210) Described in WO 2015/102118 A is Used as Dopant of Light Emitting Layer>

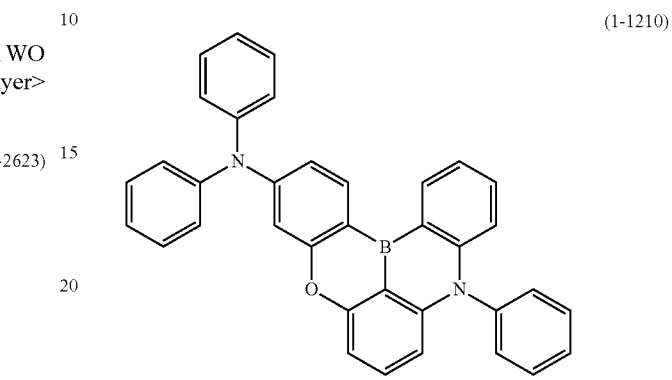

(1-1210)

An organic EL element was obtained by a method in accordance with the method in Example 2 except that compound (1A-1) as a dopant of a light emitting layer was replaced with compound (1-1210) described in WO 2015/102118 A. Characteristics were measured similarly. As a result, a driving voltage was 4.42 V, an external quantum efficiency was 4.38% (blue light emission with a wavelength of about 439 nm), and the CIE chromaticity at this time was (x, y)=(0.155, 0.029). Time to retain luminance of 90% or more of initial luminance was 47 hours.

Comparative Example 19

<Element in which Compound (1-79) Described in WO 2015/102118 A is Used as Dopant of Light Emitting Layer>

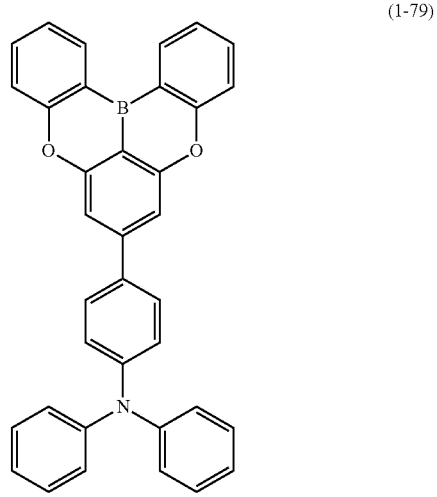 [SMILES: c1ccc(N(c2ccccc2)c2ccc(-c3cc4c5c(c3)Oc3ccccc3B5c3ccccc3O4)cc2)cc1]

(1-79)

An organic EL element was obtained by a method in accordance with the method in Example 2 except that compound (1A-1) as a dopant of a light emitting layer was replaced with compound (1-79) described in WO 2015/102118 A. Characteristics were measured similarly. As a result, a driving voltage was 4.20 V, an external quantum efficiency was 3.55% (blue light emission with a wavelength of about 445 nm), and the CIE chromaticity at this time was (x, y)=(0.148, 0.065). Time to retain luminance of 90% or more of initial luminance was 54 hours.

Comparative Example 20

<Element in which Compound (1-1006) Described in WO 2015/102118 A is Used as Dopant of Light Emitting Layer>

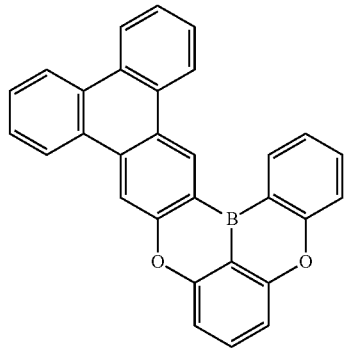

(1-1006)

An organic EL element was obtained by a method in accordance with the method in Example 2 except that compound (1A-1) as a dopant of a light emitting layer was replaced with compound (1-1006) described in WO 2015/102118 A. Characteristics were measured similarly. As a result, a driving voltage was 4.81 V, an external quantum efficiency was 2.04% (blue light emission with a wavelength of about 457 nm), and the CIE chromaticity at this time was (x, y)=(0.148, 0.117). Time to retain luminance of 90% or more of initial luminance was 49 hours.

Comparative Example 21

<Element in which Compound (1-2305) Described in WO 2015/102118 A is Used as Dopant of Light Emitting Layer>

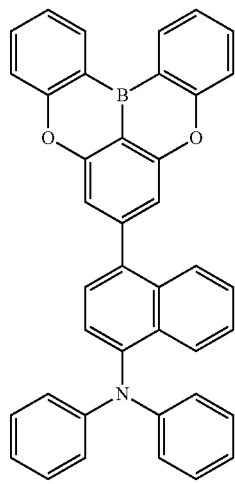

(1-2305)

An organic EL element was obtained by a method in accordance with the method in Example 2 except that compound (1A-1) as a dopant of a light emitting layer was replaced with compound (1-2305) described in WO 2015/102118 A. Characteristics were measured similarly. As a result, a driving voltage was 3.89 V, an external quantum efficiency was 4.50% (blue light emission with a wavelength of about 459 nm), and the CIE chromaticity at this time was (x, y)=(0.142, 0.113). Time to retain luminance of 90% or more of initial luminance was 79 hours.

Comparative Example 22

<Element in which Compound (1-1203) Described in WO 2015/102118 A is Used as Dopant of Light Emitting Layer>

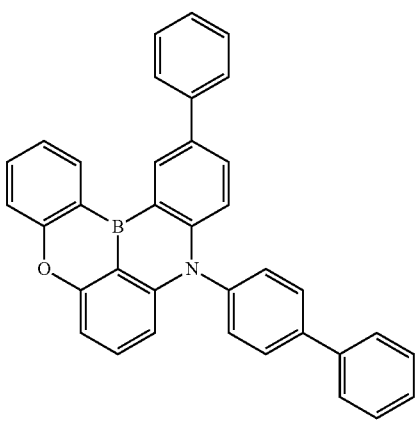

(1-1203)

An organic EL element was obtained by a method in accordance with the method in Example 2 except that compound (1A-1) as a dopant of a light emitting layer was replaced with compound (1-1203) described in WO 2015/102118 A. Characteristics were measured similarly. As a result, a driving voltage was 4.69 V, an external quantum efficiency was 4.12% (blue light emission with a wavelength of about 448 nm), and the CIE chromaticity at this time was (x, y)=(0.145, 0.056). Time to retain luminance of 90% or more of initial luminance was 69 hours.

Example 7

<Element in which Compound (1A-1) is Used as Dopant of Light Emitting Layer>

An organic EL element was obtained by a method in accordance with the method in Example 2 except that the vapor deposition rate was adjusted such that the weight ratio between BH1 and compound (1A-1) of the present invention was about 95:5 in a light-emitting layer. Characteristics were measured similarly. As a result, a driving voltage was 3.97 V, an external quantum efficiency was 6.96% (blue light emission with a wavelength of about 457 nm), and the CIE chromaticity at this time was (x, y)=(0.135, 0.096). Time to retain luminance of 90% or more of initial luminance was 170 hours.

Example 8

<Element in which Compound (1B-1) is Used as Dopant of Light Emitting Layer>

An organic EL element was obtained by a method in accordance with the method in Example 7 except that compound (1A-1) as a dopant of a light emitting layer was replaced with compound (1B-1). Characteristics were measured similarly. As a result, a driving voltage was 3.88 V, an external quantum efficiency was 6.31% (blue light emission with a wavelength of about 452 nm), and the CIE chromaticity at this time was (x, y)=(0.142, 0.076). Time to retain luminance of 90% or more of initial luminance was 125 hours.

Comparative Example 23

<Element in which Compound (1-2679) Described in WO 2015/102118 A is Used as Dopant of Light Emitting Layer>

(1-2679)

An organic EL element was obtained by a method in accordance with the method in Example 7 except that compound (1A-1) as a dopant of a light emitting layer was replaced with compound (1-2679) described in WO 2015/102118 A. Characteristics were measured similarly. As a result, a driving voltage was 4.26 V, an external quantum efficiency was 6.16% (blue light emission with a wavelength of about 465 nm), and the CIE chromaticity at this time was (x, y)=(0.125, 0.103). Time to retain luminance of 90% or more of initial luminance was 57 hours.

Comparative Example 24

<Element in which Compound (1-1203) Described in WO 2015/102118 A is Used as Dopant of Light Emitting Layer>

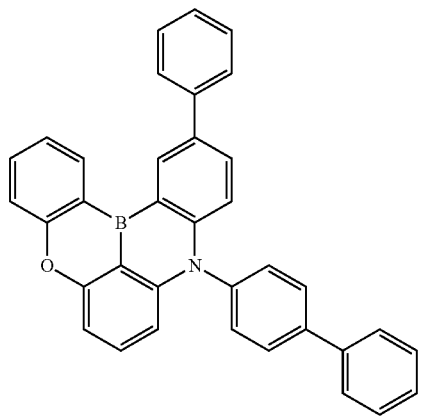

(1-1203)

An organic EL element was obtained by a method in accordance with the method in Example 7 except that compound (1A-1) as a dopant of a light emitting layer was replaced with compound (1-1203) described in WO 2015/102118 A. Characteristics were measured similarly. As a result, a driving voltage was 4.01 V, an external quantum efficiency was 5.37% (blue light emission with a wavelength of about 453 nm), and the CIE chromaticity at this time was (x, y)=(0.141, 0.087). Time to retain luminance of 90% or more of initial luminance was 51 hours.

Example 9

<Element in which Compound (1B-1) is Used as Dopant of Light Emitting Layer>

An organic EL element was obtained by a method in accordance with the method in Example 5 except that the vapor deposition rate was adjusted such that the weight ratio between BH1 and compound (1B-1) of the present invention was about 92:8 in a light-emitting layer. Characteristics were measured similarly. As a result, a driving voltage was 3.76 V, an external quantum efficiency was 6.47% (blue light emission with a wavelength of about 454 nm), and the CIE chromaticity at this time was (x, y)=(0.140, 0.085). Time to retain luminance of 90% or more of initial luminance was 110 hours.

Example 10

<Element in which Compound (1A-1) is Used as Dopant of Light Emitting Layer>

An organic EL element was obtained by a method in accordance with the method in Example 2 except that the vapor deposition rate was adjusted such that the weight ratio between BH1 and compound (1A-1) of the present invention was about 90:10 in a light-emitting layer. Characteristics were measured similarly. As a result, a driving voltage was 3.79 V, an external quantum efficiency was 6.42% (blue light emission with a wavelength of about 459 nm), and the CIE chromaticity at this time was (x, y)=(0.132, 0.112). Time to retain luminance of 90% or more of initial luminance was 110 hours.

Example 11

<Element in which Compound (1B-1) is Used as Dopant of Light Emitting Layer>

An organic EL element was obtained by a method in accordance with the method in Example 10 except that compound (1A-1) as a dopant of a light emitting layer was replaced with compound (1B-1). Characteristics were measured similarly. As a result, a driving voltage was 3.76 V, an external quantum efficiency was 6.23% (blue light emission with a wavelength of about 454 nm), and the CIE chromaticity at this time was (x, y)=(0.140, 0.090). Time to retain luminance of 90% or more of initial luminance was 129 hours.

Example 12

<Element in which Compound (1A-1) is Used as Dopant of Light Emitting Layer>

A glass substrate (manufactured by Opto Science, Inc.) having a size of 26 mm×28 mm×0.7 mm, obtained by forming a film of ITO having a thickness of 180 nm by sputtering and polishing the ITO film to 150 nm, was used as a transparent supporting substrate. This transparent supporting substrate was fixed to a substrate holder of a commercially available vapor deposition apparatus (manufactured by Choshu Industry Co., Ltd.), and a vapor deposition crucible made of tantalum and containing HI, a vapor deposition crucible made of tantalum and containing HAT-CN, a vapor deposition crucible made of tantalum and containing HT, a vapor deposition crucible made of tantalum and containing HT2, a vapor deposition crucible made of tantalum and containing BH1, a vapor deposition crucible made of tantalum and containing compound (1A-1) of the present invention, a vapor deposition crucible made of tantalum and containing ET7, a vapor deposition crucible made of aluminum nitride and containing Liq, a vapor deposition crucible made of aluminum nitride and containing magnesium, and a vapor deposition crucible made of aluminum nitride and containing silver were mounted in the apparatus.

Layers as described below were formed sequentially on the ITO film of the transparent supporting substrate. The pressure in a vacuum chamber was reduced to $2.0\times10^{-4}$ Pa. First, the vapor deposition crucible containing HI was heated, and vapor deposition was performed so as to obtain a film thickness of 40 nm. Subsequently, the vapor deposition crucible containing HAT-CN was heated, and vapor deposition was performed so as to obtain a film thickness of 5 nm. Thus, a hole injection layer formed of two layers was formed. Subsequently, the vapor deposition crucible containing HT was heated, and vapor deposition was performed so as to obtain a film thickness of 15 nm. Subsequently, the vapor deposition crucible containing HT2 was heated, and vapor deposition was performed so as to obtain a film thickness of 10 nm. Thus, a hole transport layer formed of two layers was formed. Subsequently, the vapor deposition crucible containing BH1 and the vapor deposition crucible containing compound (1A-1) of the present invention were simultaneously heated, and vapor deposition was performed so as to obtain a film thickness of 25 nm. Thus, a light emitting layer was formed. A vapor deposition rate was adjusted such that a weight ratio between BH1 and compound (1A-1) of the present invention was approximately 98:2. Subsequently, the vapor deposition crucible containing ET7 and the vapor deposition crucible containing Liq were simultaneously heated, and vapor deposition was performed so as to obtain a film thickness of 30 nm. Thus, an electron transport layer was formed. The vapor deposition rate was adjusted such that the weight ratio between ET7 and Liq was approximately 1:1. The vapor deposition rate for each layer was 0.01 to 1 nm/sec.

Thereafter, the vapor deposition crucible containing Liq was heated, and vapor deposition was performed at a vapor deposition rate of 0.01 to 0.1 nm/sec so as to obtain a film thickness of 1 nm. Subsequently, the vapor deposition crucible containing magnesium and the vapor deposition crucible containing silver were simultaneously heated, and vapor deposition was performed so as to obtain a film thickness of 100 nm. Thus, a negative electrode was formed, and an organic electroluminescent element was obtained. At this time, the vapor deposition rate was adjusted in a range between 0.1 nm to 10 nm/sec such that the ratio of the numbers of atoms between magnesium and silver was 10:1.

Characteristics during light emission of 1000 $cd/m^2$ were measured using the ITO electrode as a positive electrode and the Liq/magnesium+silver electrode as a negative electrode. As a result, a driving voltage was 4.09 V, an external quantum efficiency was 6.51% (blue light emission with a wavelength of about 456 nm), and the CIE chromaticity at this time was (x, y)=(0.135, 0.097). In addition, a constant current driving test was performed at a current density of 10 $mA/cm^2$. As a result, time to retain luminance of 90% or more of initial luminance was 581 hours.

Example 13

<Element in which Compound (1A-1) is Used as Dopant of Light Emitting Layer>

A glass substrate (manufactured by Opto Science, Inc.) having a size of 26 mm×28 mm×0.7 mm, obtained by forming a film of ITO having a thickness of 180 nm by sputtering and polishing the ITO film to 150 nm, was used as a transparent supporting substrate. This transparent supporting substrate was fixed to a substrate holder of a commercially available vapor deposition apparatus (manufactured by Choshu Industry Co., Ltd.), and a vapor deposition crucible made of tantalum and containing HI, a vapor deposition crucible made of tantalum and containing HAT-CN, a vapor deposition crucible made of tantalum and containing HT, a vapor deposition crucible made of tantalum and containing HT2, a vapor deposition crucible made of tantalum and containing BH1, a vapor deposition crucible made of tantalum and containing compound (1A-1) of the present invention, a vapor deposition crucible made of tantalum and containing ET8, a vapor deposition crucible made of tantalum and containing ET9, a vapor deposition crucible made of aluminum nitride and containing Liq, a vapor deposition crucible made of aluminum nitride and containing magnesium, and a vapor deposition crucible made of aluminum nitride and containing silver were mounted in the apparatus.

Layers as described below were formed sequentially on the ITO film of the transparent supporting substrate. The pressure in a vacuum chamber was reduced to $2.0\times10^{-4}$ Pa. First, the vapor deposition crucible containing HI was heated, and vapor deposition was performed so as to obtain a film thickness of 40 nm. Subsequently, the vapor deposition crucible containing HAT-CN was heated, and vapor deposition was performed so as to obtain a film thickness of 5 nm. Thus, a hole injection layer formed of two layers was formed. Subsequently, the vapor deposition crucible containing HT was heated, and vapor deposition was performed so as to obtain a film thickness of 15 nm. Subsequently, the vapor deposition crucible containing HT2 was heated, and vapor deposition was performed so as to obtain a film thickness of 10 nm. Thus, a hole transport layer formed of two layers was formed. Subsequently, the vapor deposition crucible containing BH1 and the vapor deposition crucible containing compound (1A-1) of the present invention were simultaneously heated, and vapor deposition was performed so as to obtain a film thickness of 25 nm. Thus, a light emitting layer was formed. A vapor deposition rate was adjusted such that a weight ratio between BH1 and compound (1A-1) of the present invention was approximately 98:2. Subsequently, the vapor deposition crucible containing ET8 was heated, and vapor deposition was performed so as to obtain a film thickness of 5 nm. Subsequently, the vapor deposition crucible containing ET9 and the vapor deposition crucible containing Liq were simultaneously heated, and vapor deposition was performed so as to obtain a film thickness of 25 nm. Thus, an electron transport layer formed of two layers was formed. The vapor deposition rate was adjusted such that the weight ratio between ET9 and Liq was approximately 1:1. The vapor deposition rate for each layer was 0.01 to 1 nm/sec.

Thereafter, the vapor deposition crucible containing Liq was heated, and vapor deposition was performed at a vapor deposition rate of 0.01 to 0.1 nm/sec so as to obtain a film thickness of 1 nm. Subsequently, the vapor deposition crucible containing magnesium and the vapor deposition crucible containing silver were simultaneously heated, and vapor deposition was performed so as to obtain a film thickness of 100 nm. Thus, a negative electrode was formed, and an organic electroluminescent element was obtained. At this time, the vapor deposition rate was adjusted in a range between 0.1 nm to 10 nm/sec such that the ratio of the numbers of atoms between magnesium and silver was 10:1.

Characteristics during light emission of 1000 cd/m² were measured using the ITO electrode as a positive electrode and the Liq/magnesium+silver electrode as a negative electrode. As a result, a driving voltage was 4.11 V, an external quantum efficiency was 6.99% (blue light emission with a wavelength of about 454 nm), and the CIE chromaticity at this time was (x, y)=(0.141, 0.076). In addition, a constant current driving test was performed at a current density of 10 mA/cm². As a result, time to retain luminance of 90% or more of initial luminance was 356 hours.

The above results are summarized in Tables 8 to 10.

TABLE 8

| | Dopant | External quantum efficiency (%) | Time (hour) to retain luminance of 90% or more of initial luminance |
|---|---|---|---|
| Example 2 | Compound (1A-1) | 7.13 | 134 |
| Example 3 | Compound (1A-3) | 7.75 | 169 |
| Example 4 | Compound (1A-25) | 6.83 | 115 |
| Example 5 | Compound (1B-1) | 6.28 | 105 |
| Example 6 | Compound (1B-10) | 6.42 | 167 |
| Comparative Example 11 | Compound (1-10) | 2.00 | 31 |
| Comparative Example 12 | Compound (1-100) | 2.81 | 57 |
| Comparative Example 13 | Compound (1-141) | 4.33 | 87 |

TABLE 8-continued

| | Dopant | External quantum efficiency (%) | Time (hour) to retain luminance of 90% or more of initial luminance |
|---|---|---|---|
| Comparative Example 14 | Compound (1-176) | 2.94 | 27 |
| Comparative Example 15 | Compound (1-447) | 4.24 | 72 |
| Comparative Example 16 | Compound (1-2623) | 5.07 | 82 |
| Comparative Example 17 | Compound (1-1201) | 3.60 | 57 |
| Comparative Example 18 | Compound (1-1210) | 4.38 | 47 |
| Comparative Example 19 | Compound (1-79) | 3.55 | 54 |
| Comparative Example 20 | Compound (1-1006) | 2.04 | 49 |
| Comparative Example 21 | Compound (1-2305) | 4.50 | 79 |
| Comparative Example 22 | Compound (1-1203) | 4.12 | 69 |
| Example 7 | Compound (1A-1) | 6.96 | 170 |
| Example 8 | Compound (1B-1) | 6.31 | 125 |
| Comparative Example 23 | Compound (1-2679) | 6.16 | 57 |
| Comparative Example 24 | Compound (1-1203) | 5.37 | 51 |
| Example 9 | Compound (1B-1) | 6.47 | 110 |
| Example 10 | Compound (1A-1) | 6.42 | 110 |
| Example 11 | Compound (1B-1) | 6.23 | 129 |

TABLE 9

| | Dopant | External quantum efficiency (%) | Time (hour) to retain luminance of 90% or more of initial luminance |
|---|---|---|---|
| Example 12 | Compound (1A-1) | 6.51 | 581 |

TABLE 10

| | Dopant | External quantum efficiency (%) | Time (hour) to retain luminance of 90% or more of initial luminance |
|---|---|---|---|
| Example 13 | Compound (1A-1) | 6.99 | 356 |

INDUSTRIAL APPLICABILITY

In the present invention, by providing a novel polycyclic aromatic compound, it is possible to increase options of a material for an organic EL element. Furthermore, by using a novel polycyclic aromatic compound as a material for an organic electroluminescent element, it is possible to provide an excellent organic EL element, a display apparatus including the organic EL element, a lighting apparatus including the organic EL element, and the like.

REFERENCE SIGNS LIST

100 Organic electroluminescent element
101 Substrate

102 Positive electrode
103 Hole injection layer
104 Hole transport layer
105 Light emitting layer
106 Electron transport layer
107 Electron injection layer
108 Negative electrode

The invention claimed is:

1. A polycyclic aromatic compound represented by the following general formula (1A) or (1B)

General formula (1A)

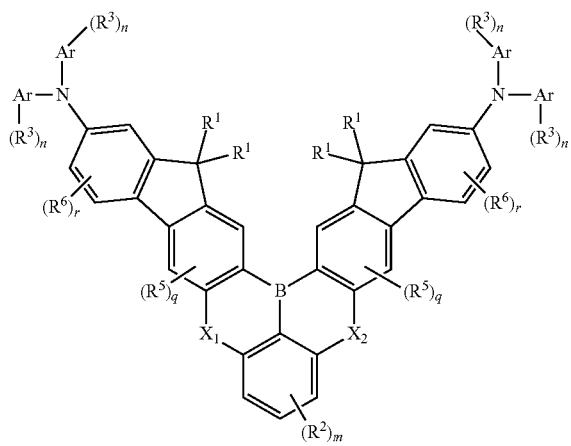

General formula (1B)

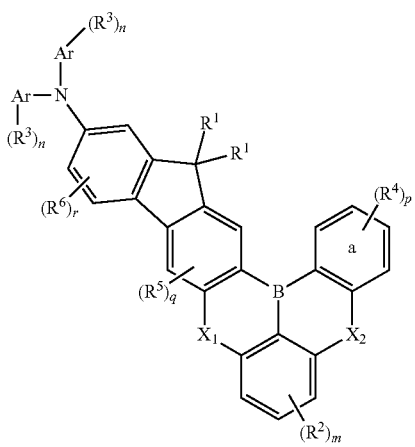

(In the above formula (1A) or (1B),

Ar's each independently represent an aryl or a heteroaryl, $R^1$ to $R^6$ each independently represent a hydrogen atom, an aryl, a heteroaryl, a diarylamino, a diheteroarylamino, an arylheteroarylamino, an alkyl, an alkoxy, a trialkylsilyl, or an aryloxy, at least one hydrogen atom in these substituents may be substituted by an aryl, a heteroaryl, a diarylamino, or an alkyl, in a case where a plurality of $R^4$'s is present, adjacent $R^4$'s may be bonded to each other to form an aryl ring or a heteroaryl ring together with ring a, at least one hydrogen atom in the formed ring may be substituted by an aryl, a heteroaryl, a diarylamino, a diheteroarylamino, an arylheteroarylamino, an alkyl, an alkoxy, a trialkylsilyl, or an aryloxy, at least one hydrogen atom in these substituents may be substituted by an aryl, a heteroaryl, a diarylamino, or an alkyl, in a case where $R^3$ and $R^6$ are adjacent to each other, $R^3$ and $R^6$ may be bonded to each other via —O—, —S—, —C(—R)$_2$—, or a single bond, R in the C (—R)$_2$— represents a hydrogen atom or an alkyl having 1 to 6 carbon atoms, m represents an integer of 0 to 3, n's each independently represent an integer of 0 to a maximum number that makes substitution in Ar possible, p represents an integer of 0 to 4, q's each independently represent an integer of 0 to 2, r's each independently represent an integer of 0 to 3, $X^1$ and $X^2$ each independently represent O or N—R, R in the N—R represents an aryl having 6 to 12 carbon atoms, a heteroaryl having 2 to 15 carbon atoms, or an alkyl having 1 to 6 carbon atoms, in a case where $X^2$ represents the N—R, R may be bonded to the ring a via —O—, —S—, —C(—R)$_2$—, or a single bond, R in the —C(—R)$_2$— represents a hydrogen atom or an alkyl having 1 to 6 carbon atoms, and at least one hydrogen atom in the compound represented by formula (1A) or (1B) may be substituted by a halogen atom or a deuterium atom).

2. The polycyclic aromatic compound according to claim 1, wherein

Ar's each independently represent an aryl, $R^1$ to $R^4$ each independently represent a hydrogen atom, an aryl, a heteroaryl, an alkyl, an alkoxy, a trialkylsilyl, or an aryloxy, at least one hydrogen atom in these substituents may be substituted by an aryl, a heteroaryl, or an alkyl, in a case where a plurality of $R^4$'s is present, adjacent $R^4$'s may be bonded to each other to form an aryl ring or a heteroaryl ring together with ring a, at least one hydrogen atom in the formed ring may be substituted by an aryl, a heteroaryl, an alkyl, an alkoxy, a trialkylsilyl, or an aryloxy, at least one hydrogen atom in these substituents may be substituted by an aryl, a heteroaryl, or an alkyl, m represents an integer of 0 to 3, n's each independently represent an integer of 0 to a maximum number that makes substitution in Ar possible, p represents an integer of 0 to 4, q represents 0, r represents 0, $X^1$ and $X^2$ each independently represent O or N—R, and R in the N—R represents an aryl having 6 to 12 carbon atoms, a heteroaryl having 2 to 15 carbon atoms, or an alkyl having 1 to 6 carbon atoms.

3. The polycyclic aromatic compound according to claim 1, represented by the following general formula (1A') or (1B')

General formula (1A′)

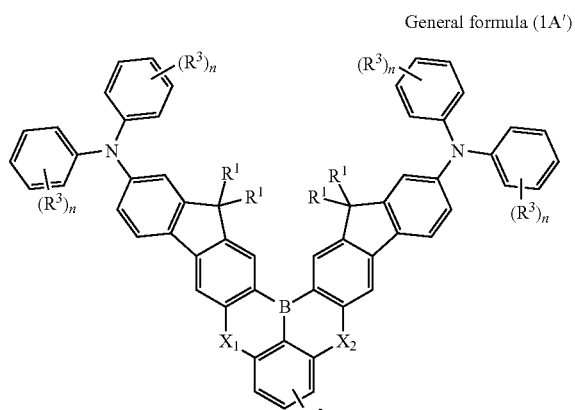

General formula (1B′)

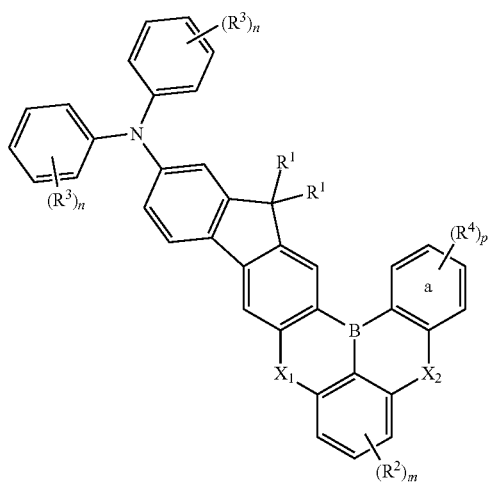

(In the above formula (1A′) or (1B′),

R¹ to R⁴ each independently represent a hydrogen atom, an aryl, a heteroaryl, an alkyl, an alkoxy, a trialkylsilyl, or an aryloxy, at least one hydrogen atom in these substituents may be substituted by an aryl, a heteroaryl, or an alkyl, in a case where a plurality of R⁴'s is present, adjacent R⁴'s may be bonded to each other to form an aryl ring or a heteroaryl ring together with ring a, at least one hydrogen atom in the formed ring may be substituted by an aryl, a heteroaryl, an alkyl, an alkoxy, a trialkylsilyl, or an aryloxy, at least one hydrogen atom in these substituents may be substituted by an aryl, a heteroaryl, or an alkyl, m represents an integer of 0 to 3, n's each independently represent an integer of 0 to a maximum number that makes substitution in Ar possible, p represents an integer of 0 to 4, $X^1$ and $X^2$ each independently represent O or N—R, and R in the N—R represents an aryl having 6 to 12 carbon atoms, a heteroaryl having 2 to 15 carbon atoms, or an alkyl having 1 to 6 carbon atoms).

4. The polycyclic aromatic compound according to claim 1, represented by the following general formula (1A′)

General formula (1A′)

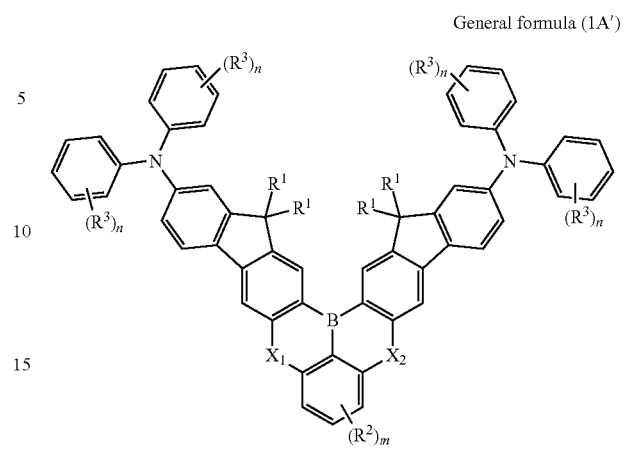

(In the above formula (1A′), $R^1$'s each independently represent a hydrogen atom, an aryl having 6 to 30 carbon atoms, or an alkyl having 1 to 24 carbon atoms, $R^2$ and $R^3$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl containing an alkyl having 1 to 4 carbon atoms, or an aryloxy having 6 to 30 carbon atoms, at least one hydrogen atom in these substituents may be substituted by an aryl having 6 to 16 carbon atoms, a heteroaryl having 2 to 25 carbon atoms, or an alkyl having 1 to 18 carbon atoms, m represents an integer of 0 to 3, n's each independently represent an integer of 0 to 6, $X^1$ and $X^2$ each independently represent O or N—R, and R in the N—R represents an aryl having 6 to 10 carbon atoms, a heteroaryl having 2 to 10 carbon atoms, or an alkyl having 1 to 4 carbon atoms.

5. The polycyclic aromatic compound according to claim 4, wherein $R^1$'s each independently represent a hydrogen atom, an aryl having 6 to 12 carbon atoms, or an alkyl having 1 to 12 carbon atoms, $R^2$ and $R^3$ each independently represent a hydrogen atom, an aryl having 6 to 30 carbon atoms, a heteroaryl having 2 to 30 carbon atoms, an alkyl having 1 to 24 carbon atoms, or a trialkylsilyl containing an alkyl having 1 to 4 carbon atoms, m represents 0 or 1, n's each independently represent 0 or 1, $X^1$ and $X^2$ each independently represent O or N—R, and R in the N—R represents an aryl having 6 to 10 carbon atoms, a heteroaryl having 2 to 10 carbon atoms, or an alkyl having 1 to 4 carbon atoms.

6. The polycyclic aromatic compound according to claim 4, represented by the following formula (1A-1), (1A-3), or (1A-25)

(1A-1)
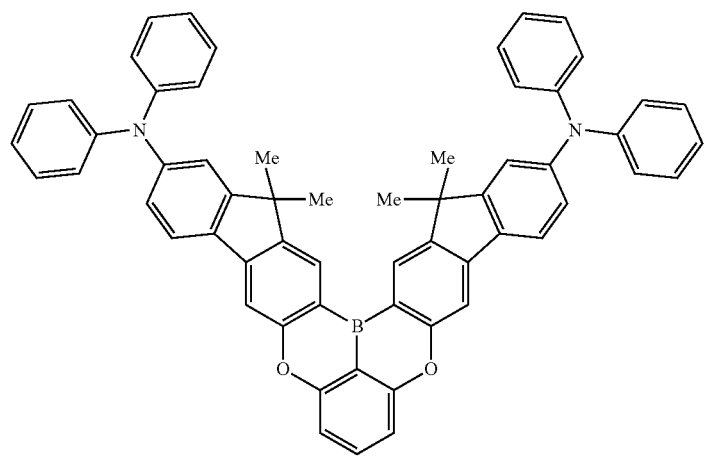
(1A-3)
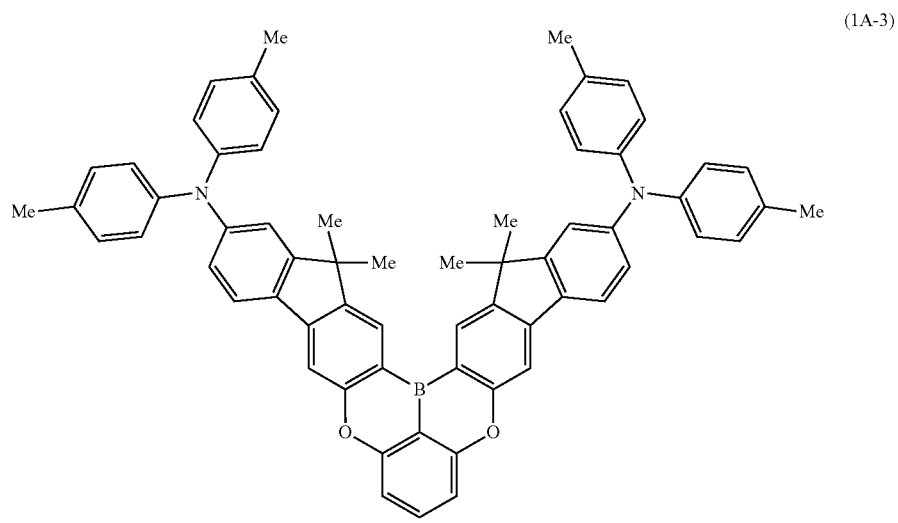
(1A-25)
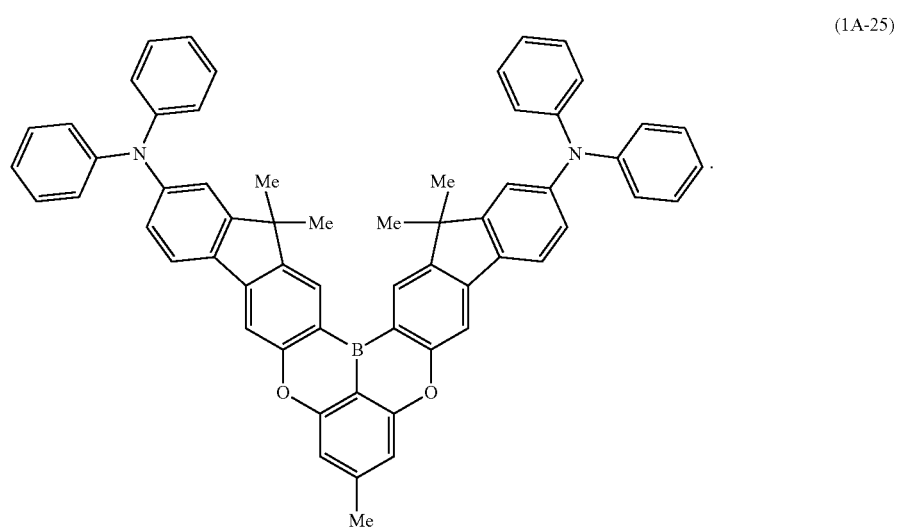

7. The polycyclic aromatic compound according to claim 1, represented by the following general formula (1B')

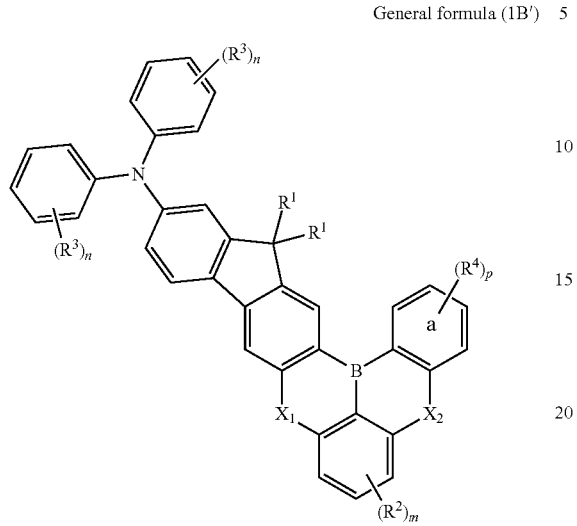

General formula (1B')

(In the above formula (1B'),

R¹'s each independently represent a hydrogen atom, an aryl having 6 to 30 carbon atoms, or an alkyl having 1 to 24 carbon atoms, R² to R⁴ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl containing an alkyl having 1 to 4 carbon atoms, or an aryloxy having 6 to 30 carbon atoms, at least one hydrogen atom in these substituents may be substituted by an aryl having 6 to 16 carbon atoms, a heteroaryl having 2 to 25 carbon atoms, or an alkyl having 1 to 18 carbon atoms, m represents an integer of 0 to 3, n's each independently represent an integer of 0 to 6, p represents an integer of 0 to 2, X¹ and X² each independently represent O or N—R, and R in the N—R represents an aryl having 6 to 10 carbon atoms, a heteroaryl having 2 to 10 carbon atoms, or an alkyl having 1 to 4 carbon atoms).

8. The polycyclic aromatic compound according to claim 7, wherein

R¹'s each independently represent a hydrogen atom, an aryl having 6 to 12 carbon atoms, or an alkyl having 1 to 12 carbon atoms, R² to R⁴ each independently represent a hydrogen atom, an aryl having 6 to 30 carbon atoms, a heteroaryl having 2 to 30 carbon atoms, an alkyl having 1 to 24 carbon atoms, or a trialkylsilyl containing an alkyl having 1 to 4 carbon atoms, m represents 0 or 1, n's each independently represent 0 or 1, p represents 0 or 1, X¹ and X² each independently represent O or N—R, and R in the N—R represents an aryl having 6 to 10 carbon atoms, a heteroaryl having 2 to 10 carbon atoms, or an alkyl having 1 to 4 carbon atoms).

9. The polycyclic aromatic compound according to claim 7, represented by the following formula (1B-1) or (1B-10)

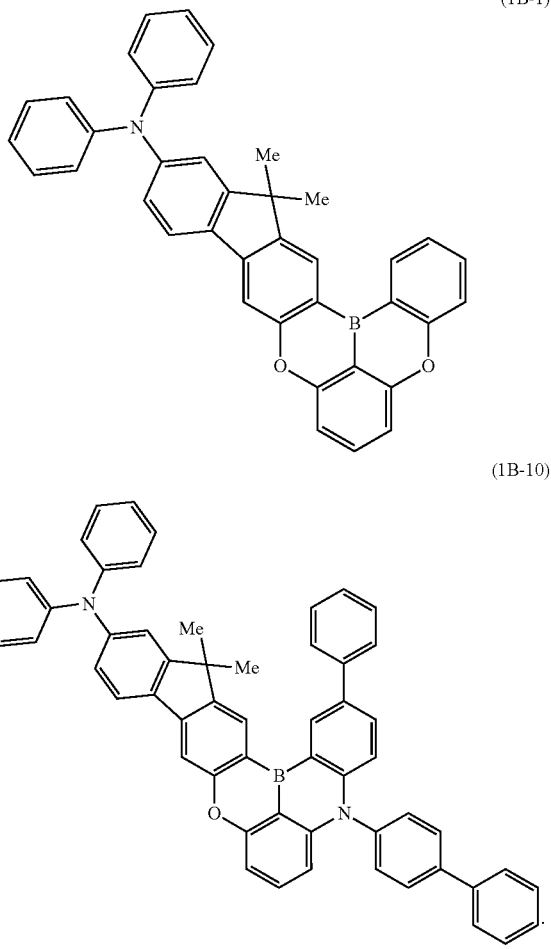

10. A material for an organic device, comprising the polycyclic aromatic compound according to claim 1.

11. The material for an organic device according to claim 10, wherein the material for an organic device is a material for an organic electroluminescent element, a material for an organic field effect transistor, or a material for an organic thin film solar cell.

12. The material for an organic electroluminescent element according to claim 11, wherein the material for an organic electroluminescent element is a material for a light emitting layer.

13. The material for an organic electroluminescent element according to claim 11, wherein the material for an organic electroluminescent element is a material for an electron injection layer or a material for an electron transport layer.

14. The material for an organic electroluminescent element according to claim 11, wherein the material for an organic electroluminescent element is a material for a hole injection layer or a material for a hole transport layer.

15. An organic electroluminescent element, comprising: a pair of electrodes composed of a positive electrode and a negative electrode; and a light emitting layer disposed between the pair of electrodes and containing the material for a light emitting layer according to claim 12.

16. An organic electroluminescent element, comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer according to claim 13.

17. An organic electroluminescent element, comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer according to claim 14.

18. The organic electroluminescent element according to claim 15, further comprising an electron transport layer and/or an electron injection layer disposed between the negative electrode and the light emitting layer, wherein at least one of the electron transport layer and the electron injection layer contains at least one selected from the group consisting of a quinolinol-based metal complex, a pyridine derivative, a phenanthroline derivative, a borane derivative, and a benzimidazole derivative.

19. The organic electroluminescent element according to claim 18, wherein the electron transport layer and/or the electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

20. A display apparatus comprising the organic electroluminescent element according to claim 15.

21. A lighting apparatus comprising the organic electroluminescent element according to claim 15.

* * * * *